(12) United States Patent
Ogawa et al.

(10) Patent No.: US 12,402,311 B2
(45) Date of Patent: Aug. 26, 2025

(54) THREE-DIMENSIONAL MEMORY DEVICE CONTAINING MEMORY OPENING MONITORING AREA AND METHODS OF MAKING THE SAME

(71) Applicant: SANDISK TECHNOLOGIES LLC, Addison, TX (US)

(72) Inventors: Hiroyuki Ogawa, Yokkaichi (JP); Masato Miyamoto, Yokkaichi (JP); Keisuke Shigemura, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 519 days.

(21) Appl. No.: 17/936,012

(22) Filed: Sep. 28, 2022

(65) Prior Publication Data
US 2024/0107758 A1    Mar. 28, 2024

(51) Int. Cl.
*H10B 43/27* (2023.01)
*H01L 23/522* (2006.01)
(Continued)

(52) U.S. Cl.
CPC ......... *H10B 43/27* (2023.02); *H01L 23/5226* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 41/10; H10B 41/27; H10B 41/35; H10B 43/10; H10B 43/35; H10B 41/50; H10B 43/50; H01L 23/5226; H01L 23/5283
See application file for complete search history.

(56) References Cited

U.S. PATENT DOCUMENTS 9,601,502 B2   3/2017   Sano et al.
9,953,992 B1   4/2018   Ogawa et al.
(Continued)

OTHER PUBLICATIONS

Lapedus; "3D NAND Metrology Challenges Growing"; 2019; Semiconductor Engineering (Year: 2019).*
(Continued)

*Primary Examiner* — Syed I Gheyas
(74) *Attorney, Agent, or Firm* — THE MARBURY LAW GROUP PLLC

(57) ABSTRACT

A method of forming a three-dimensional semiconductor device includes forming an alternating stack of insulating layers and spacer material layers over a substrate, forming memory openings formed in the memory array region and monitor openings formed in a monitor region though the alternating stack, forming memory opening fill structures in the memory openings, forming monitor opening fill structures by depositing a monitor opening fill material in the monitor openings, recessing first portions of the alternating stack in a contact region and second portions of the alternating stack in the monitor region, and determining at least one characteristic of the recessed surfaces of the monitor opening fill structures. At least one characteristic of the memory openings or memory opening fill structures may be determined based on the determining at least one characteristic of the recessed surfaces of the monitor opening fill structures.

14 Claims, 54 Drawing Sheets

(51) Int. Cl.
*H01L 23/528* (2006.01)
*H10B 41/10* (2023.01)
*H10B 41/27* (2023.01)
*H10B 41/35* (2023.01)
*H10B 43/10* (2023.01)
*H10B 43/35* (2023.01)

(56) References Cited

U.S. PATENT DOCUMENTS

| | | |
|---|---|---|
| 9,960,181 B1 | 5/2018 | Cui et al. |
| 10,804,284 B2 | 10/2020 | Ishii et al. |
| 10,861,873 B2 | 12/2020 | Kim et al. |
| 10,872,899 B2 | 12/2020 | Kim et al. |
| 11,041,814 B1 * | 6/2021 | Wang ................ G01N 21/956 |
| 11,133,252 B2 | 9/2021 | Ito et al. |
| 11,257,835 B2 | 2/2022 | Li et al. |
| 2016/0365352 A1 | 12/2016 | Nishikawa et al. |
| 2017/0148800 A1 | 5/2017 | Nishikawa et al. |
| 2018/0113084 A1 * | 4/2018 | Hench ................ G01N 23/201 |
| 2018/0226305 A1 * | 8/2018 | Kueny ................ H01L 22/12 |
| 2019/0319040 A1 | 10/2019 | Ishii et al. |
| 2020/0152585 A1 | 5/2020 | Eom |
| 2020/0311955 A1 * | 10/2020 | Yoshitake ............. G06T 7/001 |
| 2021/0159241 A1 | 5/2021 | Li et al. |
| 2021/0242128 A1 | 8/2021 | Ito et al. |
| 2021/0358946 A1 | 11/2021 | Pulugurtha et al. |
| 2022/0005818 A1 | 1/2022 | Tanaka et al. |
| 2022/0005824 A1 | 1/2022 | Tanaka et al. |
| 2022/0130852 A1 | 4/2022 | Totoki et al. |
| 2022/0254802 A1 | 8/2022 | Kwon et al. |

OTHER PUBLICATIONS

U.S. Appl. No. 17/663,951, filed May 18, 2022, SanDisk Technologies LLC.
U.S. Appl. No. 17/684,922, filed Mar. 2, 2022, SanDisk Technologies LLC.
U.S. Appl. No. 17/804,184, filed May 26, 2022, SanDisk Technologies LLC.
U.S. Appl. No. 17/806,390, filed Jun. 10, 2022, SanDisk Technologies LLC.
U.S. Appl. No. 17/806,579, filed Jun. 13, 2022, SanDisk Technologies LLC.
U.S. Appl. No. 17/807,804, filed Jun. 20, 2022, SanDisk Technologies LLC.
U.S. Appl. No. 17/807,819, filed Jun. 20, 2022, SanDisk Technologies LLC.
IPRP—Notification Concerning Transmittal of International Preliminary Report on Patentability and Written Opinion of the International Searching Authority for International Patent Application No. PCT/US2023/025552, mailed Apr. 10, 2025, 6 pages.
ISR—Notification of Transmittal of The International Search Report and Written Opinion of the International Searching Authority for International Patent Application No. PCT/US2023/025552, mailed Oct. 10, 2023, 7 pages.

* cited by examiner

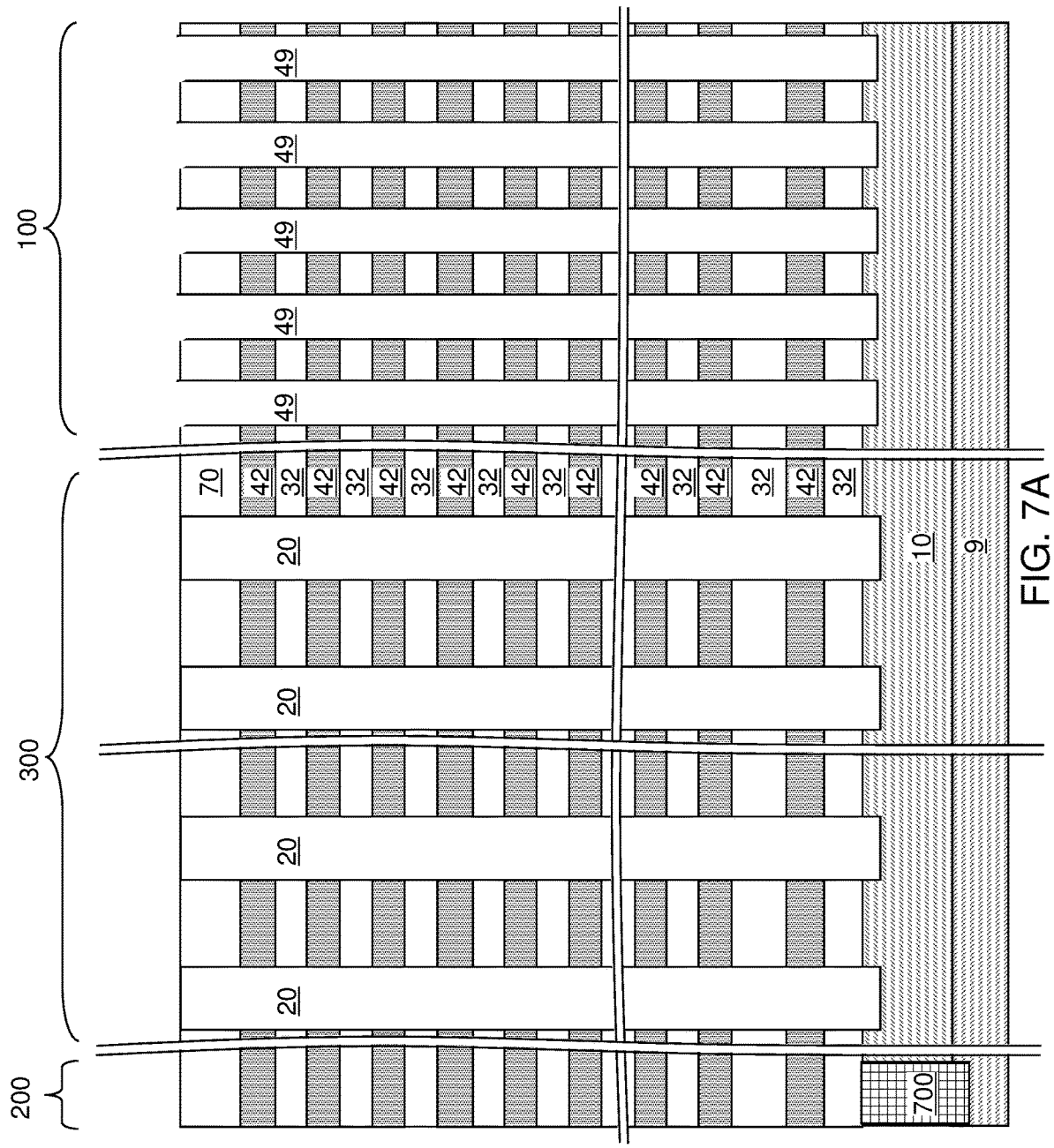

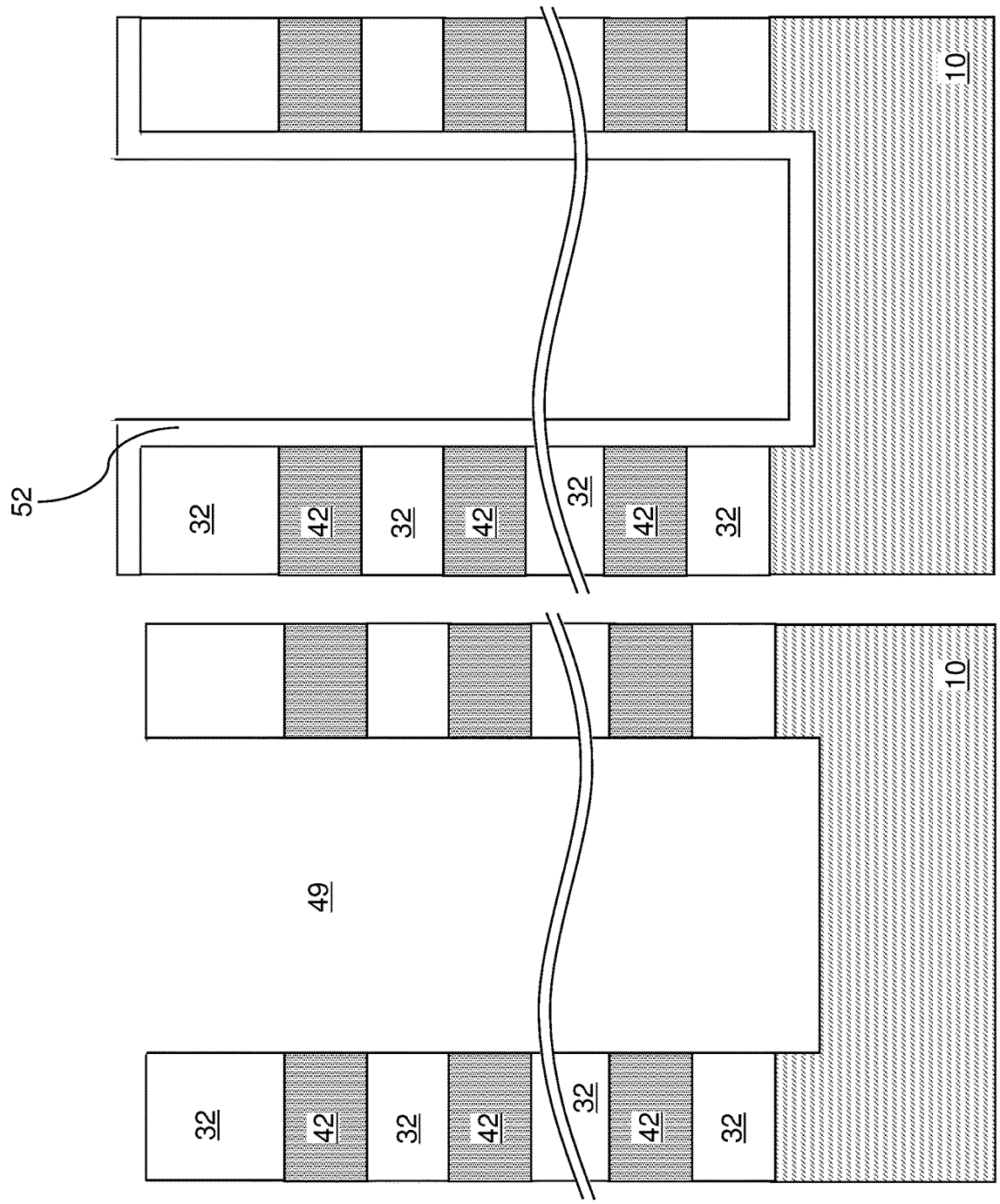

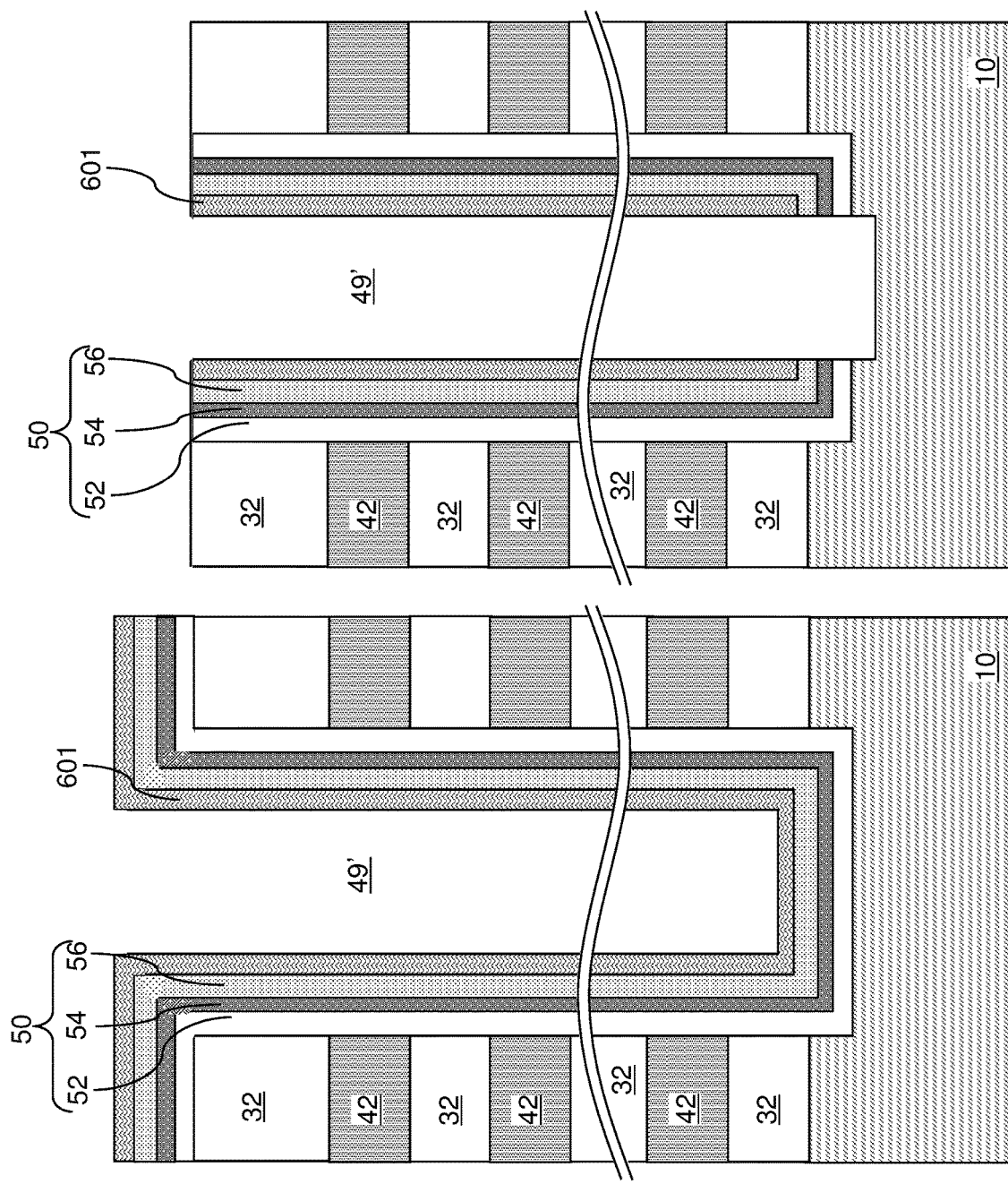

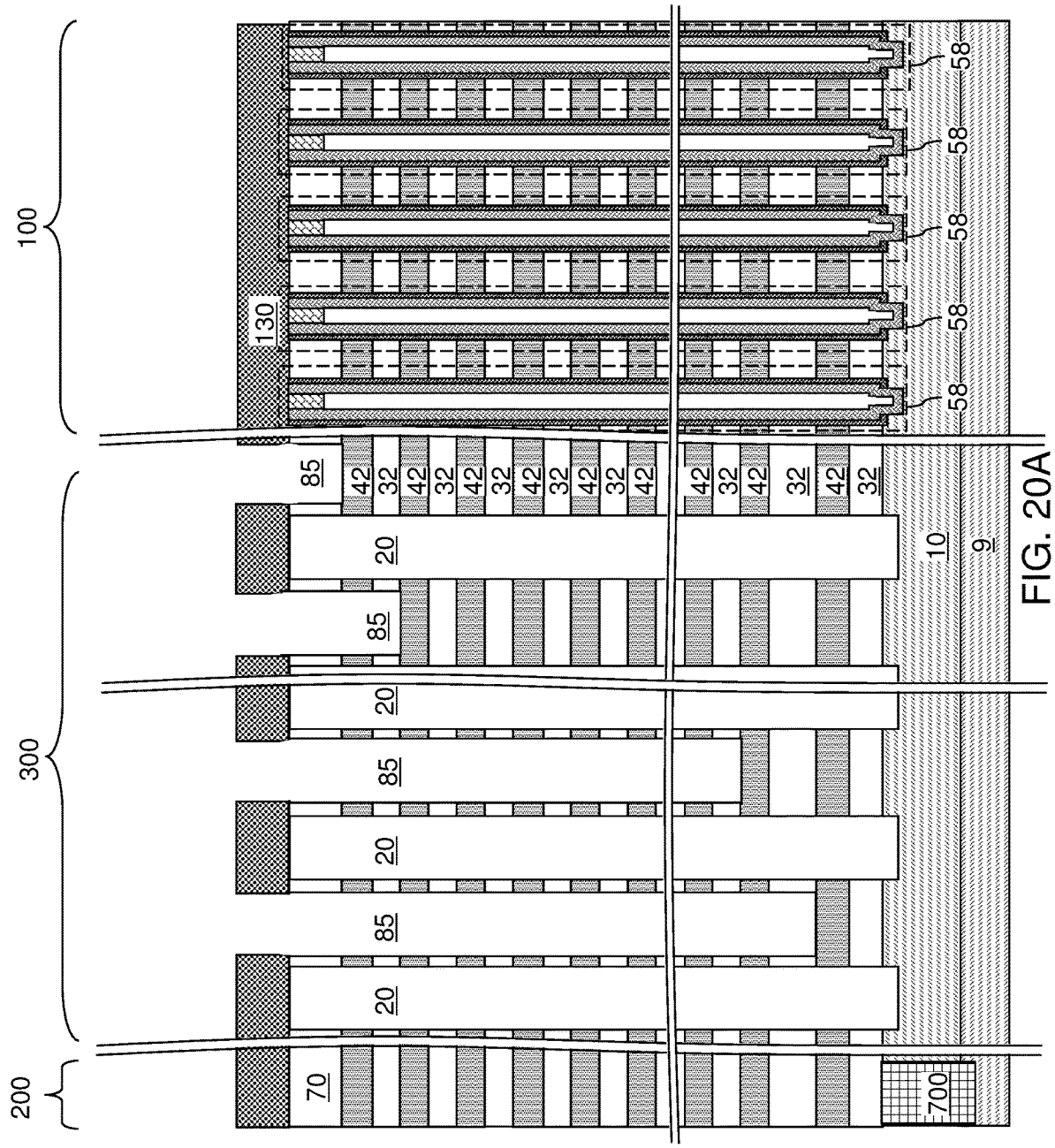

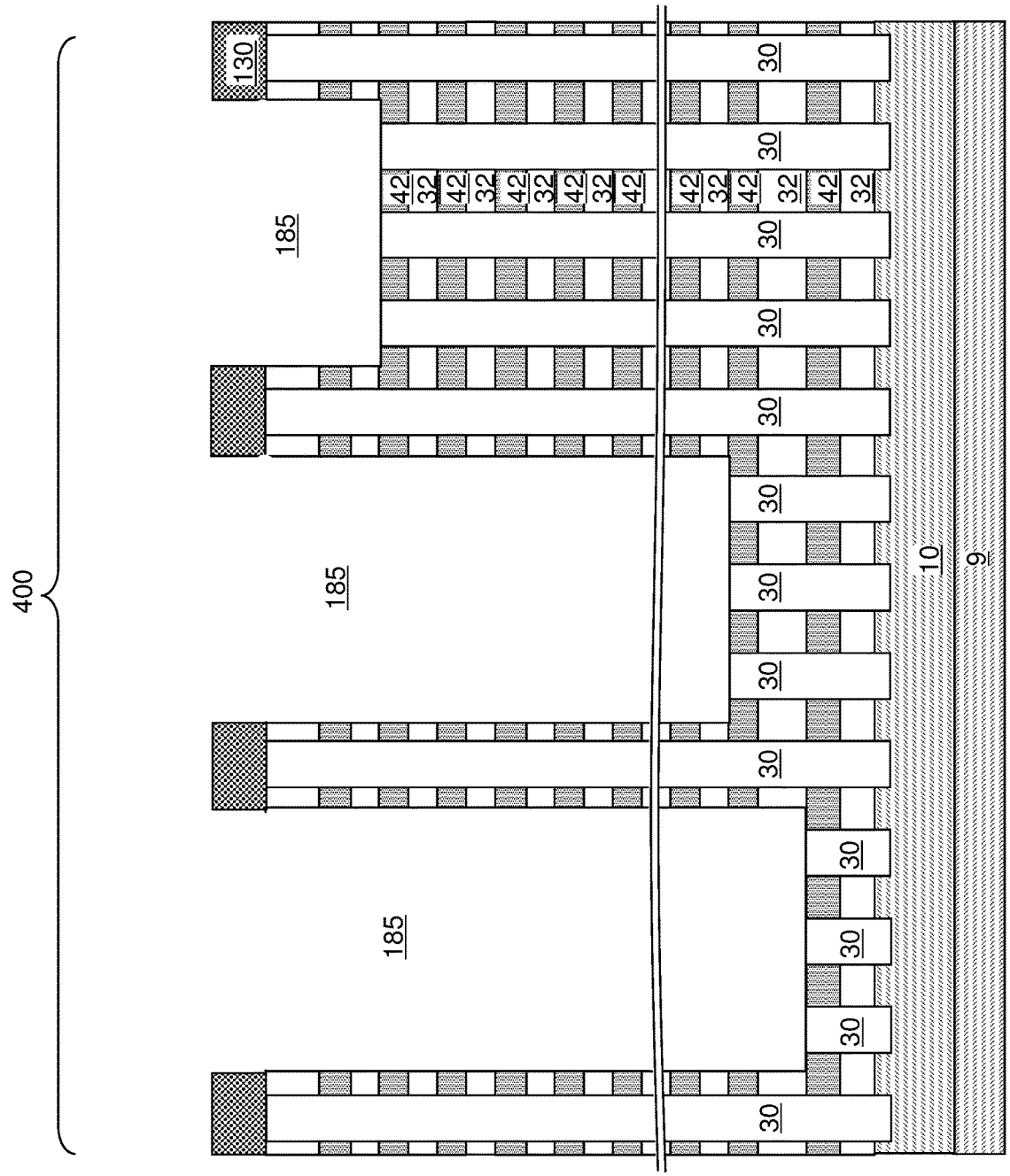

THREE-DIMENSIONAL MEMORY DEVICE CONTAINING MEMORY OPENING MONITORING AREA AND METHODS OF MAKING THE SAME

FIELD

The present disclosure relates generally to the field of semiconductor devices, and particularly to a three-dimensional memory device containing a dummy memory opening monitoring area and methods for making the same.

BACKGROUND

In a three-dimensional memory device, memory openings are formed through an alternating stack of insulating layers and sacrificial material layers, and memory opening fill structures are formed in the memory openings. The memory opening fill structures comprise a memory film and a vertical semiconductor channel.

SUMMARY

According to an aspect of the present disclosure a method of forming a three-dimensional semiconductor device comprises: forming an alternating stack of insulating layers and spacer material layers over a substrate, wherein the spacer material layers are formed as electrically conductive layers, or as sacrificial material layers sacrificial material layers having at least portions located in a memory array region and in a contact region which are subsequently replaced with electrically conductive layers; forming openings through the alternating stack, wherein the openings comprise a memory openings formed in the memory array region and monitor openings formed in a monitor region, and wherein the memory openings and the monitor openings are formed as two-dimensional arrays having a same two-dimensional periodicity; forming monitor opening fill structures by depositing a monitor opening fill material in the monitor openings; recessing first portions of the alternating stack in the contact region and second portions of the alternating stack in the monitor region, such that first horizontal surfaces of the spacer material layers are physically exposed in the contact region and second horizontal surfaces of the spacer material layers and recessed surfaces of the monitor opening fill structures are physically exposed in the monitor region; and determining at least one characteristic of the recessed surfaces of the monitor opening fill structures.

According to another aspect of the present disclosure, a device structure comprises a three-dimensional memory array and a monitor structure that are located on a substrate. The three-dimensional memory array comprises: a first alternating stack of insulating layers and electrically conductive layers having a contact region; memory openings vertically extending through the first alternating stack, located in a memory array region and arranged as a first two-dimensional array having a two-dimensional periodicity; memory opening fill structures located in the memory openings and comprising a respective vertical semiconductor channel and a respective vertical stack of memory elements; and contact via structures contacting a top surface of a respective one of the electrically conductive layers. The monitor structure comprises a second alternating stack of first material layers and second material layers; monitor openings vertically extending from the second stepped surfaces to at least an upper portion of the substrate, wherein a horizontal cross-sectional profile of the monitory openings at a level of a bottommost layer of the second alternating stack has a same periodicity as the two-dimensional periodicity of the memory openings; and monitor opening fill structures located in the monitor openings.

BRIEF DESCRIPTION OF THE DRAWINGS

FIG. 7A is a vertical cross-sectional view of the die region of the first exemplary structure after formation of support pillar structures and monitor pillar structures and removal of the patterned sacrificial cover layer according to the first embodiment of the present disclosure.

FIGS. 8A-8H are sequential schematic vertical cross-sectional views of a memory opening within the first exemplary structure during formation of a memory stack structure, an optional dielectric core, and a drain region therein according to the first embodiment of the present disclosure.

FIG. 20A is a vertical cross-sectional view of the die region of the second exemplary structure after formation of contact via cavities and monitor via cavities according to the second embodiment of the present disclosure.

FIG. 20B is a vertical cross-sectional view of the monitor region of the second exemplary structure at the processing steps of FIG. 20A.

DETAILED DESCRIPTION

Figure 1:
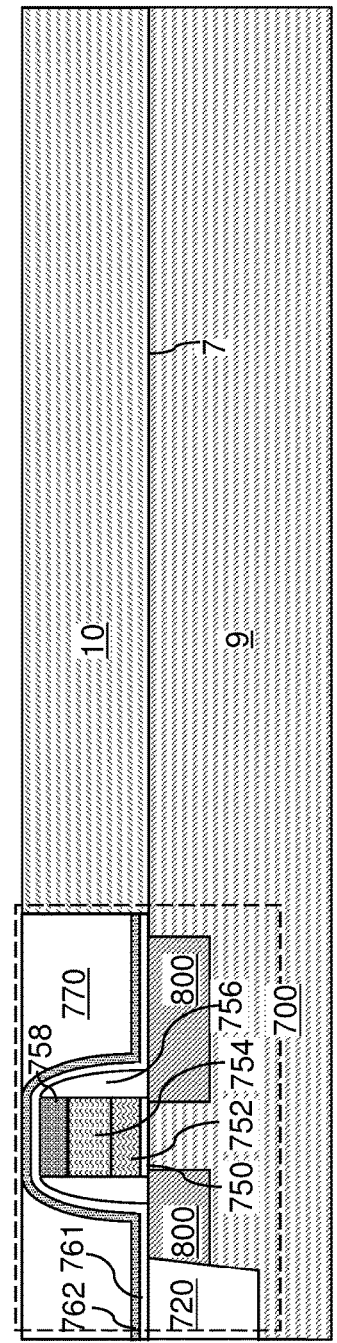
FIG. 1 is a schematic vertical cross-sectional view of a first exemplary structure after formation of at least one peripheral device, a semiconductor material layer, and a gate dielectric layer according to a first embodiment of the present disclosure.

Control of shapes of the memory openings is desired in order to provide consistent device characteristics, performance, reliability, and yield. While characterization methods such as cross-sectional scanning electron microscopy, transmission electron microscopy, tilt scanning electron microscopy, and tile transmission electron microscopy may be employed to measure horizontal cross-sectional shapes of memory openings, such methods are destructive and not in-line (i.e., cannot be used to monitor an in-process memory device). As such, there is a significant time delay between formation of the memory openings and availability of characterization data, as well as loss of a fraction of products due to destructive sampling.

As discussed above, the embodiments of the present disclosure are directed to a three-dimensional memory device containing a monitor structure including monitor openings located outside a memory array region in which active memory openings are formed. The monitor openings are dummy memory openings filled with monitor (i.e., dummy) opening fill structures which will not be used to store data, but which will be used to monitor the shape of the active memory openings. The active memory openings are filled with active memory opening fill structures (e.g., portions of active NAND memory strings) which are used to store data. The monitor structure is subsequently patterned to form monitor stepped surfaces concurrently with formation of stepped surfaces in a contact region of the memory device, or to form monitor via cavities concurrently with formation of contact via cavities in the contact region. Physically exposed recessed surfaces of the monitor opening fill structures provided at various levels reflect horizontal cross-sectional shapes of the active memory openings at the respective level, and the shapes of the active memory openings may be monitored in-line without destruction of any product wafer. Thus, a non-destructive in-line measurement method measures shapes of the monitor openings in the monitoring structure to characterize of the shapes of active memory openings which are formed during the same lithography and etching steps as the monitor openings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

According to embodiments of the present disclosure, a monitor structure including monitor openings is formed outside a memory array region in which memory openings are formed. The monitor structure is filled with a monitor fill material to provide monitor opening fill structures. The monitor structure is subsequently patterned to form monitor stepped surfaces concurrently with formation of stepped surfaces in a contact region, or to form monitor via cavities concurrently with formation of contact via cavities in a contact region. Physically exposed recessed surfaces of the monitor opening fill structures provided at various levels reflect horizontal cross-sectional shapes of memory openings at the respective level, and the shapes of the memory openings may be monitored in-line without destruction of any product wafer.

Referring to FIG. 1, a first exemplary structure according to an embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer (e.g., silicon wafer) 9 and an optional semiconductor material layer (e.g., doped well in the silicon wafer or an epitaxial silicon layer located on the silicon wafer) 10. The substrate can have a major surface 7, which can be, for example, a topmost surface of the substrate semiconductor layer 9. In one embodiment, the major surface 7 can be a single crystalline semiconductor surface, such as a single crystalline silicon surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral region 200. The region in which a memory array is subsequently formed is herein referred to as a memory array region 100. A contact region 300 for subsequently forming stepped terraces of electrically conductive layers can be provided between the memory array region 100 and the peripheral region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
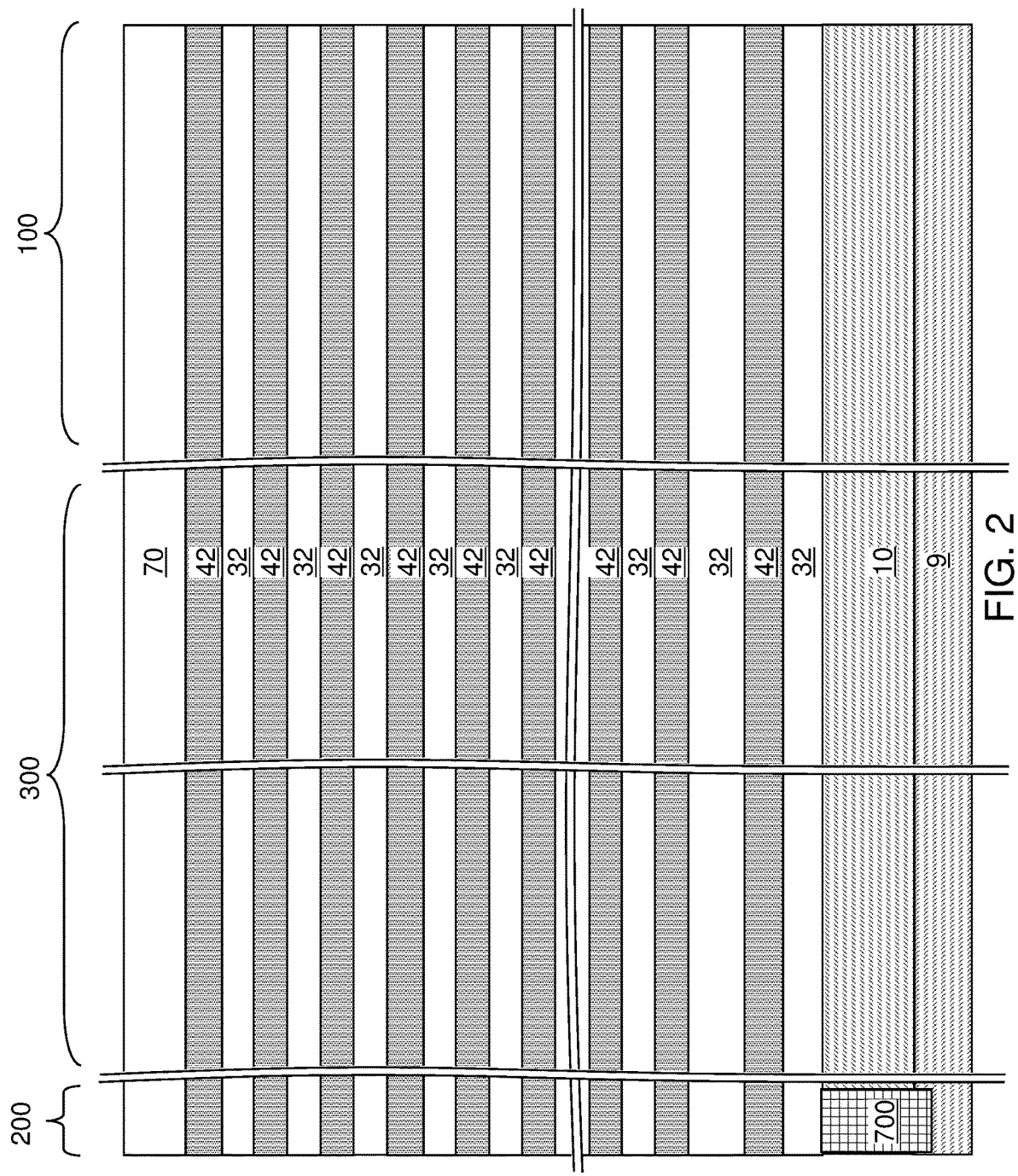
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

While an embodiment is described in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Generally, the first exemplary structure can be formed within a unit area of a semiconductor (e.g., silicon) wafer in which a two-dimensional array of semiconductor dies is formed.

Figure 3:
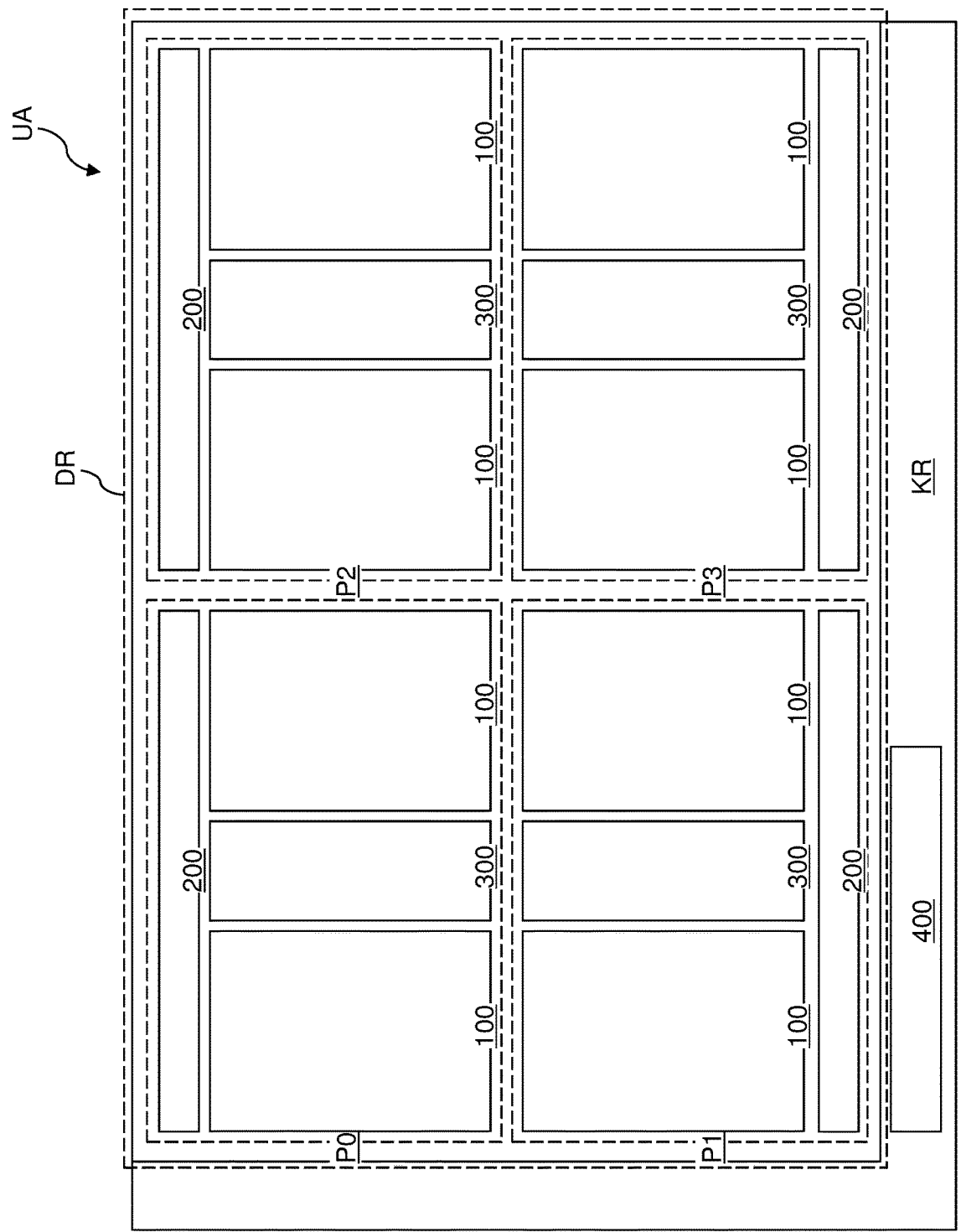
FIG. 3 is a plan view of a unit area of a semiconductor wafer that includes a die region and kerf region according to the first embodiment of the present disclosure.

Referring to FIG. 3, a unit area UA of the semiconductor wafer is illustrated. The unit area UA includes a die region DR in which a semiconductor die is formed, and a kerf region KR that provides lateral spacing between the die region DR and a respective neighboring die region DR of an adjacent semiconductor die. In an illustrative example, the die region DR may comprise a plurality of memory planes (P0, P1, P2, P3), each including at least one (e.g., two to four) respective memory array region 100, at least one respective contact region 300, and optionally at least one respective peripheral region 200. Alternatively, the peripheral region 200 may be located under the memory array regions 100 and/or the contact region 300. According to an aspect of the present disclosure, at least one monitor region 400 is provided within the kerf region KR. As will be described below, monitor structures are formed in the at least one monitor region 400 so that the shapes of memory openings that are subsequently formed in the memory array regions 100 can be indirectly monitored with an in-line measurement apparatus using the shapes of monitor openings in the at least one monitor region 400.

Figure 4A:
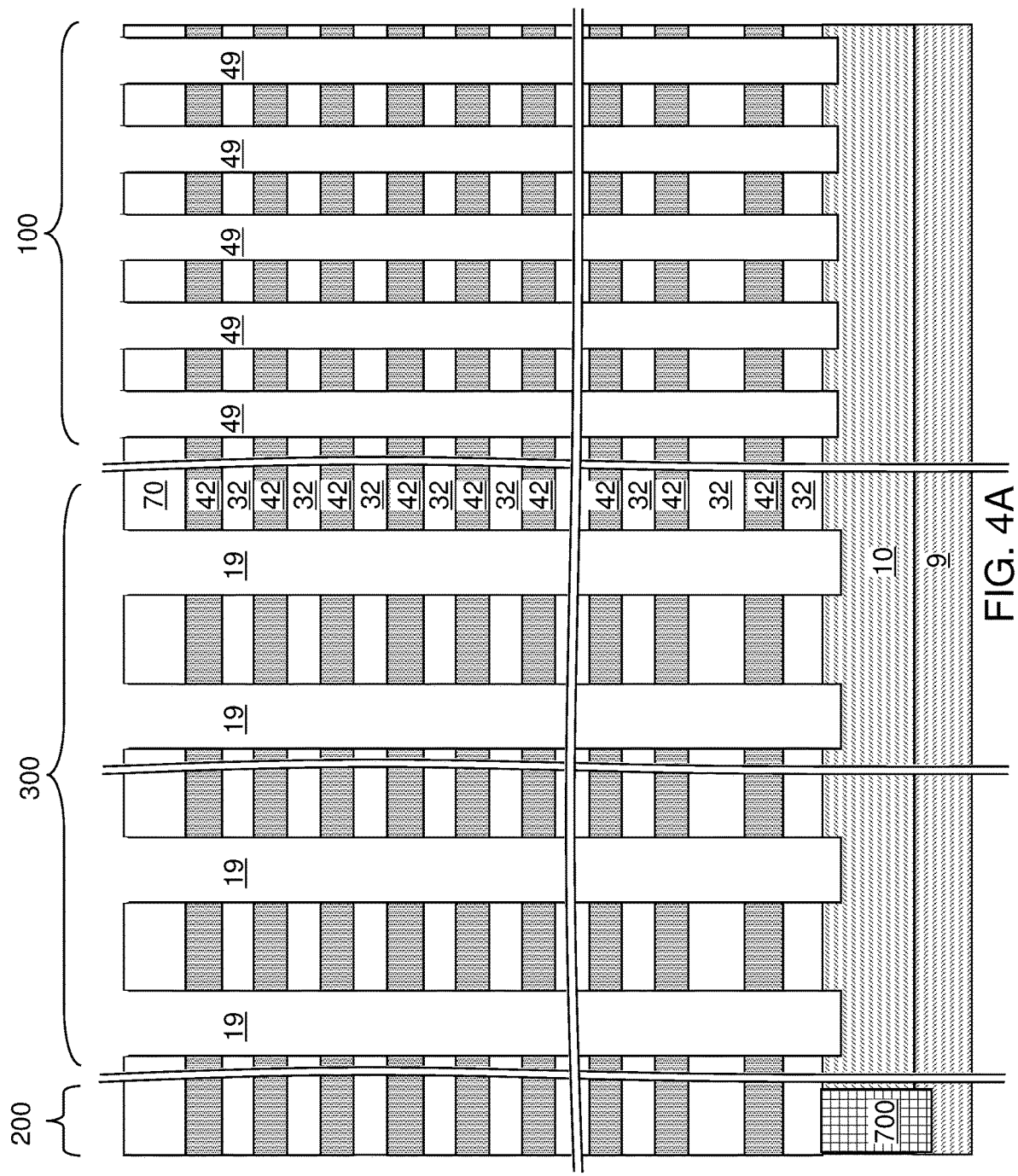
FIG. 4A is a vertical cross-sectional view of a die region in the first exemplary structure after formation of memory openings and support openings according to the first embodiment of the present disclosure.
Figure 4B:
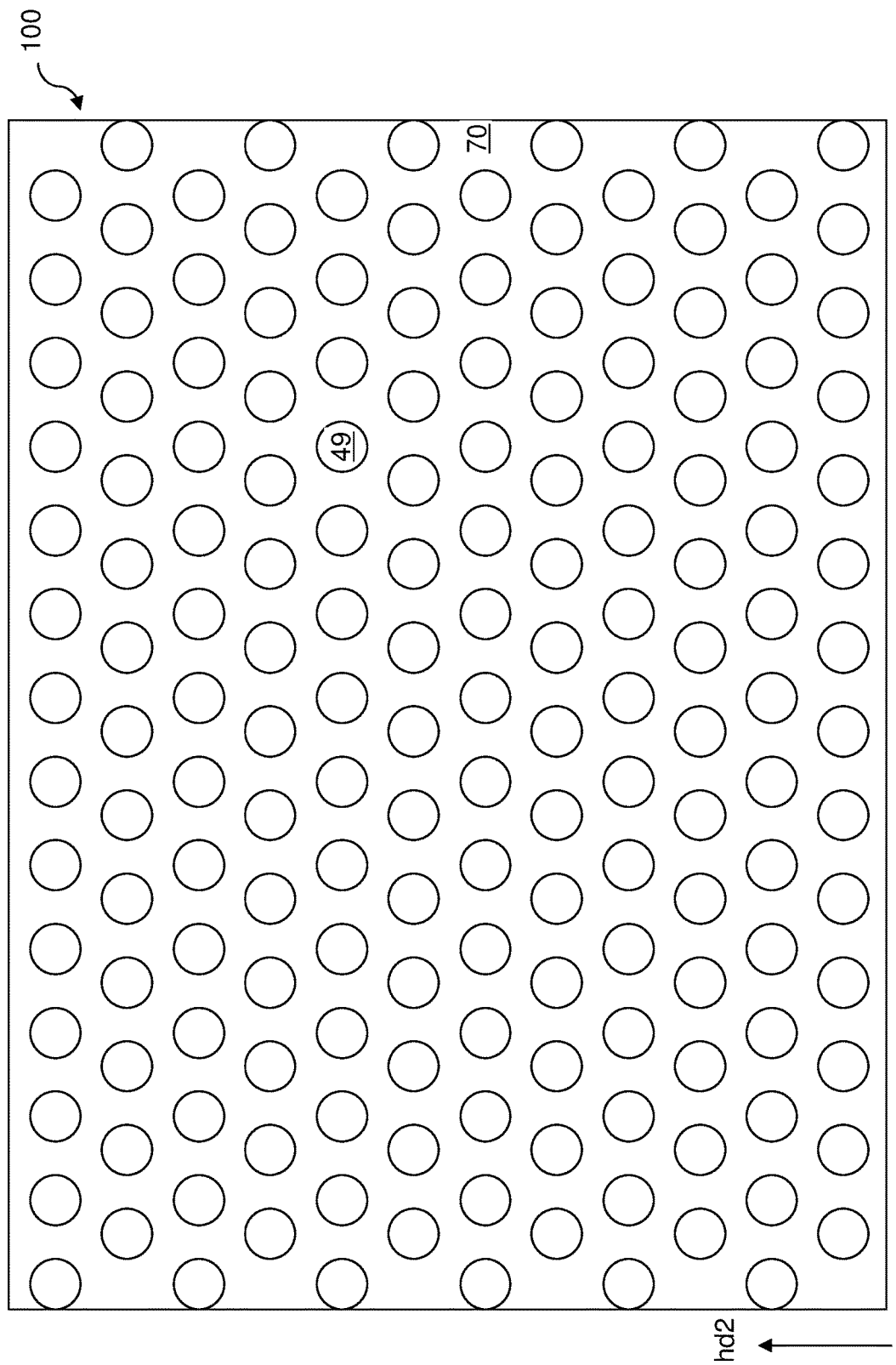
FIG. 4B is a top-down view of a memory array region including an array of memory openings at the processing steps of FIG. 4A.
Figure 4C:
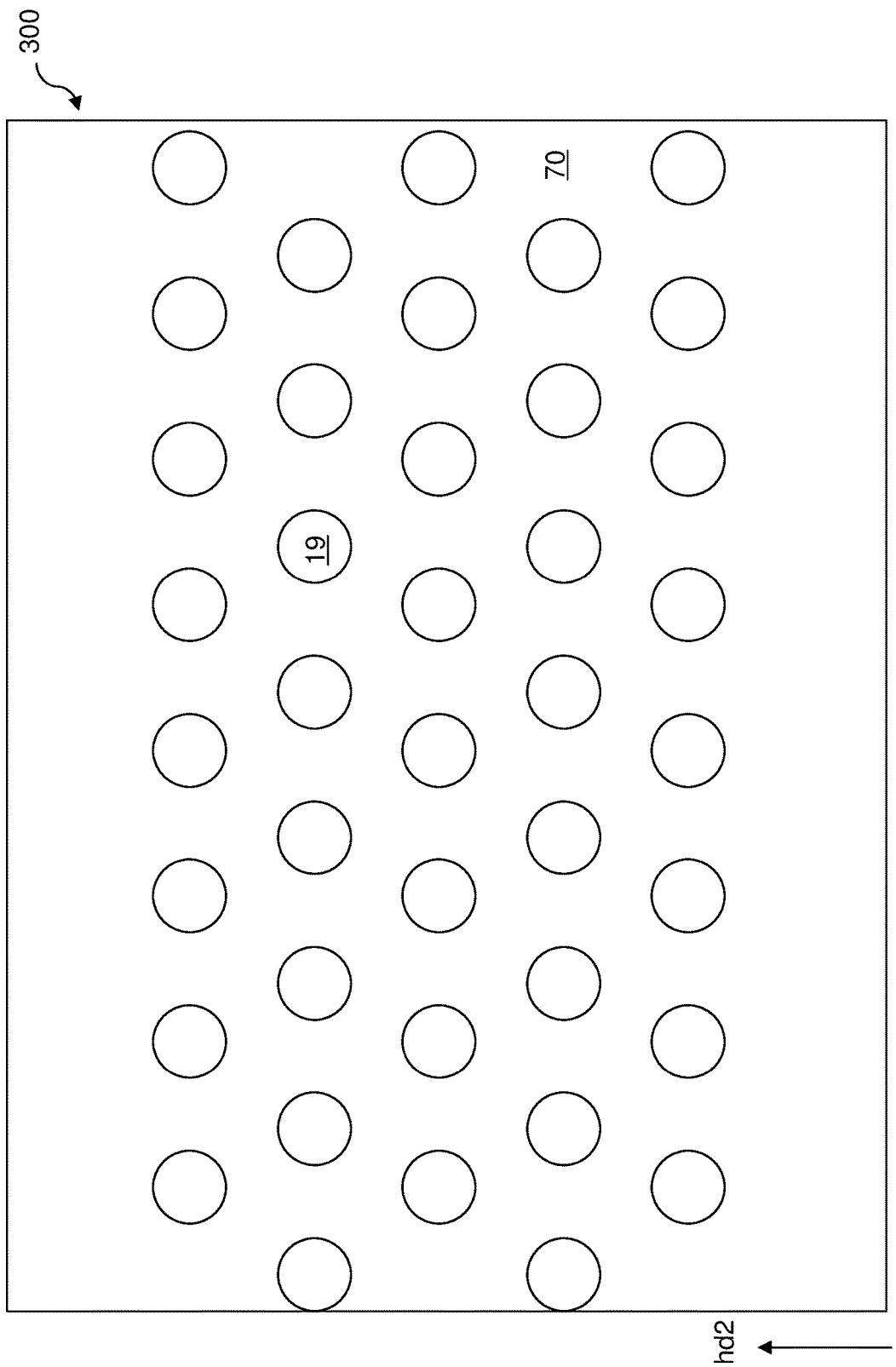
FIG. 4C is a top-down view of a contact region including support openings at the processing steps of FIGS. 4A and 4B.
Figure 4D:
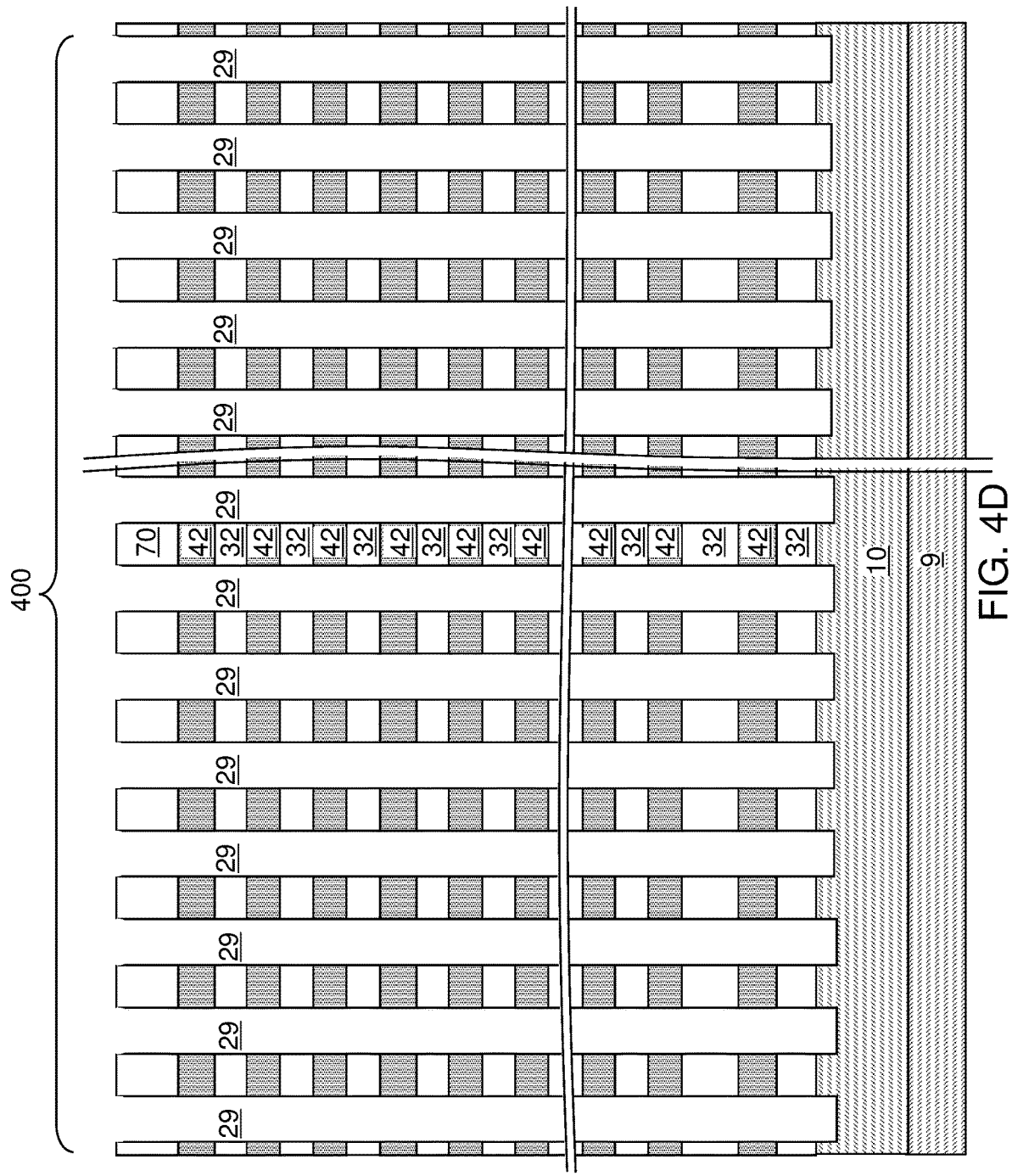
FIG. 4D is a vertical cross-sectional view of a monitor region in the first exemplary structure at the processing steps of FIGS. 4A-4C.
Figure 4E:
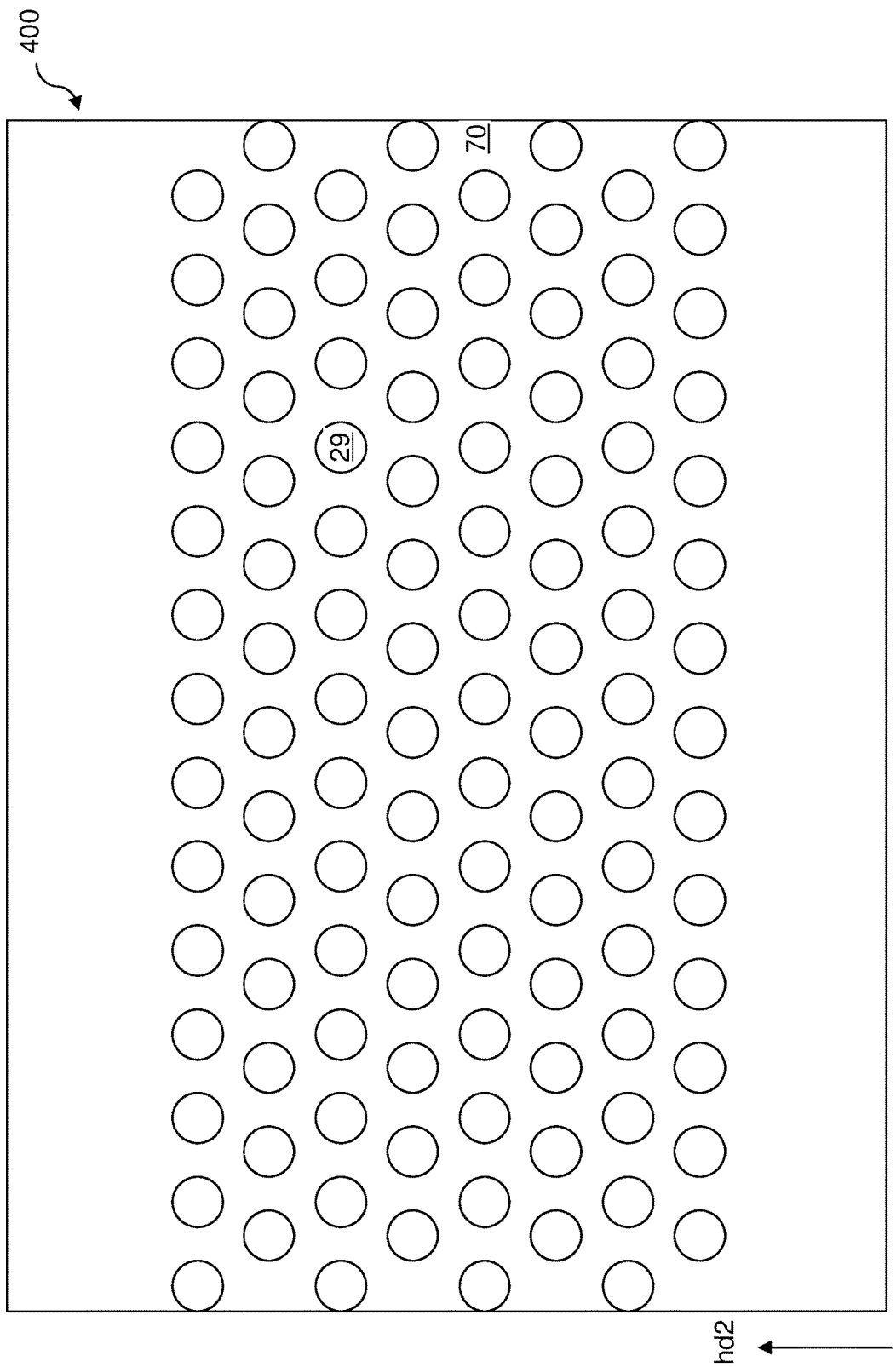
FIG. 4E is a top-down view of the monitor region of FIG. 4D.

Referring to FIGS. 4A-4E, various openings (49, 19, 29) can be formed through the alternating stack (32, 42) in various regions (100, 300, 400). FIG. 4A is a vertical cross-sectional view of a die region DR. FIG. 4B is a top-down view of a memory array region 100. FIG. 4C is a top-down view of a contact region 300. FIG. 4D is a vertical cross-sectional view of a monitor region 400. FIG. 4E is a top-down view of the monitor region 400.

Specifically, a photoresist layer (not shown) can be applied over the first exemplary structure, and openings can be formed therethrough by lithographic exposure and development. For example, a pattern of a two-dimensional periodic array of openings having a first periodicity along a first horizontal direction hd1 and having a second periodicity along a second horizontal direction hd2 can be formed within areas of the memory array regions 100. A replica of the pattern of the two-dimensional periodic array of openings can be formed in the monitor region 400. The replica of the pattern in the monitor region 400 may have the same size as the size of each pattern of the two-dimensional periodic array of openings in a respective one of the memory array regions 100, and the same or a smaller size than the size of each pattern of the two-dimensional periodic array of openings in the contact region 300. In one embodiment, each pattern of the two-dimensional periodic array of openings in the memory array regions 100 may include a two-dimensional array of circular openings, and the replica pattern may include another two-dimensional array of circular openings having the same diameter. The size, the periodicity along the first horizontal direction hd1, and the periodicity along the second horizontal direction hd2 may be the same between each pattern of the two-dimensional periodic array of openings and the replica pattern. Additional openings having the same or larger width or diameter can be formed through the photoresist layer in each contact region 300. The additional openings can be formed in areas in which support pillar structures are to be subsequently formed.

The pattern of the openings in the photoresist layer can be transferred through the alternating stack (32, 42) to a top surface of the semiconductor material layer 10 by performing an anisotropic etch process to form various openings (49, 19, 29) that vertically extend through each layer within the alternating stack (32, 42) and the insulating cap layer 70. The various openings include memory openings 49 that are formed in the memory array region 100, support openings 19 that are formed in the contact region 300, and monitor openings 29 that are formed in the monitor region 400. As used herein, a "memory opening" refers to a structure in which an active memory element, such as a memory stack structure used to store data, is subsequently formed. As used herein, a "support opening" refers to a structure in which a support structure (such as a support pillar structure) that mechanically supports other elements is subsequently formed. As used herein, a "monitor opening" refers to a structure that replicates a memory opening 49. The memory openings 49 and the monitor openings 29 are formed as two-dimensional arrays having a same two-dimensional periodicity and preferably a same size (e.g., diameter). The support openings 19 may have the same size as, or may have a different (e.g., larger) size than, the memory openings 49 and the monitor openings 29. The photoresist layer can be subsequently removed, for example, by ashing. Thus, in one embodiment, the memory openings and the monitor openings have a same diameter and are formed during a same etching step.

Figure 5A:
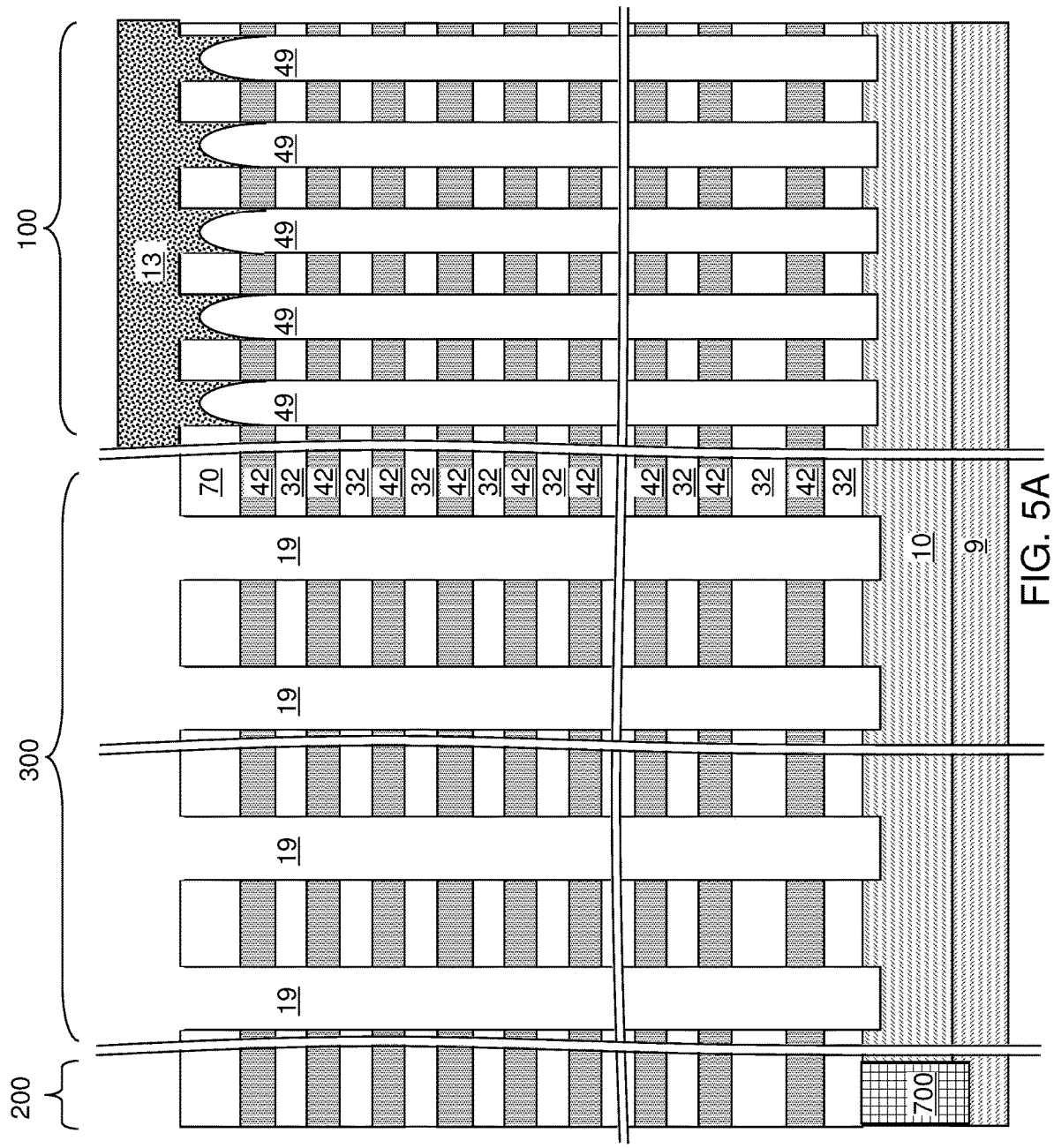
FIG. 5A is a vertical cross-sectional view of the die region of the first exemplary structure after formation of a patterned sacrificial cover layer according to the first embodiment of the present disclosure.
Figure 5B:
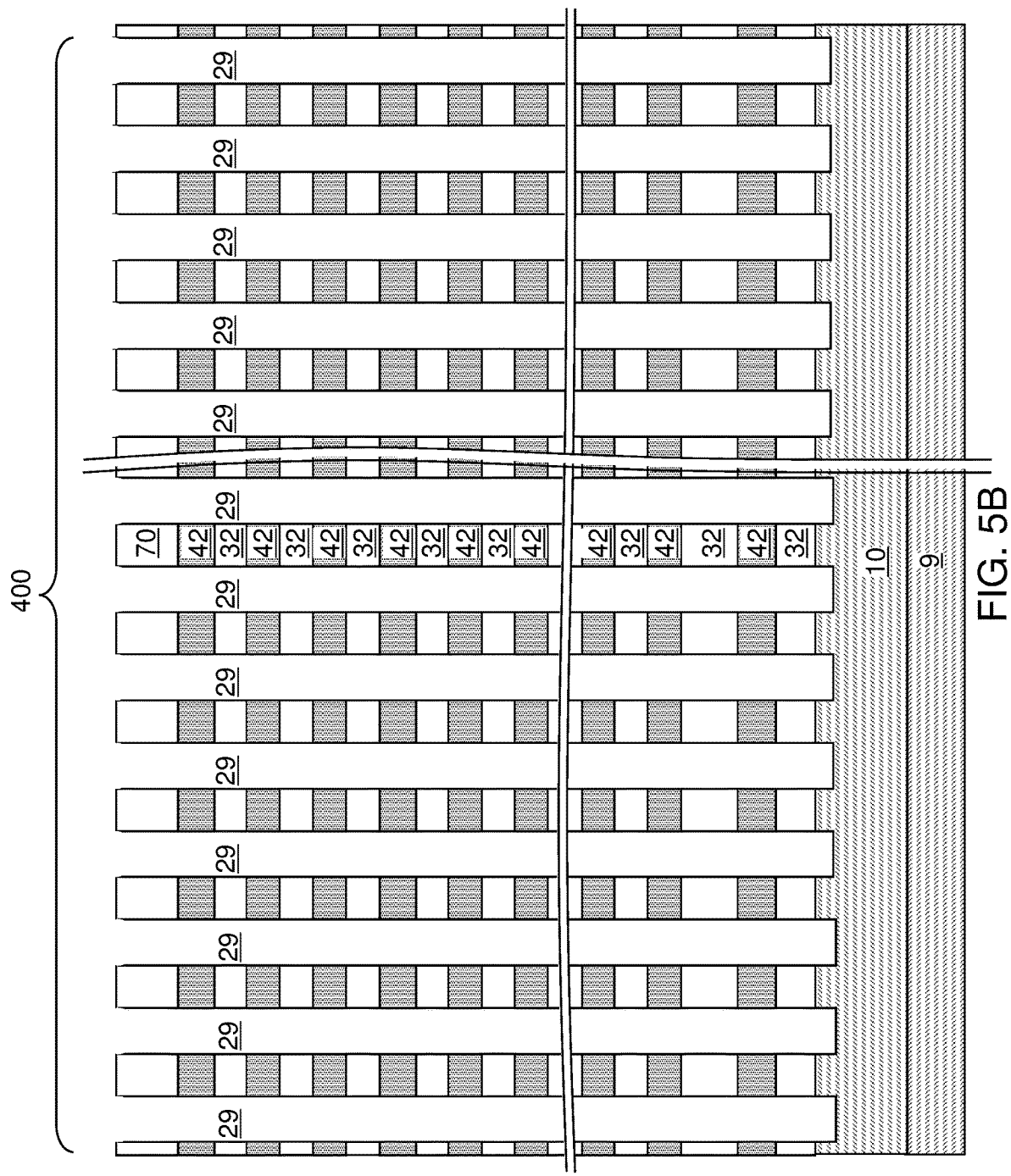
FIG. 5B is a vertical cross-sectional view of the monitor region of the first exemplary structure at the processing steps of FIG. 5A.

Referring to FIGS. 5A and 5B, a sacrificial cover material can be deposited over the first exemplary structure and can be patterned to cover the memory array regions 100 without covering the contact regions 300 or the monitor region 400. The patterned sacrificial cover material forms a patterned sacrificial cover layer 13, which covers the memory openings 49 without covering the monitor openings 29 or the support openings 19. In one embodiment, the patterned sacrificial cover layer 13 comprises a carbon-based material such as amorphous carbon (e.g., advanced patterning film (APF)™ available from Applied Materials, Inc.), diamond-like carbon, etc. In one embodiment, the atomic percentage of carbon atoms in the patterned sacrificial cover layer 13 may be at least 50%.

Figure 6A:
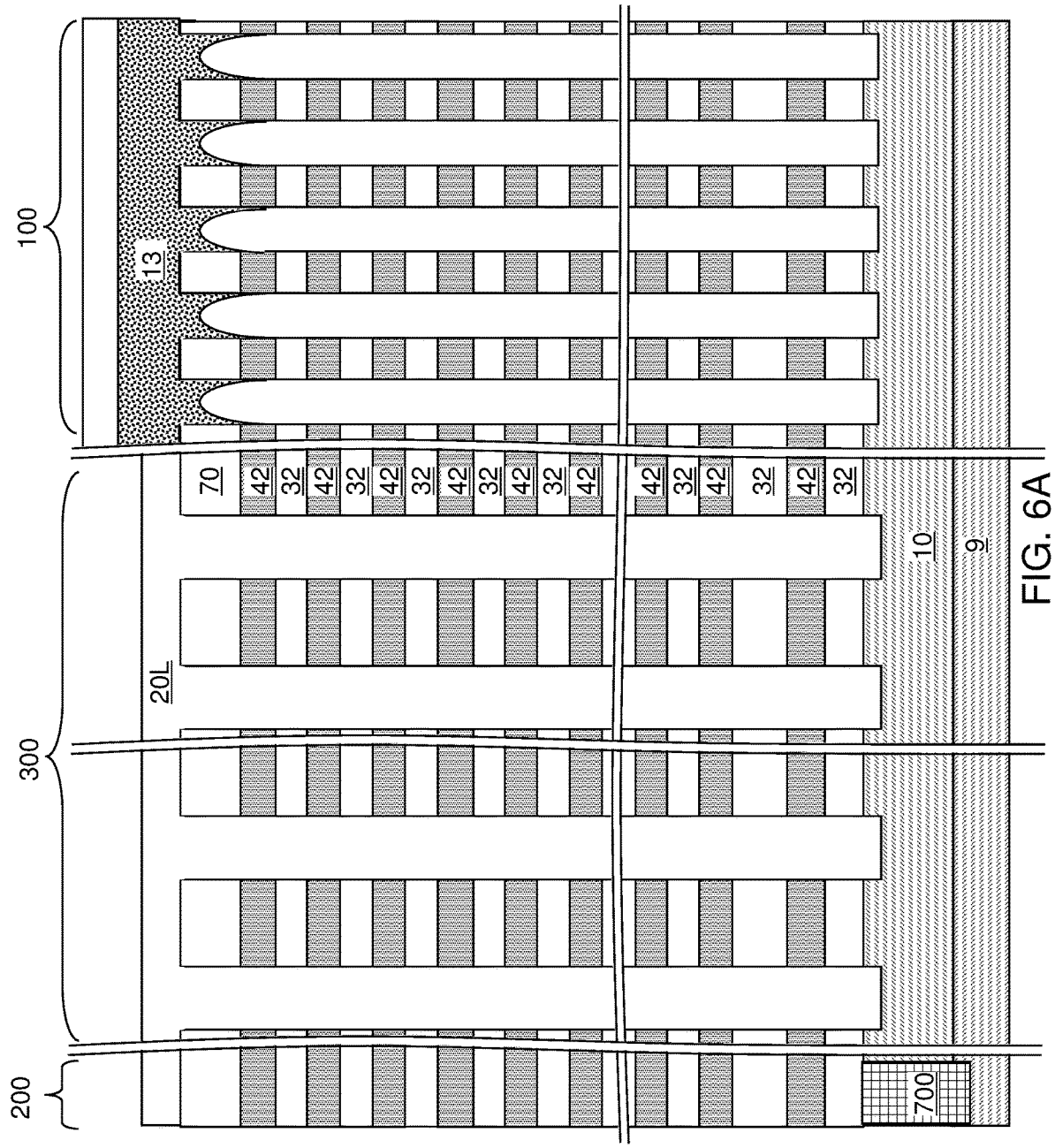
FIG. 6A is a vertical cross-sectional view of the die region of the first exemplary structure after deposition of a dielectric fill material layer according to the first embodiment of the present disclosure.
Figure 6B:
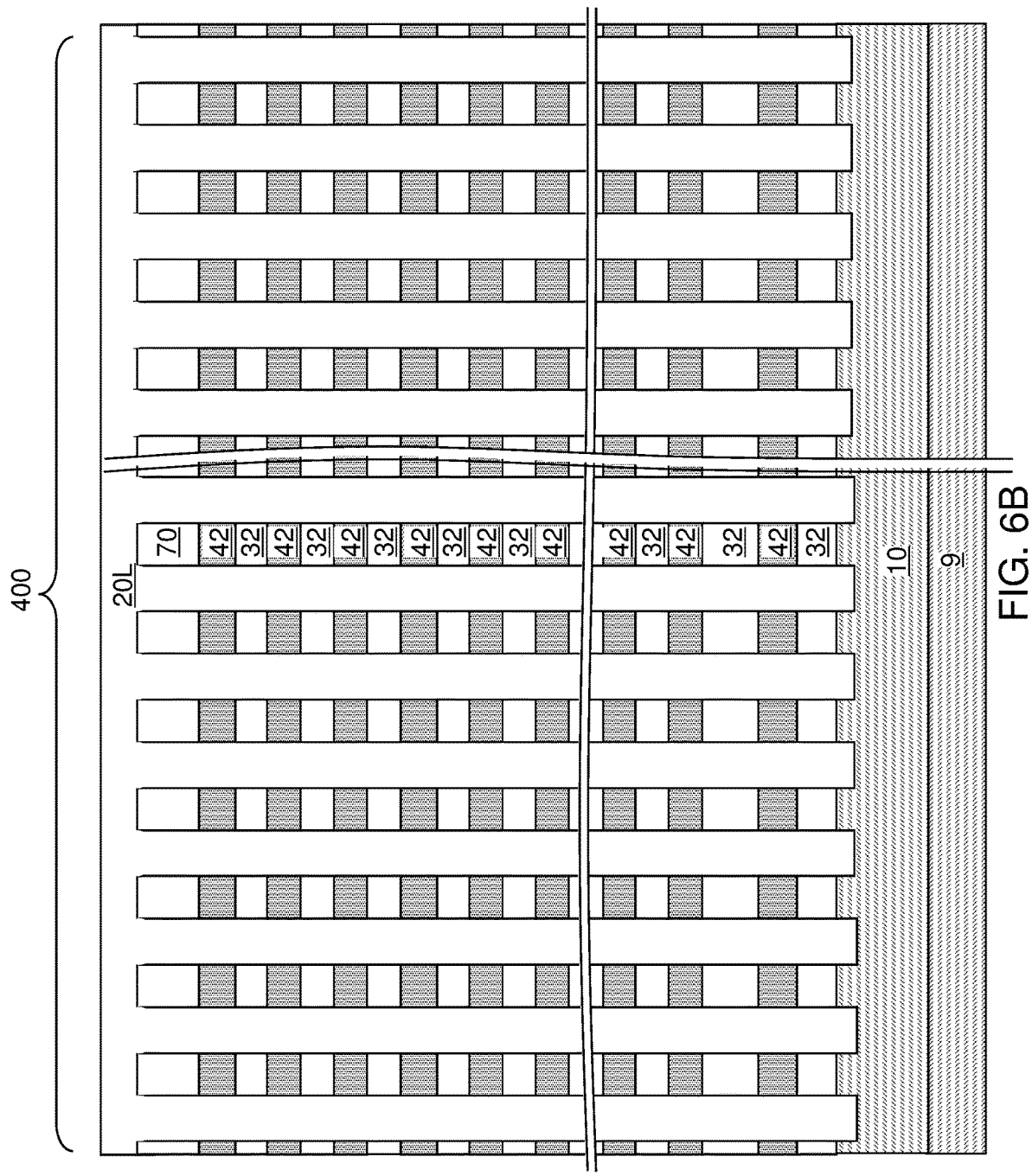
FIG. 6B is a vertical cross-sectional view of the monitor region of the first exemplary structure at the processing steps of FIG. 6A.

Referring to FIGS. 6A and 6B, a dielectric fill material is conformally deposited in the support openings 19 and the monitor openings 29 and over the patterned sacrificial cover layer 13. In one embodiment the dielectric fill material may comprise a silicon oxide material, such as undoped silicate glass or a doped silicate glass. The dielectric fill material fills the monitor openings 29, and as such, may be referred to as a monitor opening fill material. Further, the dielectric fill material fills the support openings 19, and as such, may be referred to as a support pillar material.

Figure 7B:
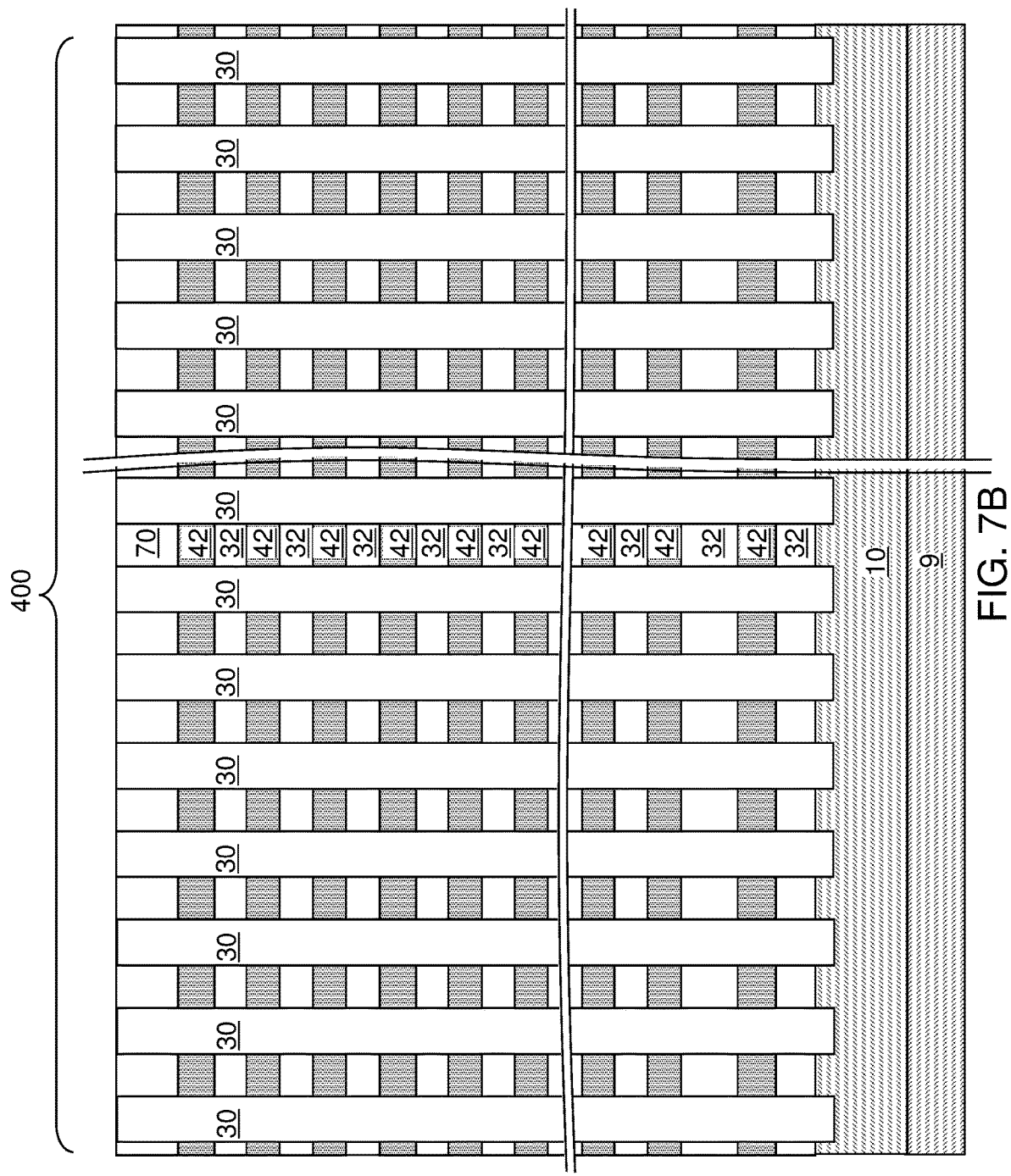
FIG. 7B is a vertical cross-sectional view of the monitor region of the first exemplary structure at the processing steps of FIG. 7A.

Referring to FIGS. 7A and 7B, portions of the dielectric fill material overlying the top surface of the insulating cap layer 70 may be removed by performing an etch back process, which may comprise a wet etch process employing dilute hydrofluoric acid, and/or a chemical mechanical polishing process. Each remaining portion of the dielectric fill material, i.e., the monitor opening fill material, that fills a monitor opening 29 constitutes a monitor opening fill structure 30. Each remaining portion of the dielectric fill material that fills a support opening 19 constitutes a support pillar structure 20.

Generally, monitor opening fill structures 30 can be formed by depositing a monitor opening fill material, e.g., the dielectric fill material, in the monitor openings 29. Additional portions of the monitor opening fill material is deposited in the support openings 19 to form the support pillar structures 20. In other words, the support pillar structures 20 are formed by depositing the monitor opening fill material in the support openings 19 concurrently with formation of the monitor opening fill structures 30. Subsequently, the patterned sacrificial cover layer 13 can be removed, for example, by ashing.

FIGS. 8A-8H are sequential schematic vertical cross-sectional views of a memory opening within the first exemplary structure during formation of a memory stack structure, an optional dielectric core, and a drain region therein according to the first embodiment of the present disclosure.

Referring to FIG. 8A, a memory opening 49 in the first exemplary device structure of FIGS. 7A and 7B is illustrated. The memory opening 49 extends through the insulating cap layer 70, the alternating stack (32, 42), and optionally into an upper portion of the semiconductor material layer 10. Optionally, the sacrificial material layers 42 can be laterally recessed partially to form lateral recesses (not shown), for example, by an isotropic etch.

Referring to FIG. 8B, a blocking dielectric layer 52 can be deposited by a conformal deposition process. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Referring to FIG. 8C, a memory material layer 54, an optional dielectric liner 56, and am optional sacrificial cover material layer 601 can be deposited. Generally, the memory material layer 54 may comprise any memory material such as a charge storage material, a ferroelectric material, a phase change material, or any material that can store data bits in the form of presence or absence of electrical charges, a direction of ferroelectric polarization, electrical resistivity, or another measurable physical parameter. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

The optional dielectric layer 56, if present, includes a dielectric material. In one embodiment, the optional dielectric layer 56 comprises a tunneling dielectric layer through which charge tunneling can be performed under suitable electrical bias conditions. The optional dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the optional dielectric layer 56 can include a stack of a first silicon oxide layer, a silicon oxynitride layer, and a second silicon oxide layer, which is commonly known as an ONO stack. In one embodiment, the optional dielectric layer 56 can include a silicon oxide layer that is substantially free of carbon or a silicon oxynitride layer that is substantially free of carbon. The thickness of the optional dielectric layer 56 can be in a range from 2 nm to 20 nm, although lesser and greater thicknesses can also be employed. The combination of the blocking dielectric layer 52, the memory material layer 54, and the optional dielectric layer 56 constitutes a memory film 50.

The optional sacrificial cover material layer 601 includes a sacrificial material that can be subsequently removed selective to the material of the dielectric layer 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 8D, the optional sacrificial cover material layer 601, the dielectric layer 56, the memory material layer 54, and the blocking dielectric layer 52 overlying the insulating cap layer 70 are sequentially anisotropically etched employing at least one anisotropic etch process. Portions of the sacrificial cover material layer 601, the dielectric layer 56, the memory material layer 54, and the blocking dielectric layer 52 located above the top surface of the insulating cap layer 70 can be removed by the at least one anisotropic etch process. Further, the horizontally-extending portions of the sacrificial cover material layer 601, the dielectric layer 56, the memory material layer 54, and the blocking dielectric layer 52 at a bottom of each memory cavity 49' can be removed to form openings in remaining portions thereof. Each of the sacrificial cover material layer 601, the dielectric layer 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a continuous memory material layer in which each portion adjacent to the sacrificial material layers 42 constitutes a charge storage region.

A set of a blocking dielectric layer 52, a memory material layer 54, and a dielectric layer 56 in a memory opening 49 constitutes a memory film 50, which includes a plurality of charge storage regions (comprising portions of the memory material layer 54) that are insulated from surrounding materials by the blocking dielectric layer 52 and the dielectric layer 56. In one embodiment, the sacrificial cover material layer 601, the dielectric layer 56, the memory material layer 54, and the blocking dielectric layer 52 can have vertically coincident sidewalls. The sacrificial cover material layer 601 can be subsequently removed selective to the material of the dielectric layer 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601. Alternatively, the sacrificial cover material layer 601 may be retained.

Figure 8F:
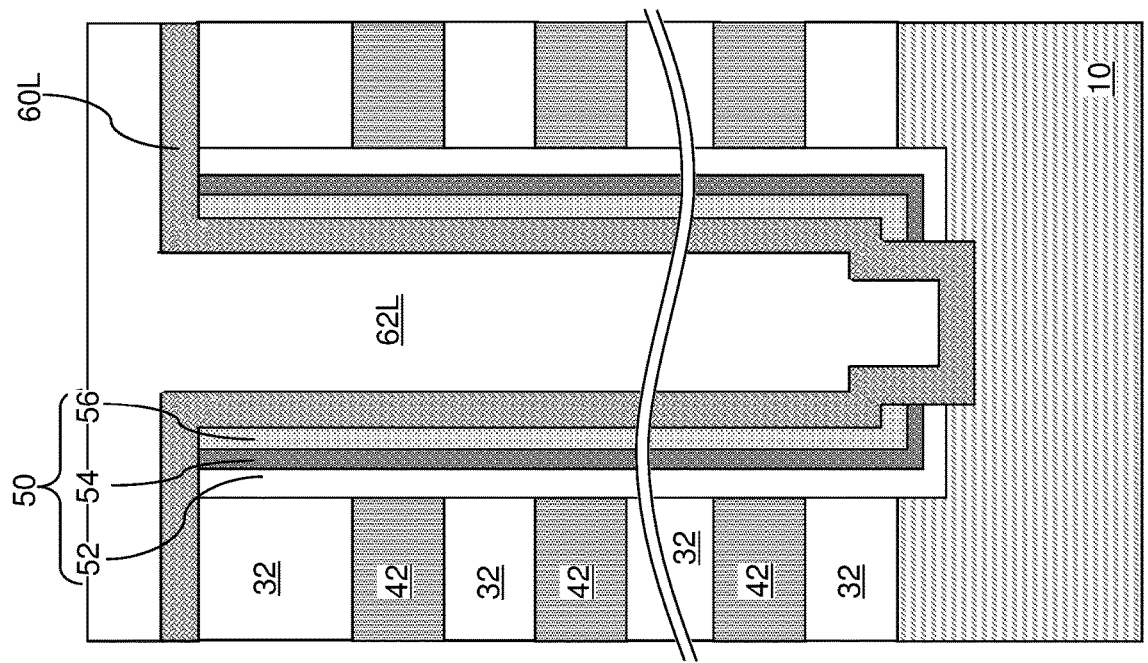
Figure 8E:
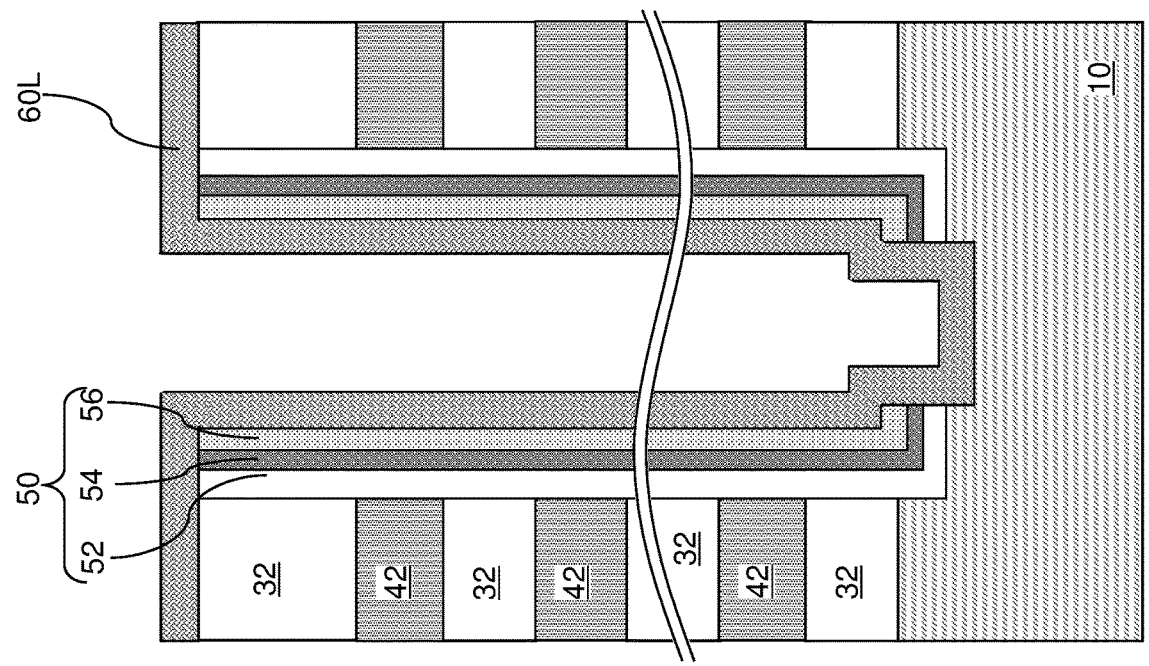

Referring to FIG. 8E, a semiconductor channel layer 60L can be deposited directly on the dielectric layer 56 in the memory opening 49. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 8F, in case the memory cavity 49' in each memory opening 49 is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material, such as silicon oxide or organosilicate glass. The dielectric core layer 62L can be deposited by a conformal deposition method such as low pressure chemical vapor deposition (LPCVD), or by a self-planarizing deposition process such as spin coating.

Figure 8H:
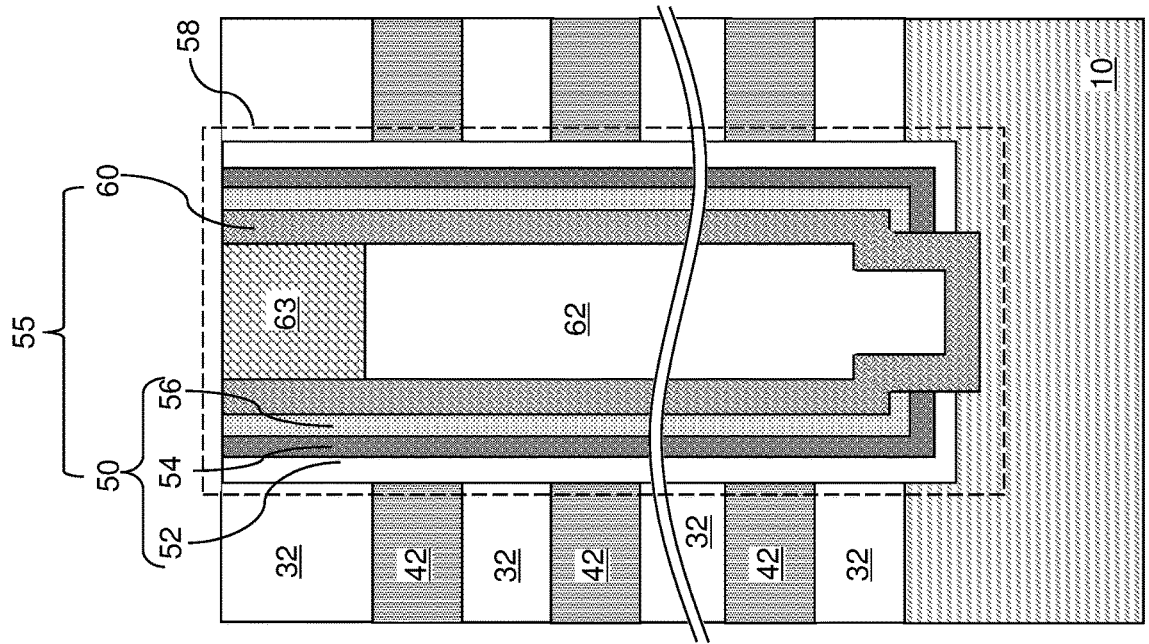
Figure 8G:
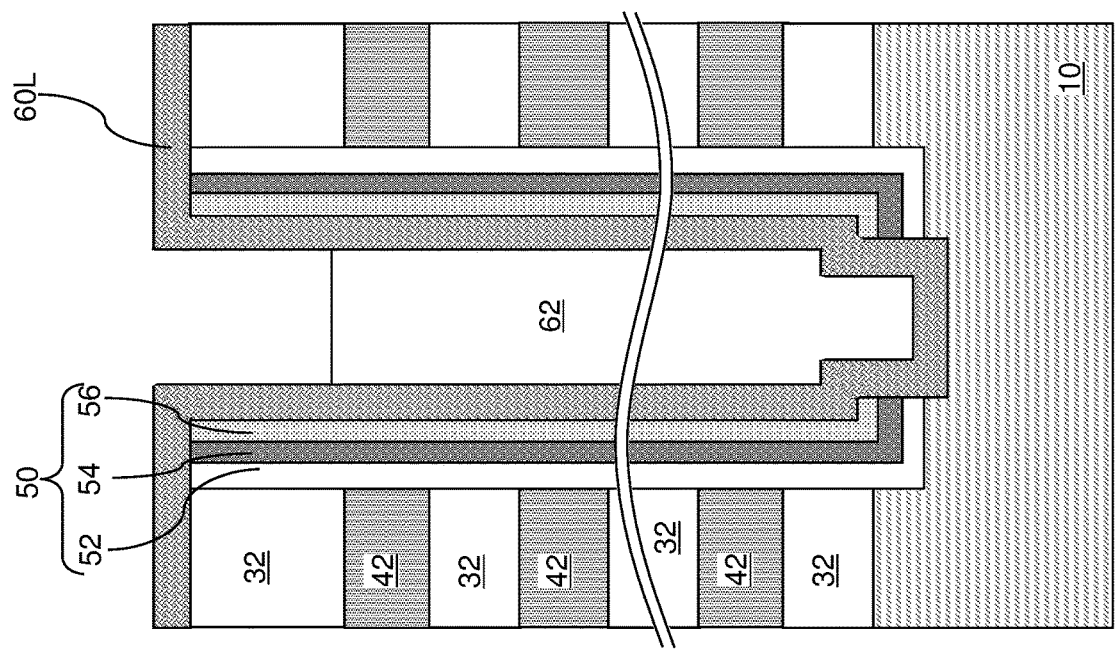

Referring to FIG. 8G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 8H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0 \times 10^{18}/cm^3$ to $2.0 \times 10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each adjoining set of a blocking dielectric layer 52, a memory material layer 54, and a dielectric layer 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel 60, a dielectric layer 56, a plurality of memory elements comprising portions of the memory material layer 54, and an optional blocking dielectric layer 52. An entire set of material portions that fills a memory opening 49 is herein referred to as a memory opening fill structure 58.

Generally, a memory opening fill structure 58 can be formed in each memory opening 49. The memory opening fill structure 58 comprises an optional blocking dielectric layer 52, a memory material layer 54, an optional dielectric layer 56, and a vertical semiconductor channel 60. A dielectric layer 56 may laterally surround the vertical semiconductor channel 60. The memory material layer 54 can laterally surround the dielectric layer 56.

Figure 9A:
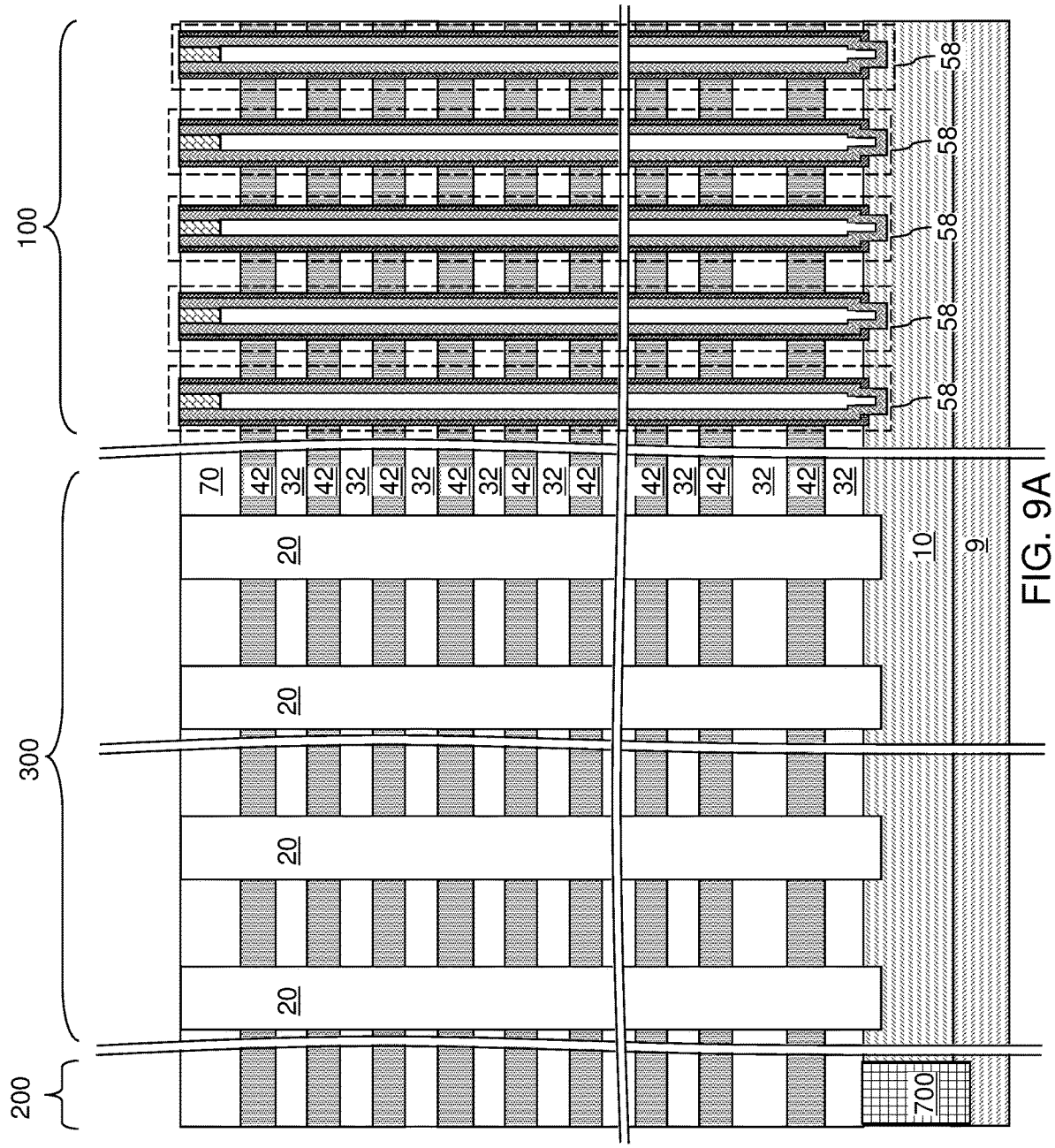
FIG. 9A is a vertical cross-sectional view of the die region of the first exemplary structure after formation of memory opening fill structures according to the first embodiment of the present disclosure.
Figure 9B:
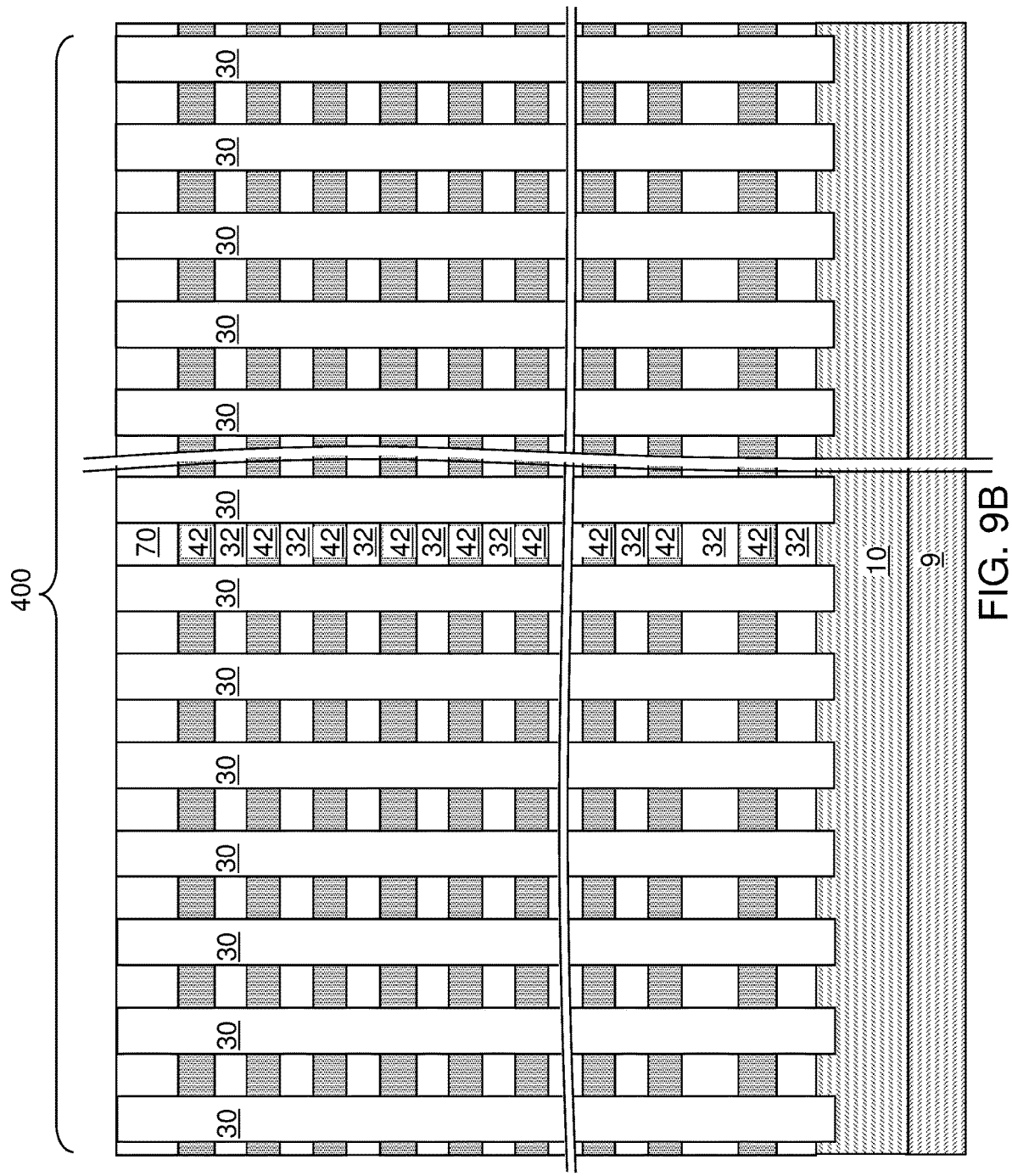
FIG. 9B is a vertical cross-sectional view of the monitor region of the first exemplary structure at the processing steps of FIG. 9A.

Referring to FIGS. 9A and 9B, the first exemplary structure is illustrated after formation of memory opening fill structures 58 within the memory openings 49. An instance of a memory opening fill structure 58 can be formed within each memory opening 49 of the structure of FIGS. 7A and 7B.

Figure 10A:
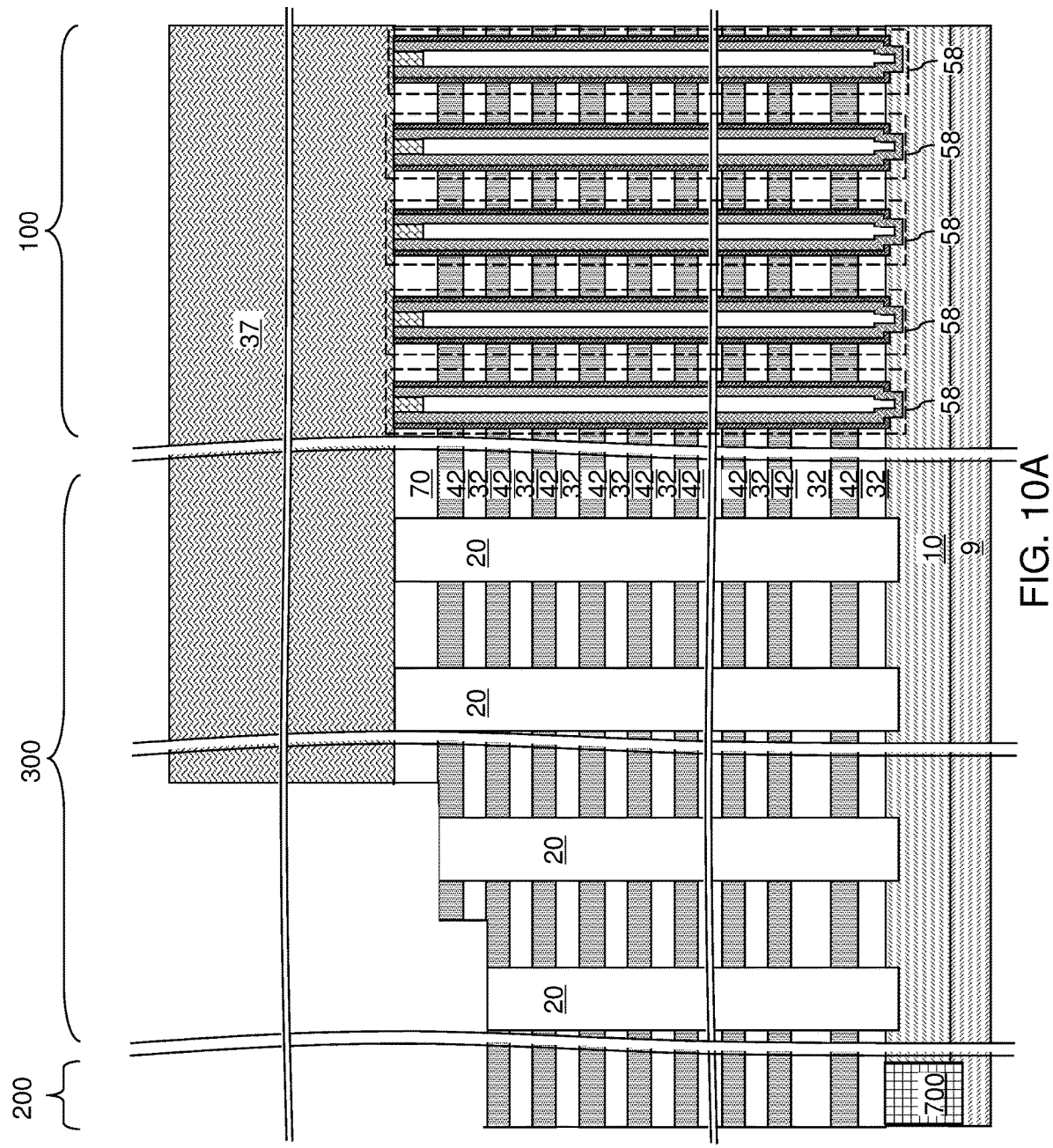
FIG. 10A is a vertical cross-sectional view of the die region of the first exemplary structure during formation of stepped surfaces in the contact region and in the monitor region according to the first embodiment of the present disclosure.
Figure 10B:
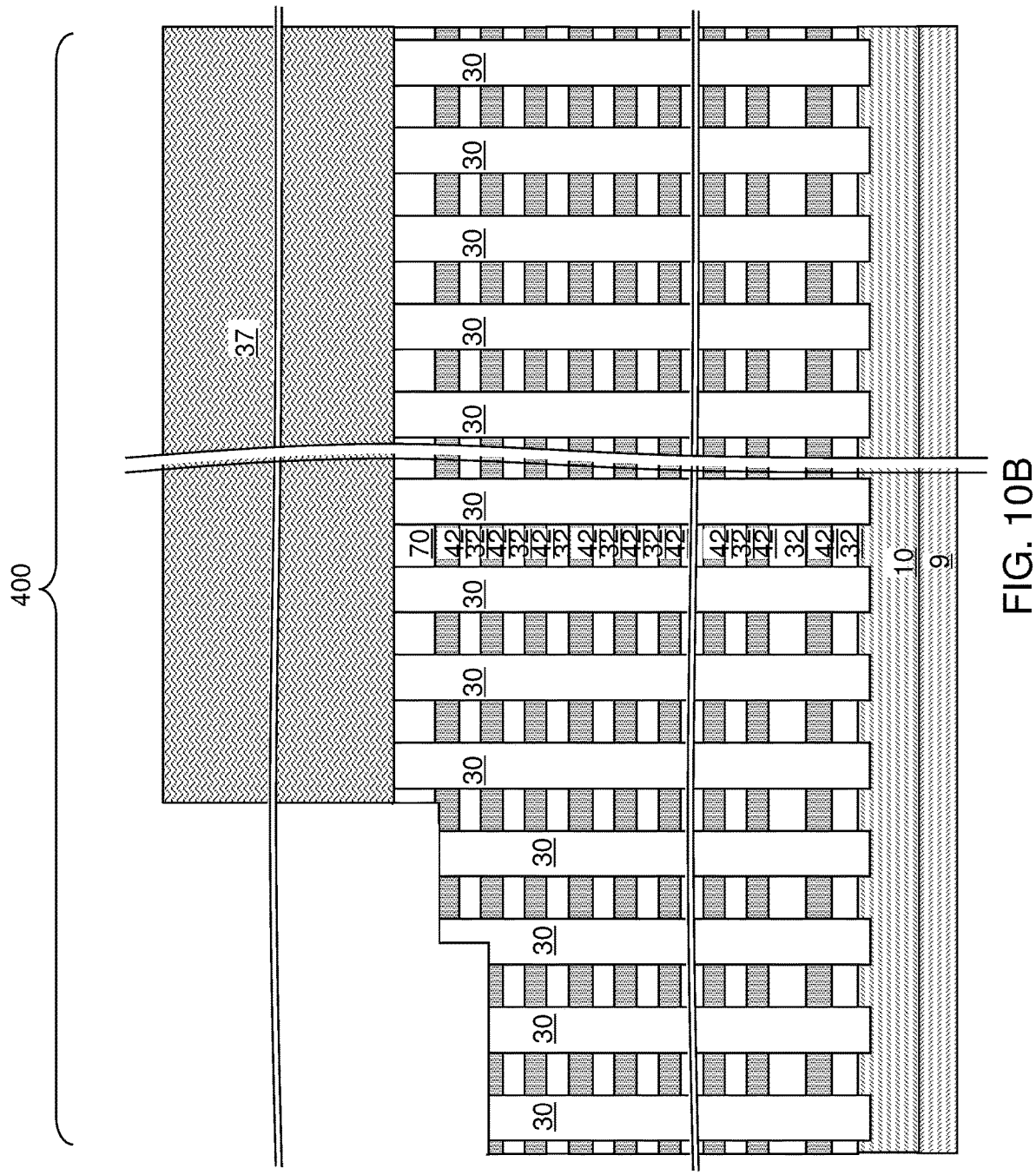
FIG. 10B is a vertical cross-sectional view of the monitor region of the first exemplary structure at the processing steps of FIG. 10A.
Figure 11A:
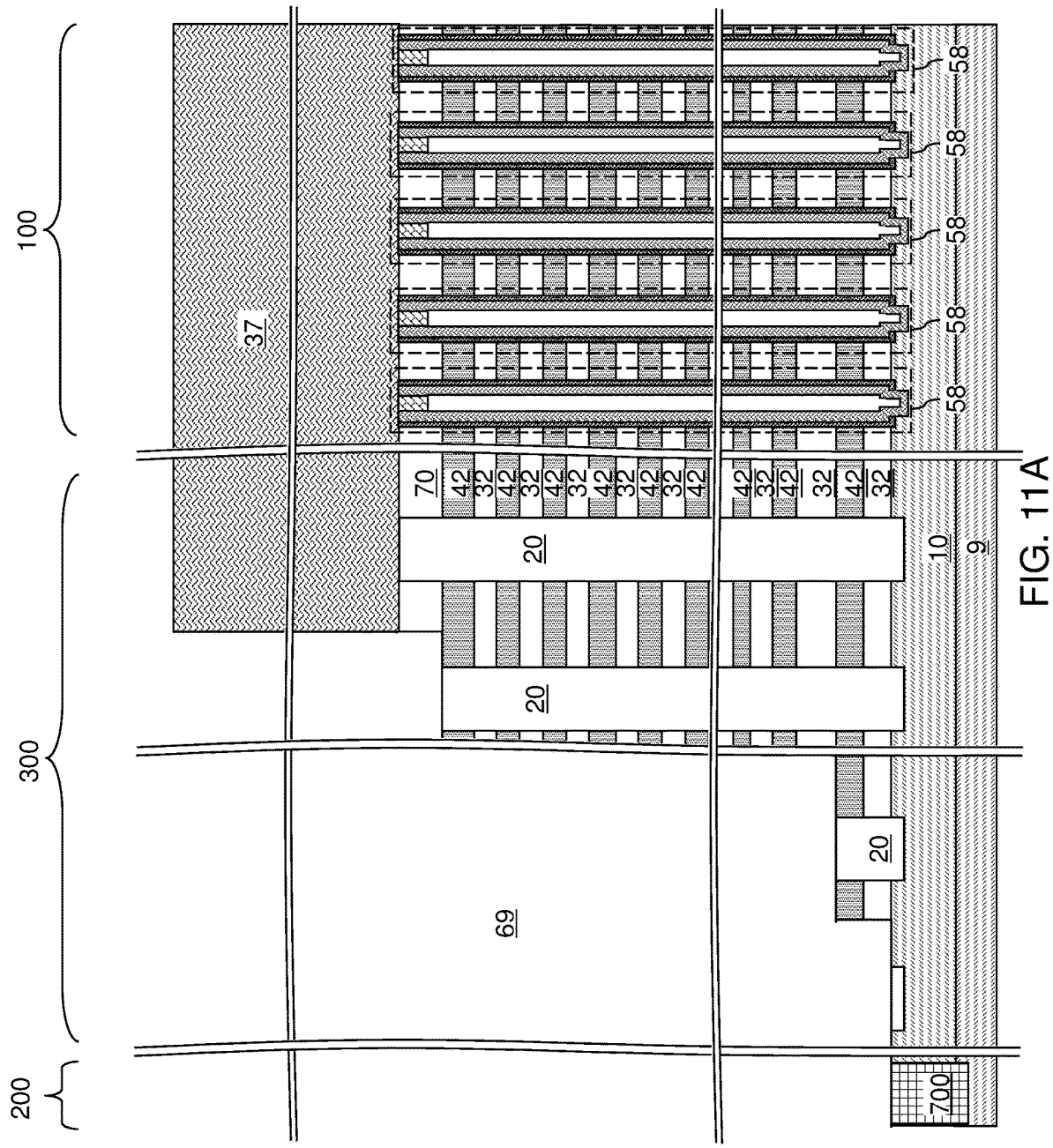
FIG. 11A is a vertical cross-sectional view of the die region of the first exemplary structure after formation of stepped surfaces in the contact region and in the monitor region according to the first embodiment of the present disclosure.
Figure 11B:
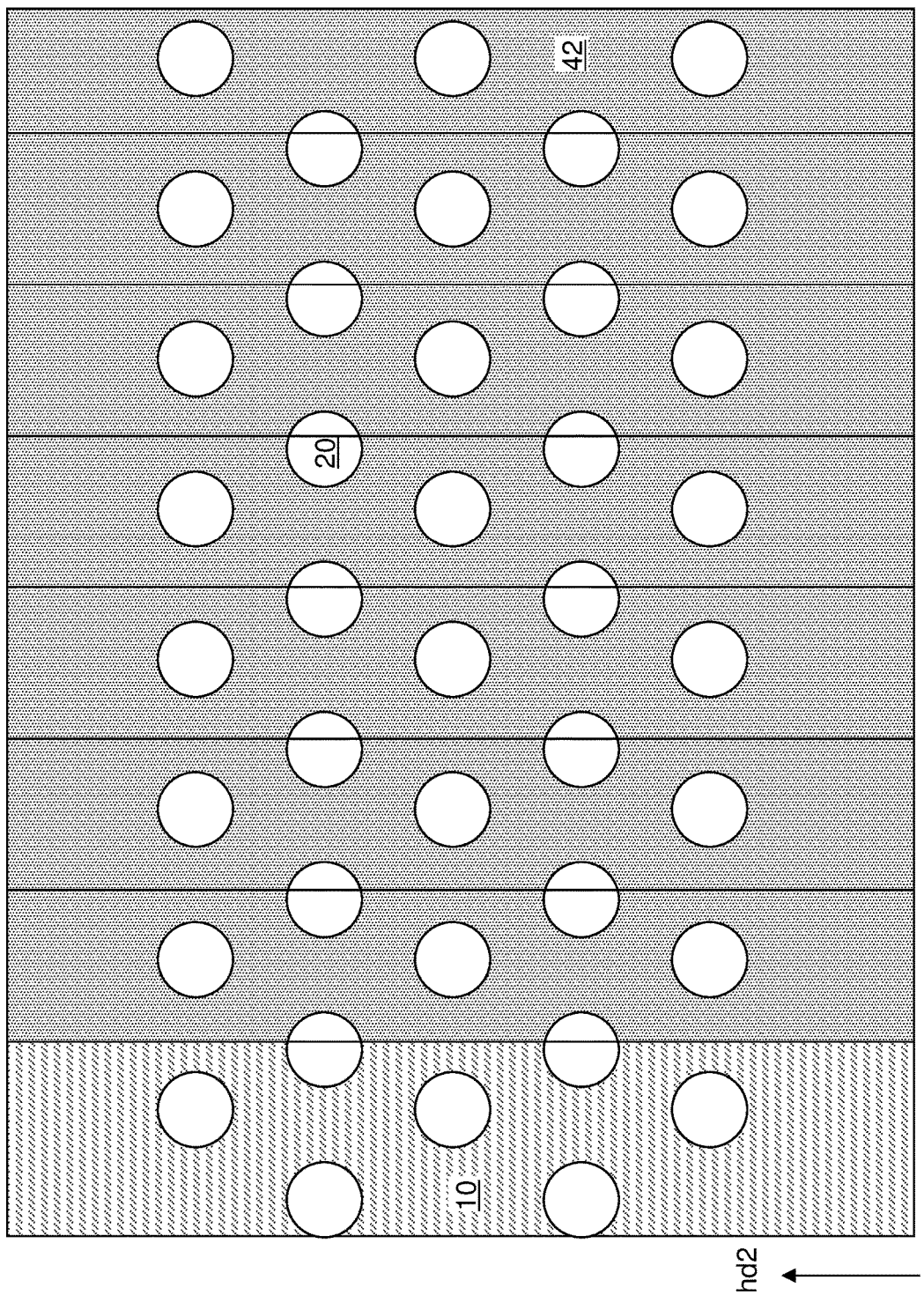
FIG. 11B is a top-down view of the contact area at the processing steps of FIG. 11A.
Figure 11C:
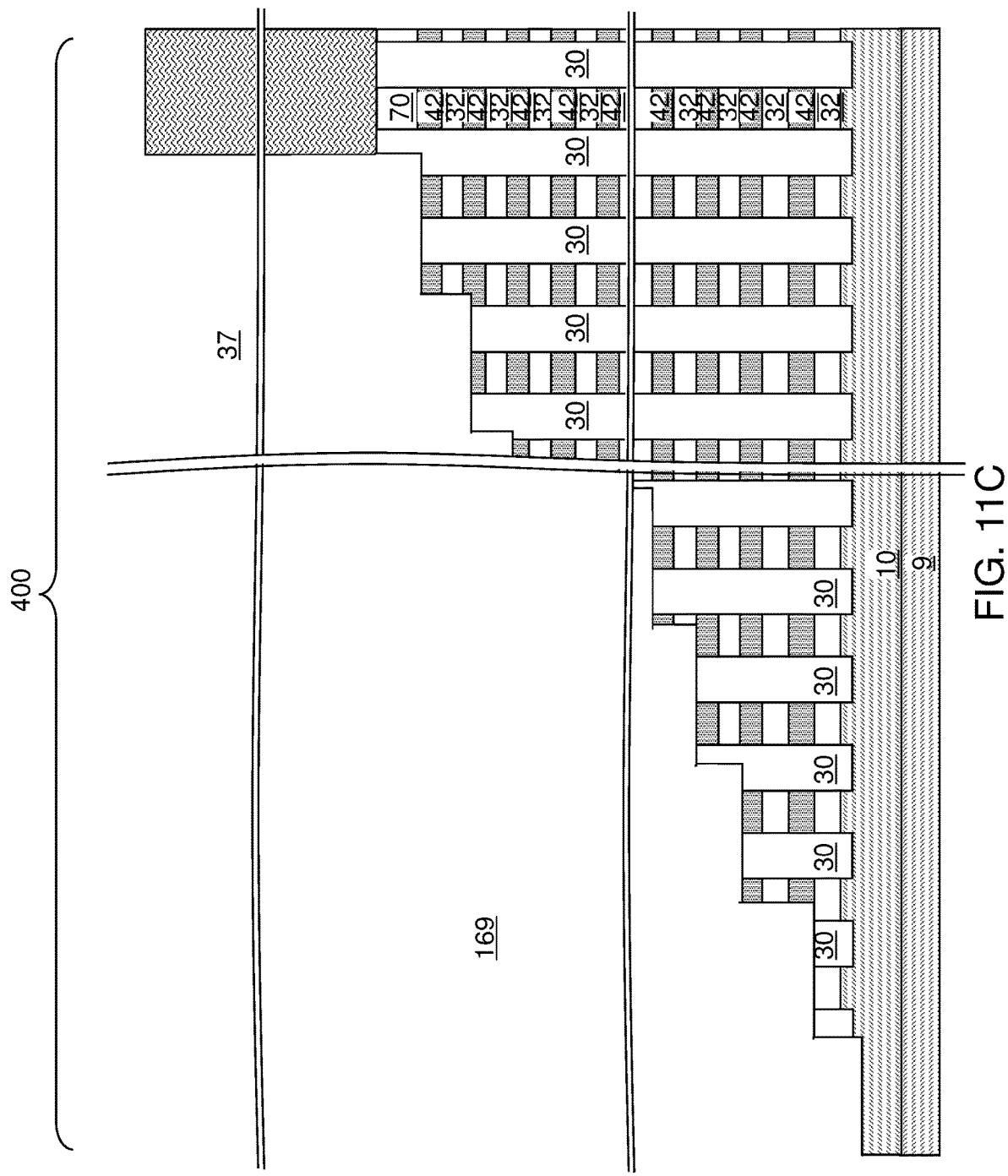
FIG. 11C is a vertical cross-sectional view of the monitor region of the first exemplary structure at the processing steps of FIGS. 11A and 11B.
Figure 11D:
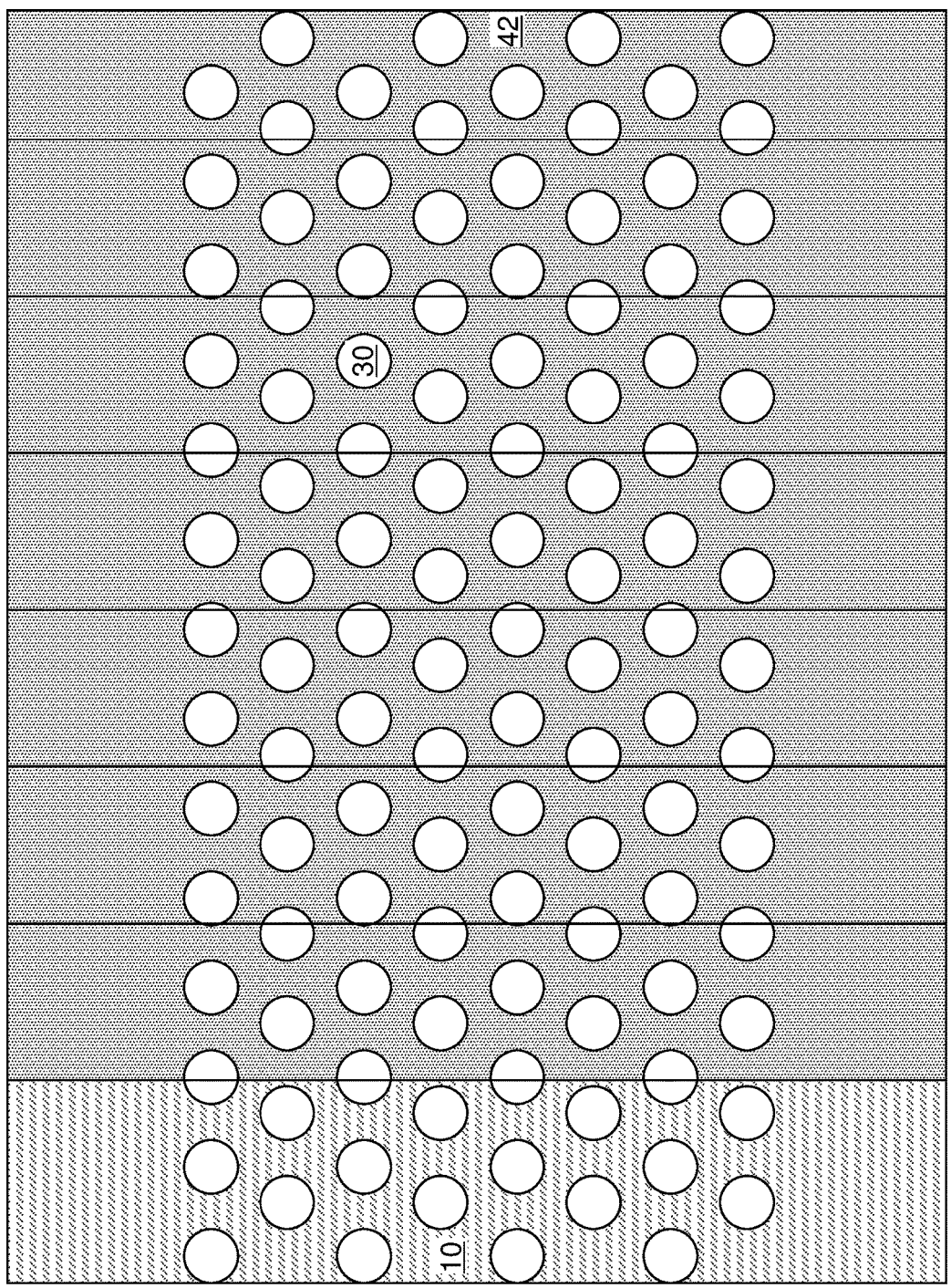
FIG. 11D is a top-down view of the monitor area at the processing steps of FIGS. 11A-11C.

Referring to FIGS. 10A and 10B, first portions of the alternating stack (32, 42) in the contact region 300 and second portions of the alternating stack (32, 42) in the monitor region 400 can be recessed such that first horizontal surfaces of the spacer material layers (such as the sacrificial material layers 42) are physically exposed in the contact region 300 and second horizontal surfaces of the spacer material layers (such as the sacrificial material layers 42) and recessed surfaces of the monitor opening fill structures 30 are physically exposed in the monitor region 400.

In one embodiment, stepped surfaces are formed in the contact region 300 and in the monitor region 400. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. Specifically, first stepped surfaces are formed in each contact region 300, and second stepped surfaces are formed in the monitor region 400 concurrently with formation of the first stepped surfaces. A first stepped cavity is formed above first stepped surfaces in each contact region 300. A second stepped cavity is formed above second stepped surfaces in the monitor region 400. A "stepped cavity" refers to a cavity having stepped surfaces.

In one embodiment, a trimmable mask layer 37 can be formed over the alternating stack (32, 42) such that a first edge of the trimmable mask layer 37 is formed in a contact region 300 and a second edge of the trimmable mask layer 37 is formed in the monitor region 400. A set of unit processing sequence can be iteratively performed multiple times. The set of unit processing sequence comprises an anisotropic etch step that etches at least one pair of an insulating layer 32 and a spacer material layer (such as a sacrificial material layer 42) within the alternating stack (32, 42) and a mask trimming step that isotropically trims the trimmable mask layer 37. In one embodiment, the monitor opening fill structures 30 and the support pillar structures 20 are collaterally recessed during the recessing of the portions of the alternating stack (32, 42) in the contact regions 300 and in the monitor region 400. Each iteration of the set of unit processing sequence vertically recesses a physically exposed horizontal surface segment of the alternating stack (32, 42) by a pair of an insulating layer 32 and a spacer material layer (such as a sacrificial material layer 42), and laterally recesses the trimmable mask layer 37 such that a new horizontal surface segment of a topmost spacer material layer (such as a topmost sacrificial material layer 42) or of the insulating cap layer 70 is physically exposed.

Referring to FIGS. 11A-11D, the set of unit processing sequence can be repeated as many times as the total number of spacer material layers (such as the sacrificial material layers 42) within the alternating stack (32, 42). Each set of first stepped surfaces in a respective contact region 300 may continuously extend from the top surface of the semiconductor material layer 10 to the top surface of the insulating cap layer 70. The set of second stepped surfaces in the monitor region 400 may continuously extend from the top surface of the semiconductor material layer 10 to the top surface of the insulating cap layer 70. A first stepped cavity 69 can be formed above each set of first stepped surfaces in the contact region. A second stepped cavity 169 can be formed above each set of second stepped surfaces in the monitor region 400. The trimmable mask layer 37 can be subsequently removed, for example, by ashing.

Generally, first stepped surfaces can be formed in the contact region 300 such that first stepped surfaces comprise first horizontal surface segments of the spacer material layers (such as the sacrificial material layers 42) and first vertical surface segments of the insulating layers 32 and the spacer material layers (such as the sacrificial material layers 42). Second stepped surfaces are formed in the monitor region 400 such the second stepped surfaces comprise second horizontal surface segments of the spacer material layers (such as the sacrificial material layers 42) and second vertical surface segments of the insulating layers 32 and the spacer material layers (such as the sacrificial material layers 42). In one embodiment, physically exposed horizontal surfaces of the alternating stack (32, 42) may comprise horizontal surfaces of the sacrificial material layers 42.

Further, recessed top surfaces of the monitor opening fill structures 30 can be physically exposed in the monitor region 400, and recessed top surfaces of the support pillar structures 20 can be physically exposed in the contact region 300. The sacrificial material layers 42 may have a different material composition than the monitor opening fill structures 30. In one embodiment, the sacrificial material layers 42 may comprise silicon nitride, and the monitor opening fill structures 30 may comprise silicon oxide. Different materials in the sacrificial material layers 20 and the monitor opening fill structures 30 increases contrast in the images of the monitor opening fill structures 30 to be subsequently generated.

According to an aspect of the present disclosure, characteristics of the recessed surfaces of the monitor opening fill structures 30 can be measured employing a scanning electron microscope and/or an optical image measurement tool, such as an optical microscope, camera and/or photodetector. The measured characteristic of the recessed surfaces of the monitor opening fill structures 30 may comprise geometrical characteristics of the recessed top surfaces of the monitor opening fill structures 30 such as shapes, sizes, and various parameters that can be derived therefrom. In one embodiment, the measured characteristic of the recessed surfaces of the monitor opening fill structures 30 may comprise changes in areas of the recessed surfaces of the monitor opening fill structures 30 as a function of a vertical distance between the substrate 9 and the recessed surfaces of the monitor opening fill structures 30. In one embodiment, the characteristics of the recessed surfaces of the monitor opening fill structures 30 comprise changes in an average lateral dimension (e.g., diameter) of the recessed surfaces of the monitor opening fill structures 30 as a function of a vertical distance between the substrate 9 and the recessed surfaces of the monitor opening fill structures 30. For monitor opening fill structures 30 having a circular horizontal cross-sectional shape, the "average lateral dimension" of a two-dimensional closed shape refers to the diameter of a circle having a same area as the two-dimensional closed shape. In one embodiment, the characteristics of the recessed surfaces of the monitor opening fill structures 30 comprise changes in ellipticity of the recessed surfaces of the monitor opening fill structures 30 as a function of a vertical distance between the substrate and the recessed surfaces of the monitor opening fill structures 30. The ellipticity of a two-dimensional closed shape refers to the ellipticity of an ellipse that provides a least root-mean-square error during fitting the two-dimensional closed shape with ellipses.

Generally, the shapes of the monitor openings 29 as formed at the processing steps of FIGS. 4A-4E are the same as the shapes of the memory openings 49 as formed at the processing steps of FIGS. 4A-4E. Thus, the horizontal cross-sectional profiles of the monitor openings 29 and the monitor opening fill structures 30 can be statistically the same as the horizontal cross-sectional profiles of the memory openings 49 and the memory opening fill structures 58. Therefore, by performing an in-line measurement of recessed top surfaces of the monitor opening fill structures 30 generates images of horizontal cross-sectional views of the monitor opening fill structures 30 at different levels as the height of the second stepped surfaces change from one side of the captured image to the other side of the captured image. The image capture may be performed employing the optical measurement tool or the scanning electron microscope. In one embodiment, the method further comprises determining at least one characteristic (e.g., the at least one geometric characteristic described above) of the memory openings 49 or memory opening fill structures 58 based on the step of determining at least one characteristic of the recessed surfaces of the monitor opening fill structures 30.

Figure 12A:
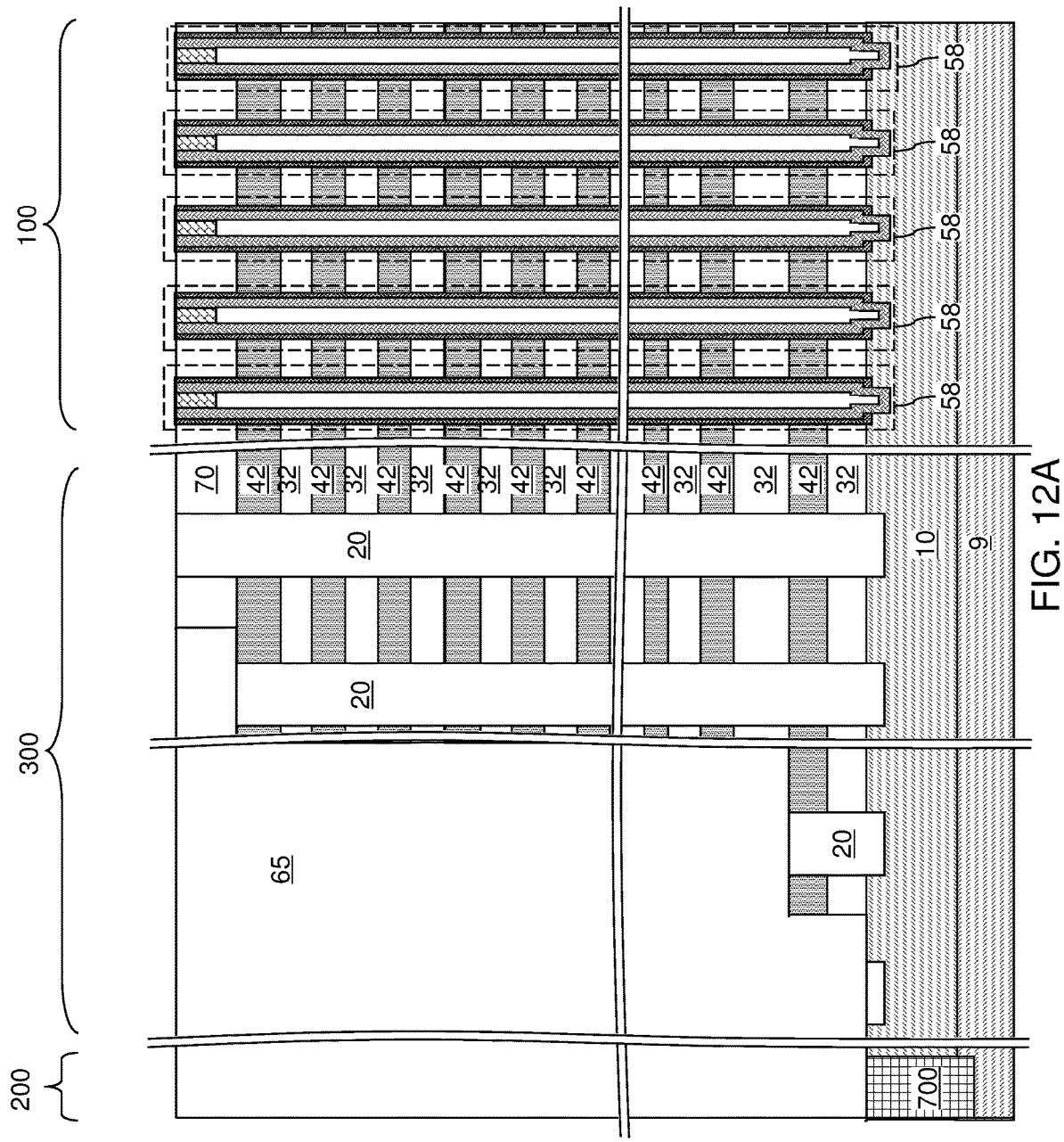
FIG. 12A is a vertical cross-sectional view of the die region of the first exemplary structure after formation of retro-stepped dielectric material portions according to the first embodiment of the present disclosure.
Figure 12B:
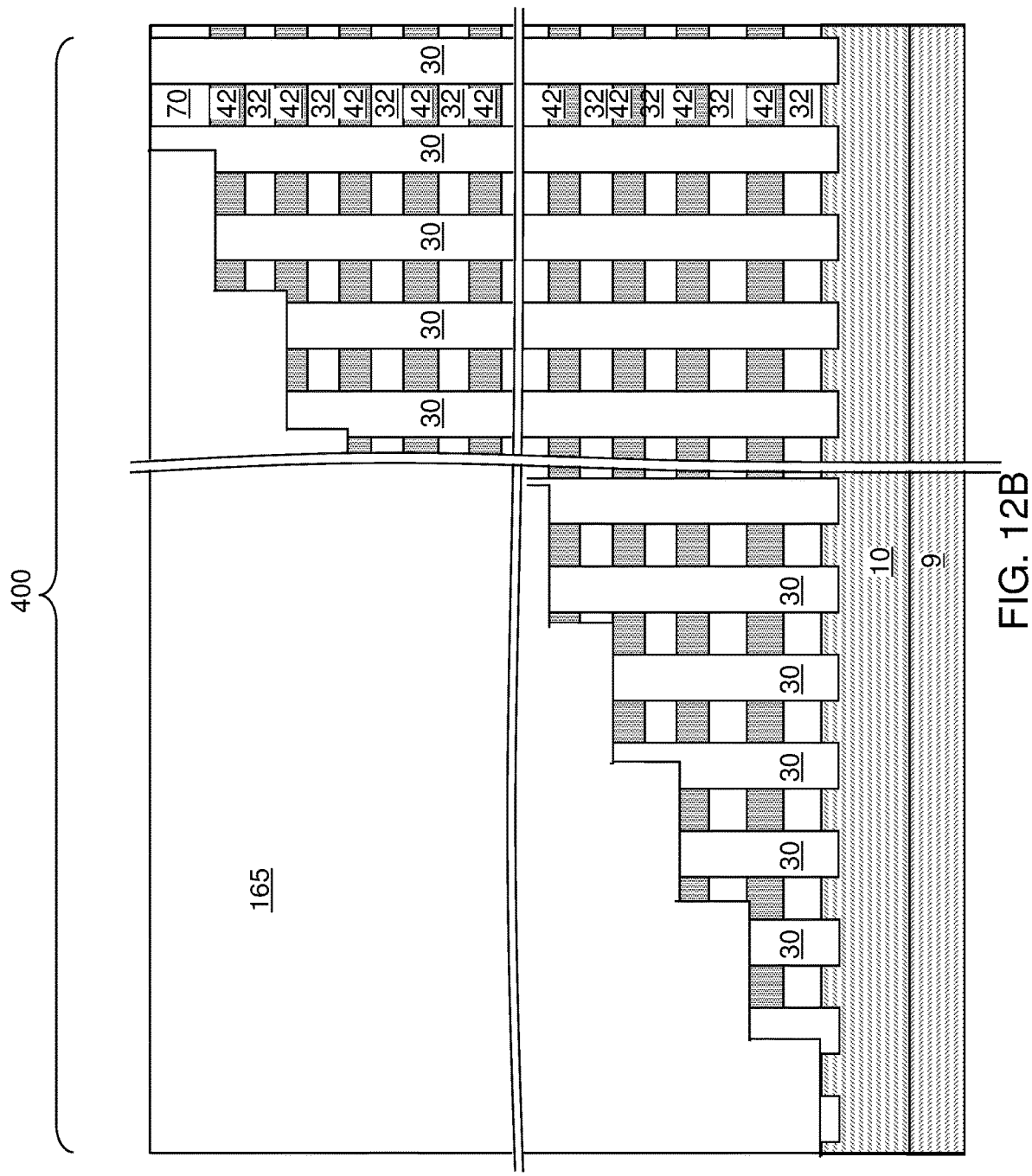
FIG. 12B is a vertical cross-sectional view of the monitor region of the first exemplary structure at the processing steps of FIG. 12A.

Referring to FIGS. 12A and 12B, retro-stepped dielectric material portions (65, 165) (i.e., an insulating fill material portion) can be formed in the stepped cavities (69, 169) by deposition of a dielectric material therein. For example, a dielectric material such as silicon oxide can be deposited in the stepped cavities (69, 169). Excess portions of the deposited dielectric material can be removed from above the top surface of the insulating cap layer 70, for example, by chemical mechanical planarization (CMP). Each remaining portion of the deposited dielectric material filling the stepped cavity constitutes a retro-stepped dielectric material portion (65, 165). As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portions (65, 165), the silicon oxide of the retro-stepped dielectric material portion (65, 165) may, or may not, be doped with dopants such as B, P, and/or F. The retro-stepped dielectric material portions (65, 165) comprise first retro-stepped dielectric material portions 65 and a second retro-stepped dielectric material portion 165.

Figure 13A:
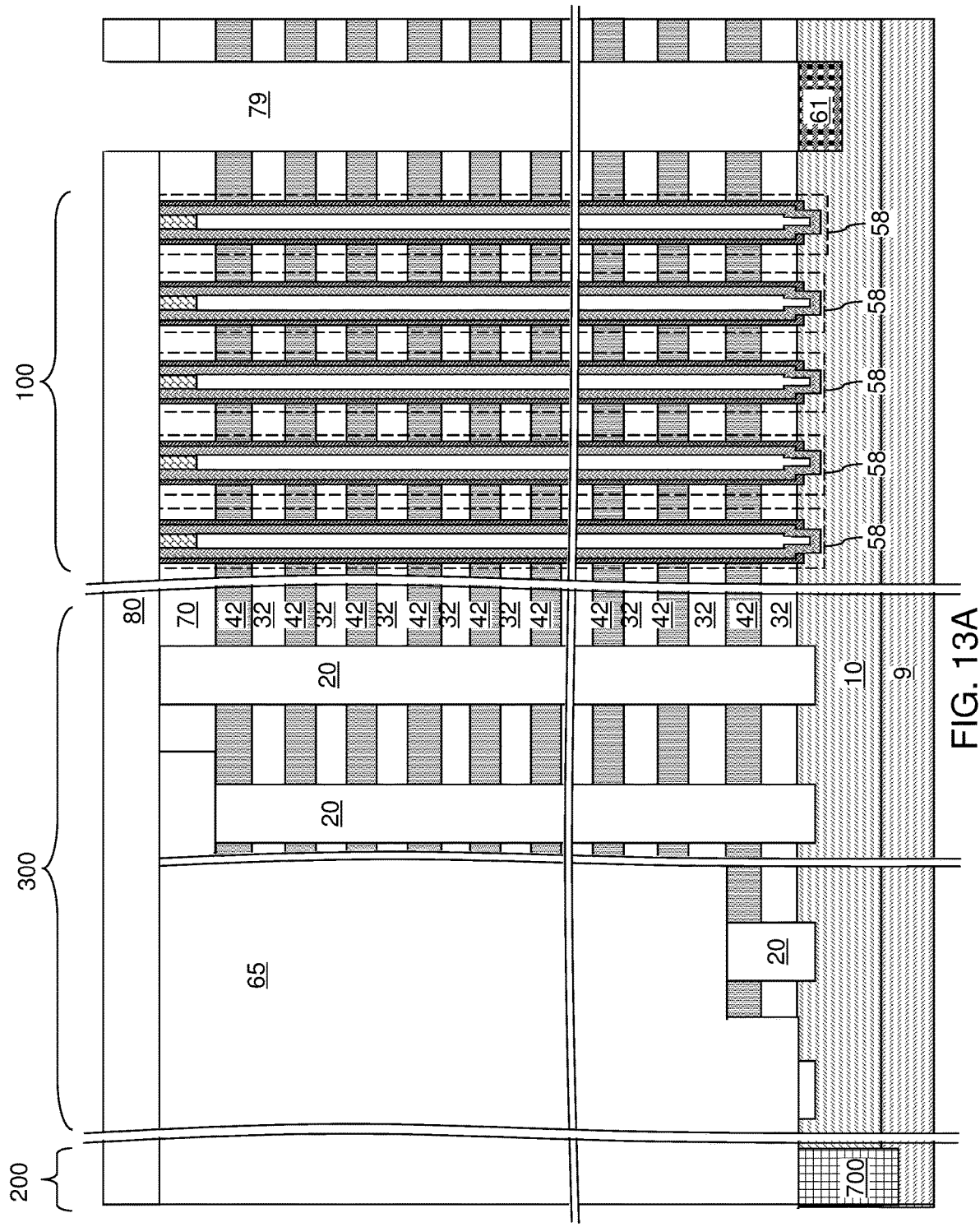
FIG. 13A is a vertical cross-sectional view of the die region of the first exemplary structure during formation of backside trenches according to the first embodiment of the present disclosure.
Figure 13B:
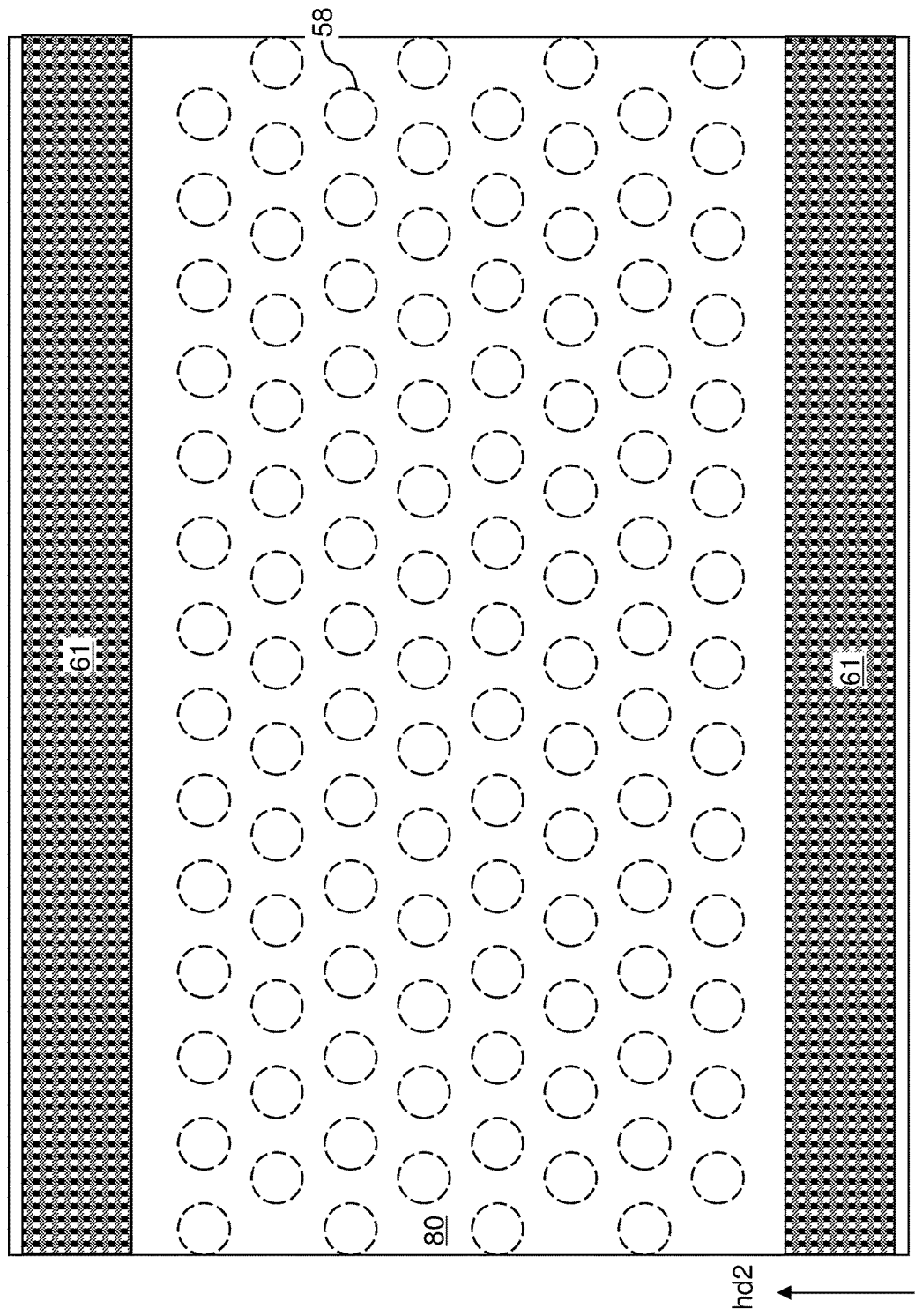
FIG. 13B is a top-down view of the memory array region in the first exemplary structure of FIG. 13A.
Figure 13C:
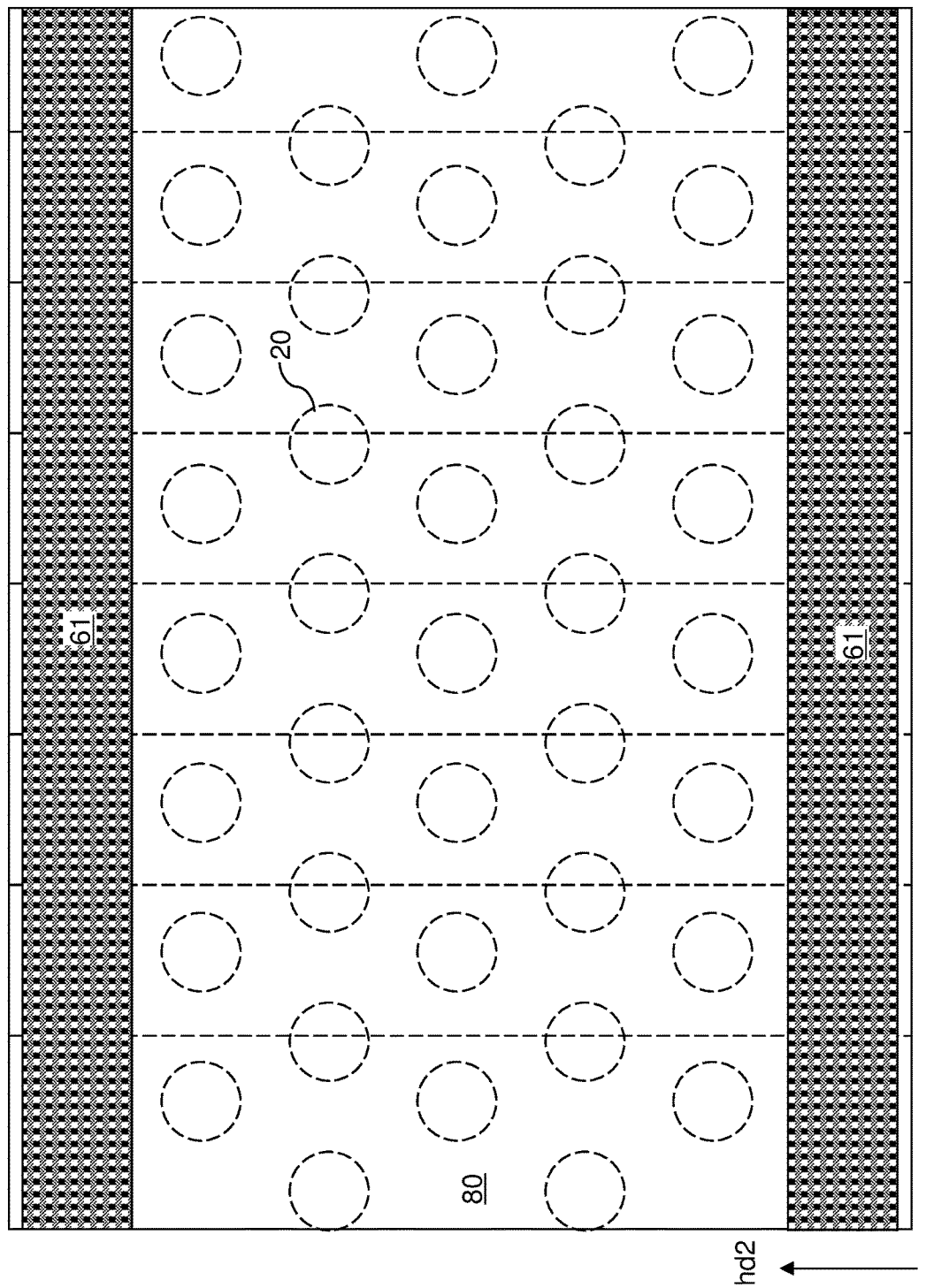
FIG. 13C is a top-down view of the contact region in the first exemplary structure of FIGS. 13A and 13B.

Referring to FIG. 13A-13C, a contact-level dielectric layer 80 can be formed over the alternating stack (32, 42) of insulating layer 32 and sacrificial material layers 42 and over the retro-stepped dielectric material portions (65, 165). The contact-level dielectric layer 80 includes a dielectric material that is different from the dielectric material of the sacrificial material layers 42. For example, the contact-level dielectric layer 80 can include silicon oxide. The contact-level dielectric layer 80 can have a thickness in a range from 50 nm to 500 nm, although lesser and greater thicknesses can also be employed.

A photoresist layer (not shown) can be applied over the contact-level dielectric layer 80, and is lithographically patterned to form openings in areas between clusters of memory opening fill structures 58. The pattern in the photoresist layer can be transferred through the contact-level dielectric layer 80, the alternating stack (32, 42) and/or the retro-stepped dielectric material portions (65, 165) employing an anisotropic etch to form backside trenches 79, which vertically extend from the top surface of the contact-level dielectric layer 80 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10.

Figure 14:
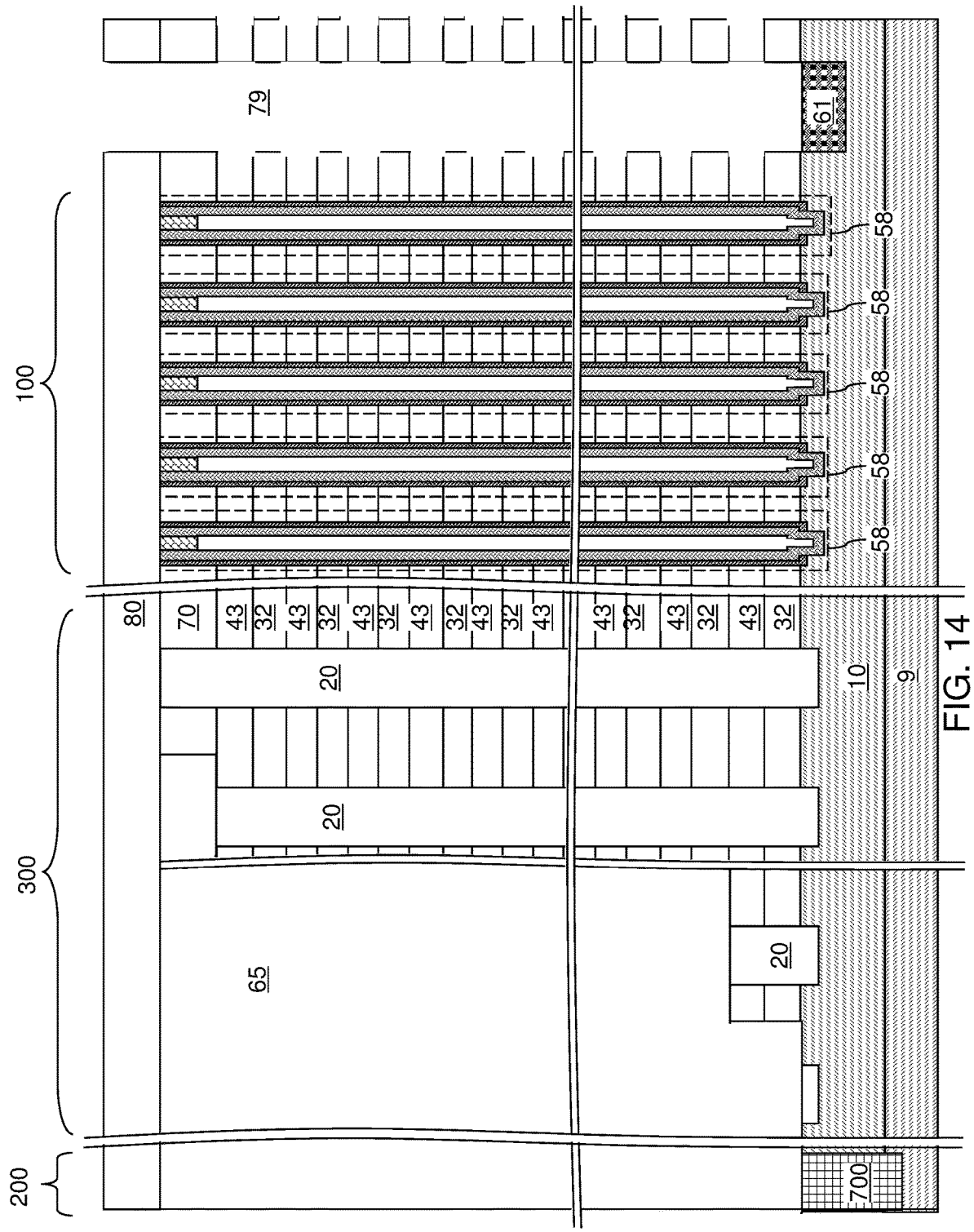
FIG. 14 is a schematic vertical cross-sectional view of the die region of the first exemplary structure after formation of backside recesses according to the first embodiment of the present disclosure.

Referring to FIG. 14, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portions (65, 165), the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portions (65, 165) can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portions (65, 165), and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of three-dimensional NAND strings having a plurality of device levels disposed above the substrate (9, 10). In this case, each backside recess 43 can define a space for receiving a respective word line of the array of three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 15:
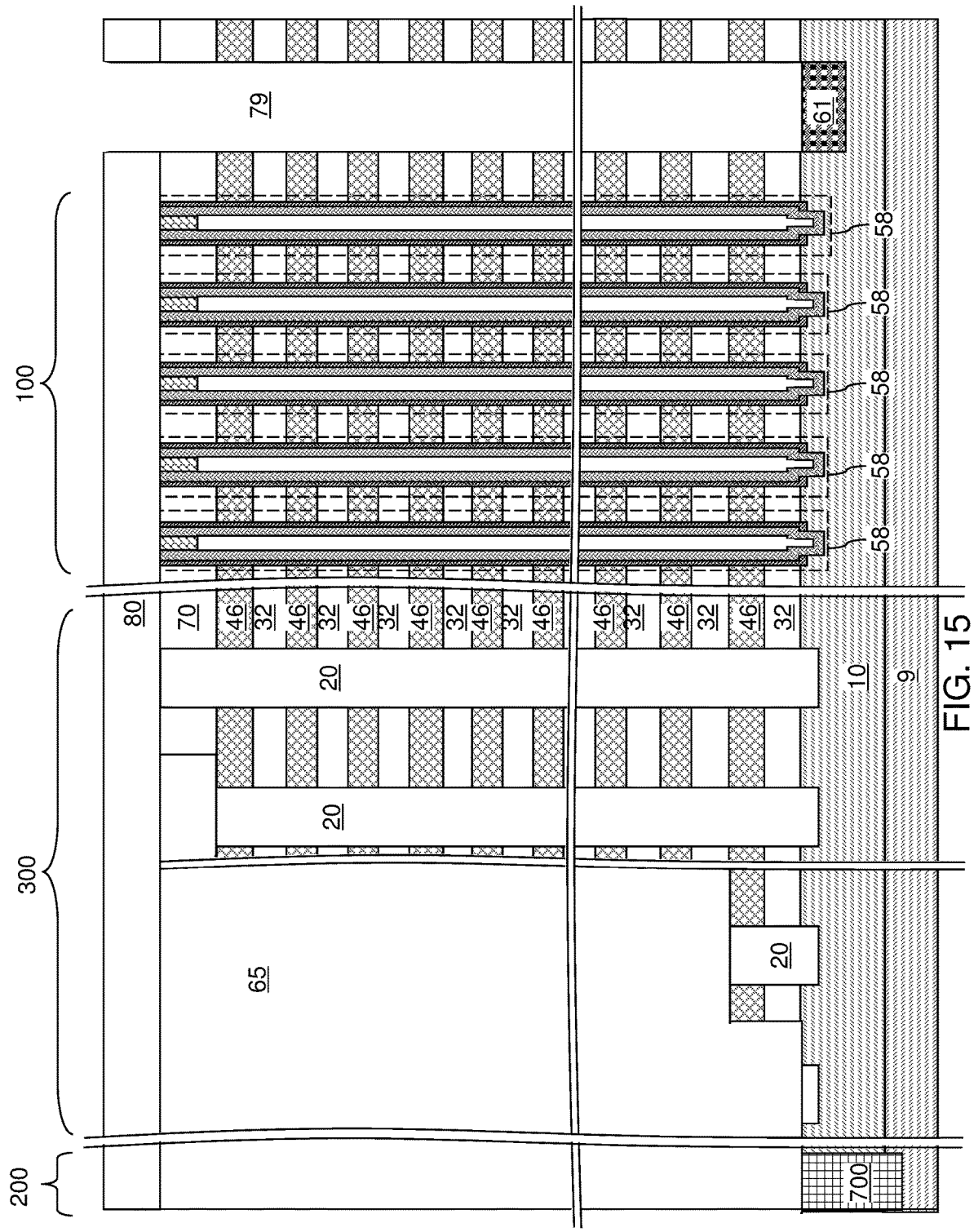
FIG. 15 is a schematic vertical cross-sectional view of the die region of the first exemplary structure after formation of electrically conductive layers according to the first embodiment of the present disclosure.

Referring to FIG. 15, an optional backside blocking dielectric layer (not shown) can be formed. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer can be formed in the backside recesses 43 and on a sidewall of the backside trench 79. The backside blocking dielectric layer can be formed directly on horizontal surfaces of the insulating layers 32 and sidewalls of the memory stack structures 55 within the backside recesses 43. In one embodiment, the backside blocking dielectric layer can be formed by a conformal deposition process such as atomic layer deposition (ALD). The backside blocking dielectric layer can consist essentially of aluminum oxide. The thickness of the backside blocking dielectric layer can be in a range from 1 nm to 15 nm, such as 2 to 6 nm, although lesser and greater thicknesses can also be employed.

At least one metallic material can be conformally deposited in the backside recesses 43. In one embodiment, the at least one metallic material may comprise a metallic barrier layer and a metallic fill material. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material is deposited in the plurality of backside recesses 43, on the sidewalls of the at least one the backside trench 79, and over the top surface of the contact-level dielectric layer 80 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer (not illustrated) can be formed on the sidewalls of each backside trench 79 and over the contact-level dielectric layer 80. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the contact-level dielectric layer 80.

Each sacrificial material layer 42 can be replaced with an electrically conductive layer 46. A backside cavity is present in the portion of each backside trench 79 that is not filled with the backside blocking dielectric layer and the continuous metallic material layer.

The deposited metallic material of the continuous electrically conductive material layer is etched back from the sidewalls of each backside trench 79 and from above the contact-level dielectric layer 80, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. One or more topmost and bottommost electrically conductive layers 46 may function as respective drain and source select gate electrodes.

In one embodiment, the removal of the continuous electrically conductive material layer can be selective to the material of the backside blocking dielectric layer. In this case, a horizontal portion of the backside blocking dielectric layer can be present at the bottom of each backside trench 79. In another embodiment, the removal of the continuous electrically conductive material layer may not be selective to the material of the backside blocking dielectric layer or, the backside blocking dielectric layer may not be employed. The planar dielectric portions can be removed during removal of the continuous electrically conductive material layer. A bottommost electrically conductive layer 46 provided upon formation of the electrically conductive layers 46 within the alternating stack (32, 46) can comprise a select gate electrode for the field effect transistors. A backside cavity is present within each backside trench 79.

Figure 16:
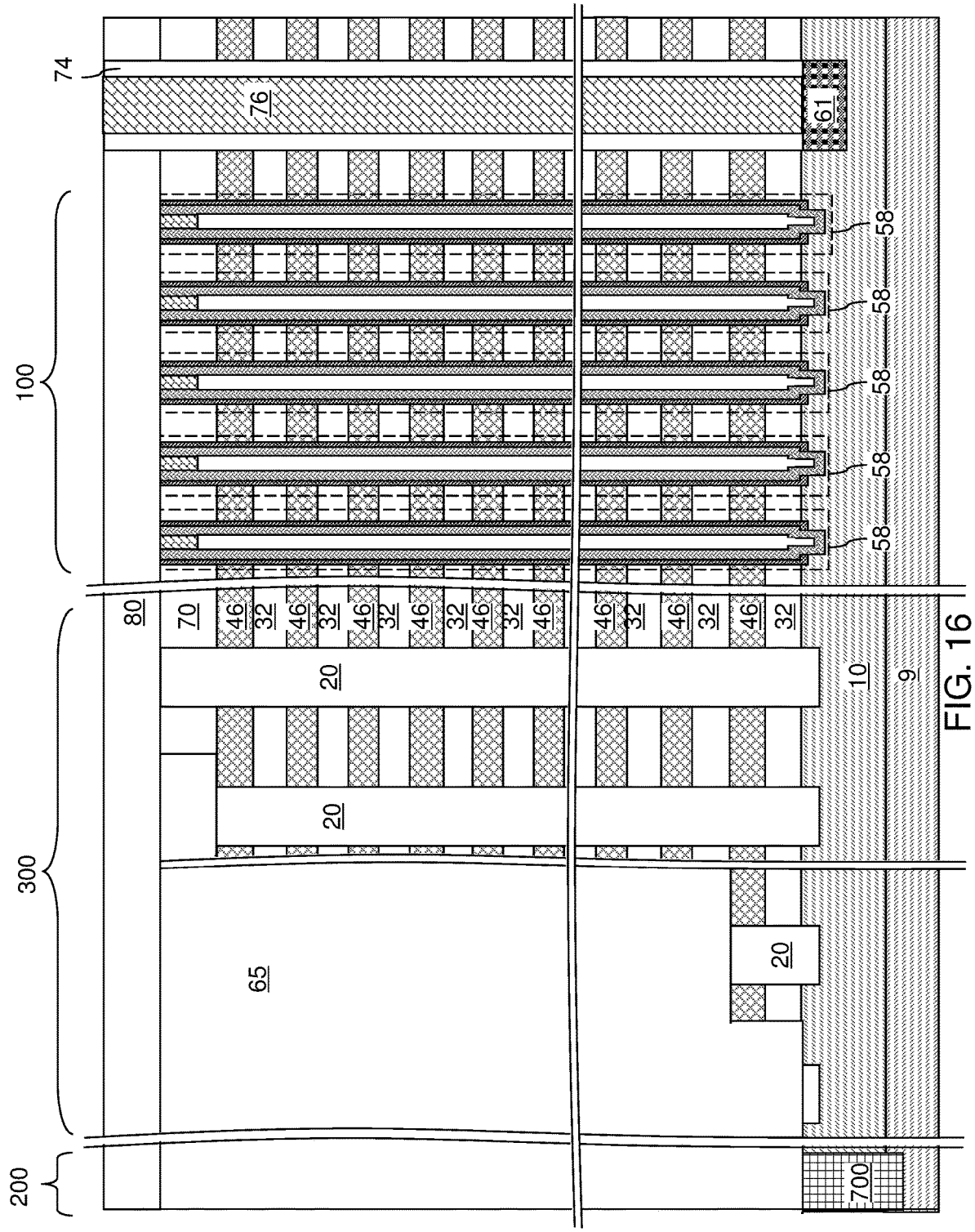
FIG. 16 is a schematic vertical cross-sectional view of the die region of the first exemplary structure after formation of an insulating spacer and a backside contact structure in each backside trench according to the first embodiment of the present disclosure.

Referring to FIG. 16, an insulating material layer can be formed in the backside trenches 79 and over the contact-level dielectric layer 80 by a conformal deposition process. First exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact-level dielectric layer 80 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner and a conductive fill material portion. The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact-level dielectric layer 80 overlying the alternating stack (32, 46) as a stopping layer. If chemical mechanical planarization (CMP) process is employed, the contact-level dielectric layer 80 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer is employed, the backside contact via structure 76 can contact a sidewall of the backside blocking dielectric layer.

Alternatively, the above-described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Figure 17A:
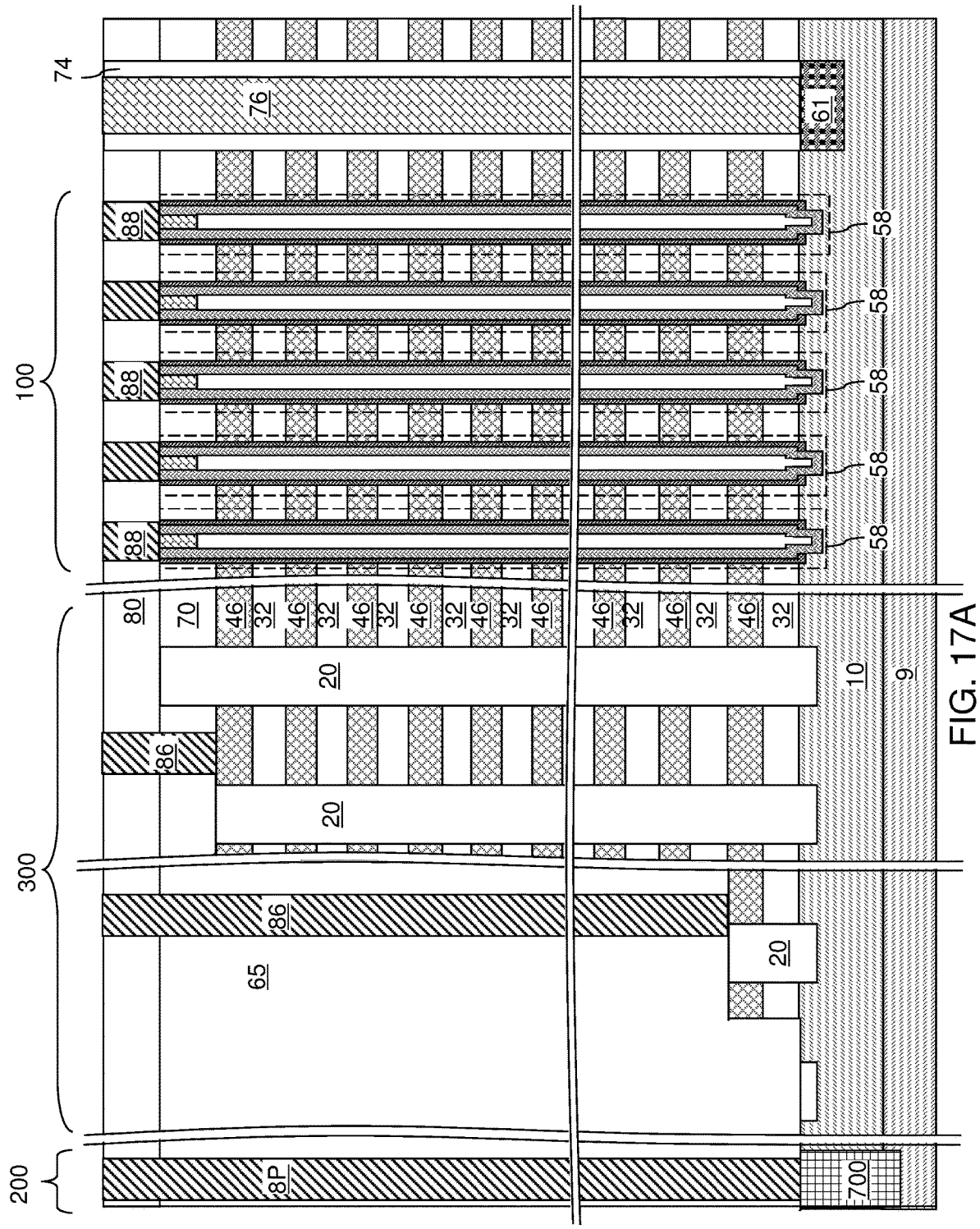
FIG. 17A is a schematic vertical cross-sectional view of the die region of the first exemplary structure after formation of additional contact via structures according to the first embodiment of the present disclosure.
Figure 17B:
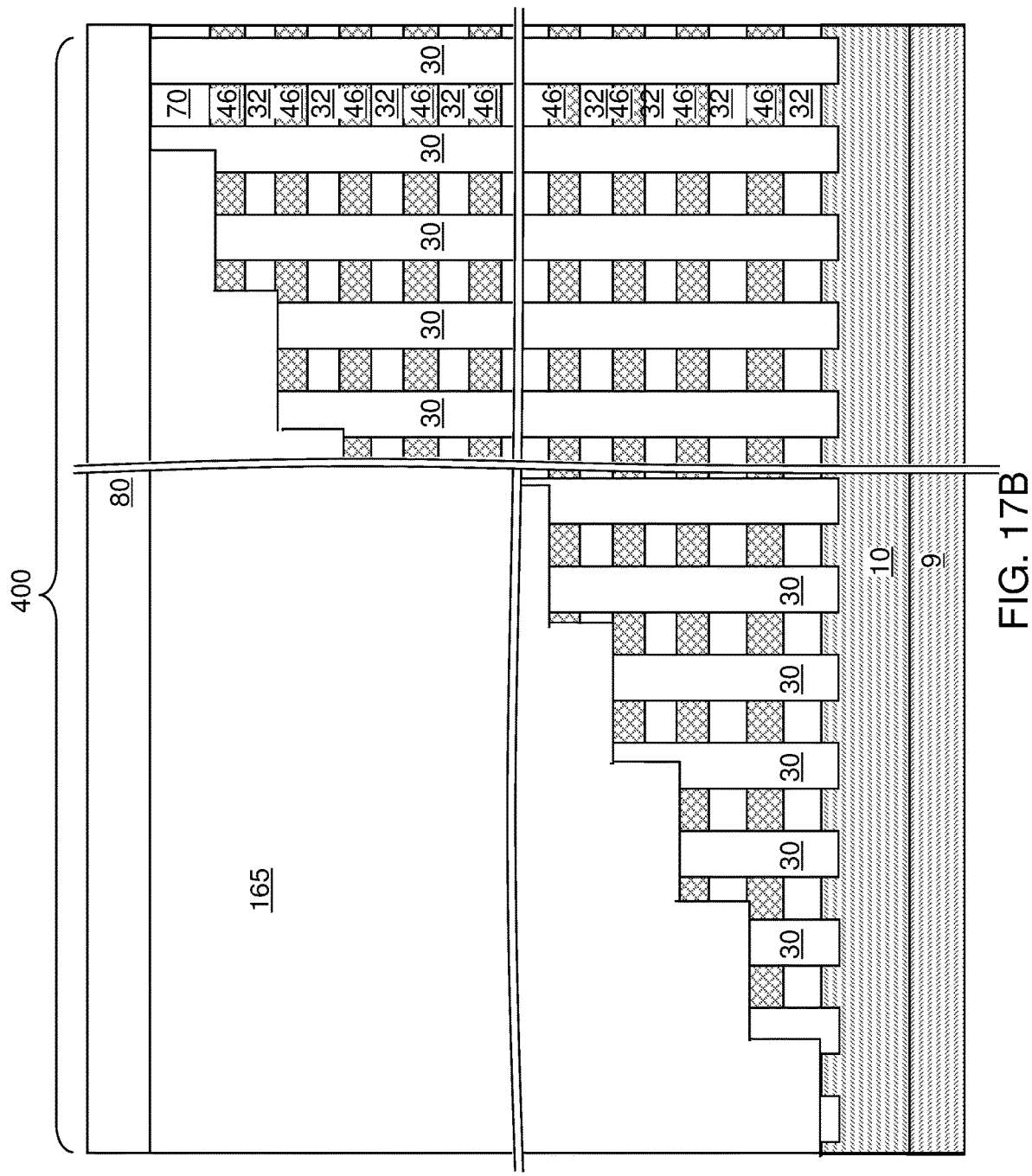
FIG. 17B is a schematic vertical cross-sectional view of the monitor region of the first exemplary structure after formation of additional contact via structures according to the first embodiment of the present disclosure.

Referring to FIGS. 17A and 17B, additional contact via structures (88, 86, 8P) can be formed through the contact-level dielectric layer 80, and optionally through the first retro-stepped dielectric material portions 65. For example, drain contact via structures 88 can be formed through the contact-level dielectric layer 80 on each drain region 63. Layer contact via structures 86 can be formed on the electrically conductive layers 46 through the contact-level dielectric layer 80, and through the retro-stepped dielectric material portions (65, 165). Peripheral device contact via structures 8P can be formed through the first retro-stepped dielectric material portions 65 directly on respective nodes of the peripheral devices. In one embodiment, the second retro-stepped dielectric material portion 165 does not include any opening therethrough after formation of the contact via structures (88, 86, 8P).

Figure 17C:
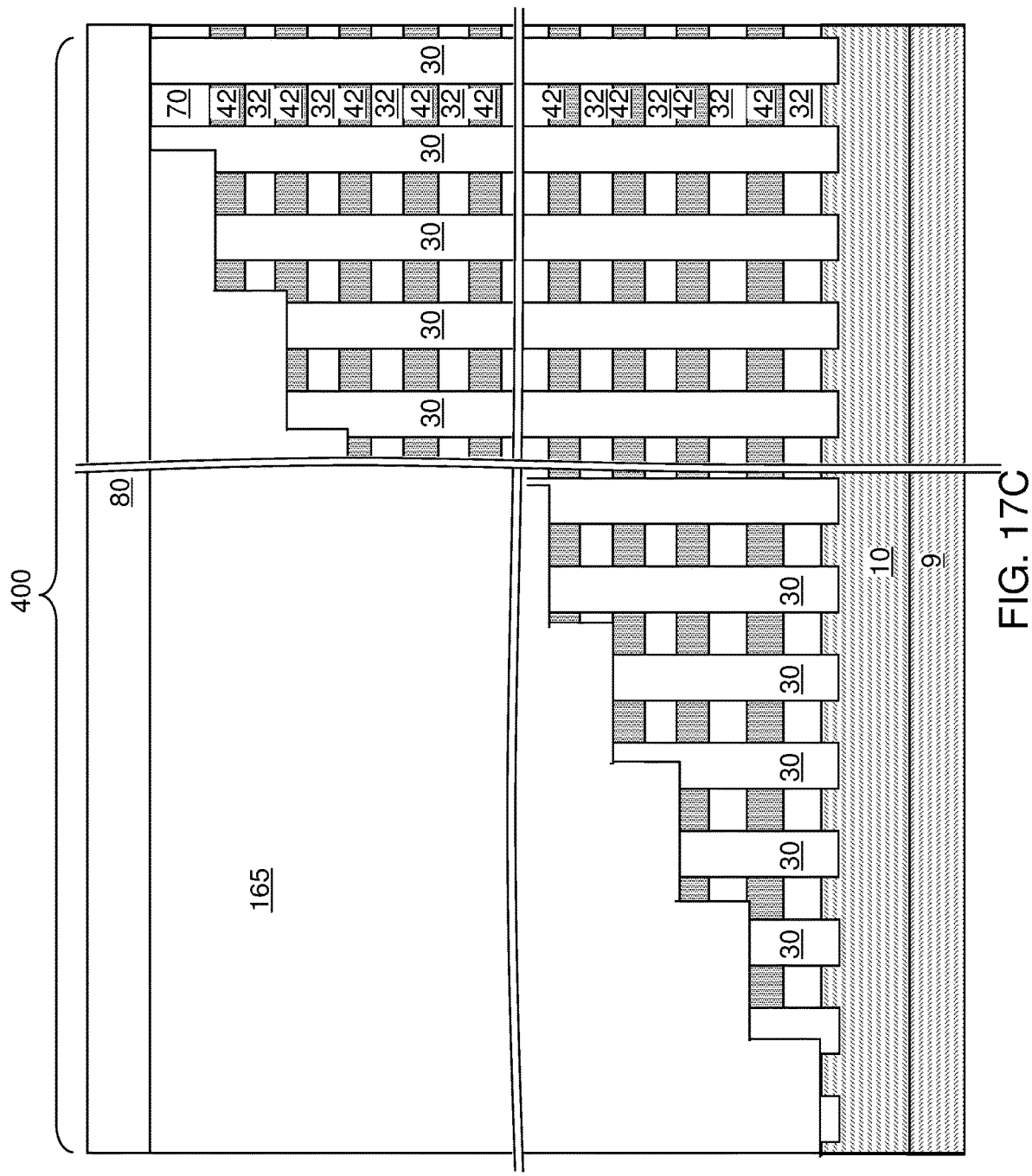
FIG. 17C is a schematic vertical cross-sectional view of the monitor region of an alternative embodiment of the first exemplary structure after formation of additional contact via structures according to the first embodiment of the present disclosure.

Referring to FIG. 17C, a monitor region 400 of an alternative embodiment of the first exemplary structure is illustrated after formation of additional contact via structures (88, 86, 8P). In the alternative embodiment of the first exemplary structure, the sacrificial material layers 42 are not replaced with electrically conductive layers 46 in the monitor region 400. This modification can be provided, for example, by not forming backside trenches 79 in or around the monitor region 400.

Figure 18A:
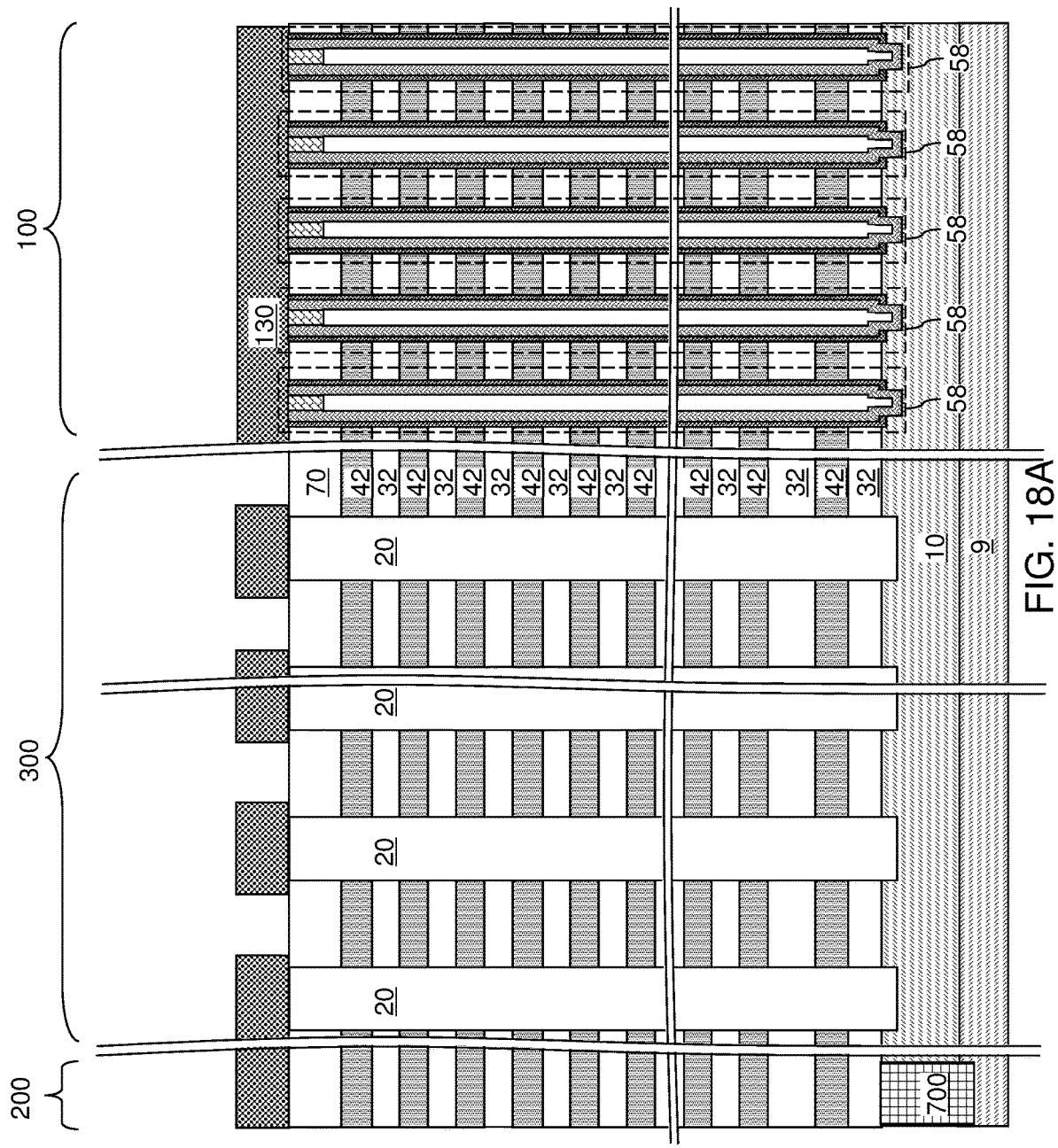
FIG. 18A is a vertical cross-sectional view of the die region of a second exemplary structure after formation of a patterned hard mask layer according to a second embodiment of the present disclosure.
Figure 18B:
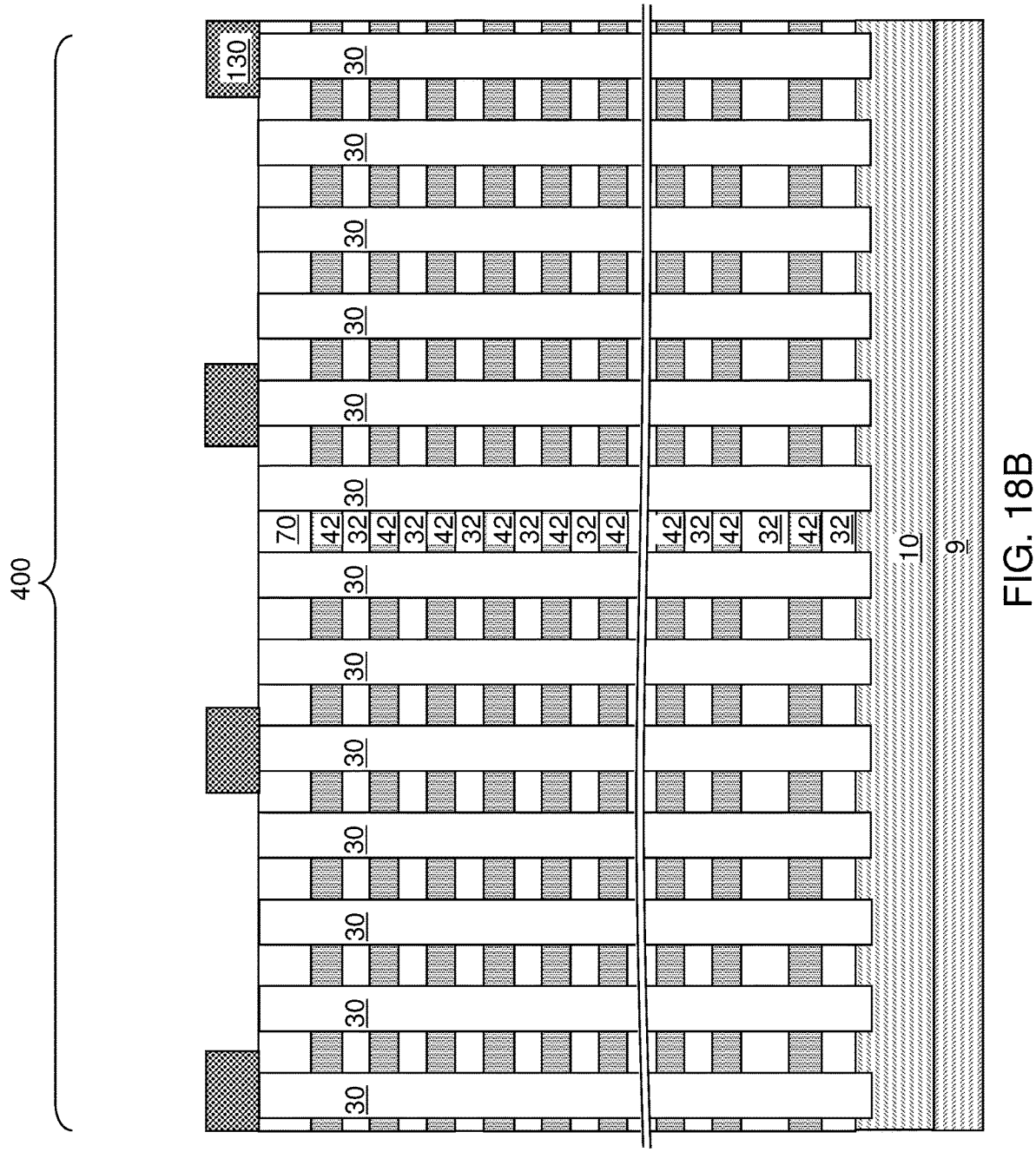
FIG. 18B is a vertical cross-sectional view of the monitor region of the second exemplary structure at the processing steps of FIG. 18A.

Referring to FIGS. 18A and 18B, a second exemplary structure according to a second embodiment of the present disclosure can be derived from the first exemplary structure illustrated in FIGS. 9A and 9B by forming a patterned hard mask layer 130 over the alternating stack (32, 42). The patterned hard mask layer 130 comprises a hard mask material such as a dielectric metal oxide and/or a metallic material. The patterned hard mask layer 130 can be formed, for example, by deposition of a hard mask material layer, application and lithographic patterning of a photoresist layer over the hard mask material layer, and by an anisotropic etch process that transfers a pattern of openings in the photoresist layer through the hard mask material layer, which becomes the patterned hard mask layer 130 upon formation of openings therethrough. The photoresist layer can be subsequently removed, for example, by ashing.

The patterned hard mask layer 130 comprises first openings in each contact region 300 and comprises second openings in the monitor region 400. The first openings can be formed outside the areas of the support pillar structures 20, and the second openings can be formed such that each area of a second openings includes the area of at least one monitor opening fill structure 29.

Figure 19A:
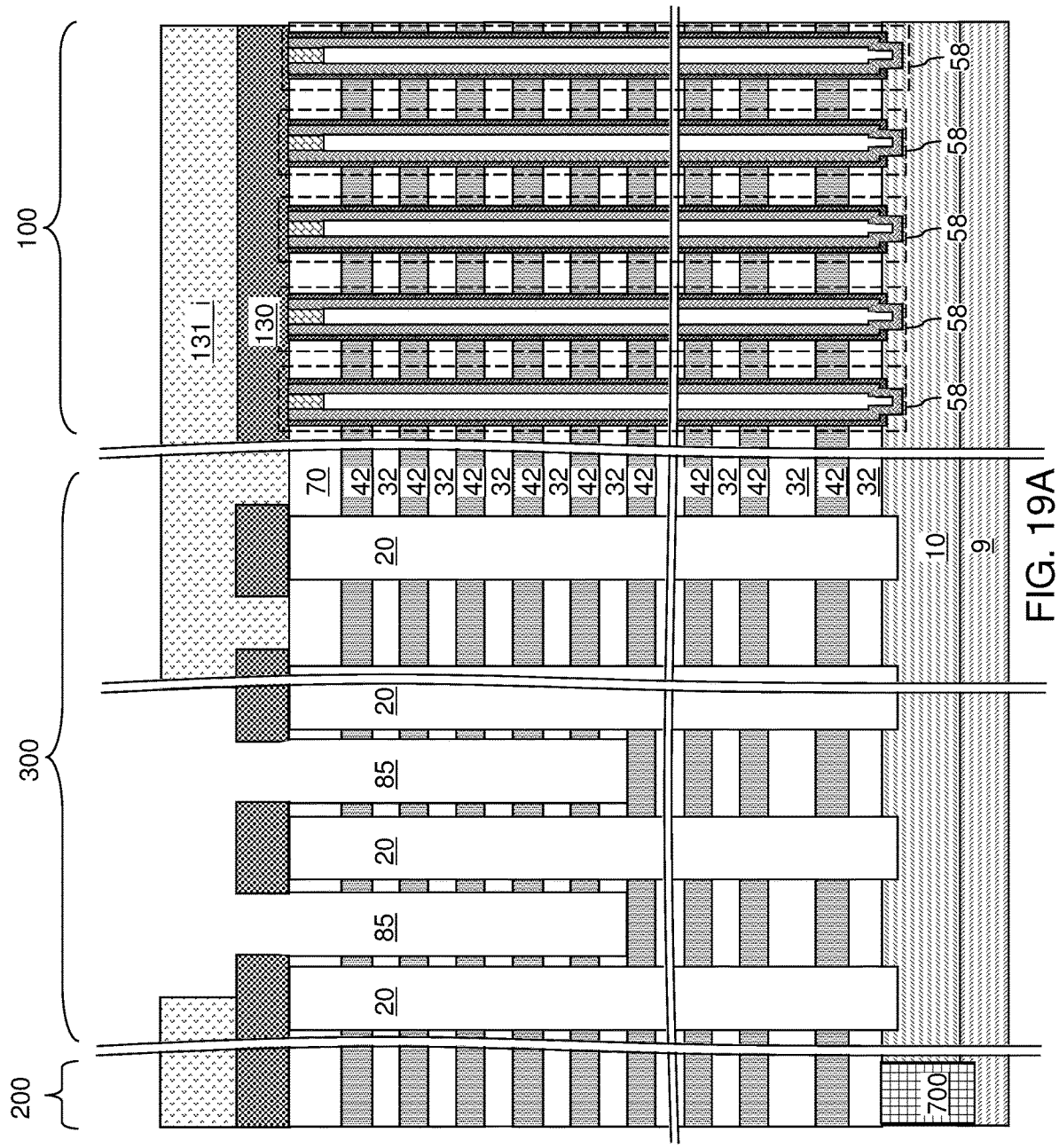
FIG. 19A is a vertical cross-sectional view of the die region of the second exemplary structure during formation of contact via cavities and monitor via cavities according to the second embodiment of the present disclosure.
Figure 19B:
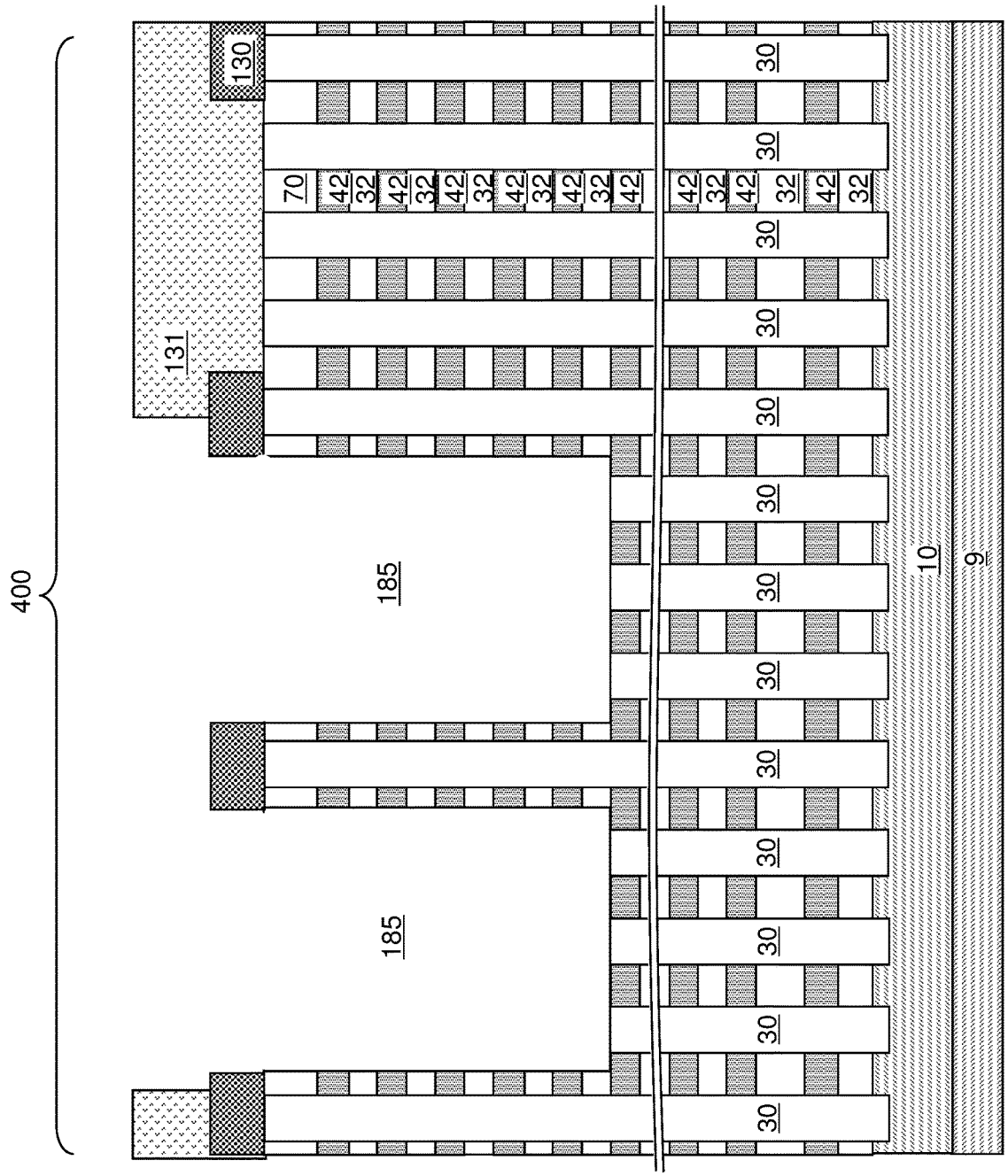
FIG. 19B is a vertical cross-sectional view of the monitor region of the second exemplary structure at the processing steps of FIG. 19A.

Referring to FIGS. 19A and 19B, contact via cavities 85 can be formed in the contact region 300 by recessing the first portions of the alternating stack (32, 42) such that bottom surfaces of the contact via cavities 85 comprise first horizontal surfaces of the spacer material layers (such as the sacrificial material layers 42), and monitor via cavities 185 can be formed in the monitor region 400 by recessing the second portions of the alternating stack (32, 42) such that bottom surface of the monitor via cavities 185 comprise recessed surfaces of the monitor opening fill structures 30.

In one embodiment, a series of masked anisotropic etch processes performed to vertically transfer the pattern of a respective subset of the openings in the patterned hard mask layer 130 through a respective subset of the layers within the alternating stack (32, 42). Each of the masked anisotropic etch processes employs a different photoresist mask 131_i that covers a respective subset of the first openings and the second openings and etches a respective number of pairs of an insulating layer 32 and a sacrificial material layer 42. The respective number can be different among the series of masked anisotropic etch processes.

In an illustrative example, N different photoresist layers 131_i (0<i<(N+1)) can be employed in conjunction with N anisotropic etch processes. For each positive integer i beginning with 1 and ending with N, the i-th anisotropic etch process can etch through $2^{(N-1)}$ pairs of an insulating layer 32 and a sacrificial material layer 42 employing an i-th patterned photoresist mask 131_i. Each patterned photoresist mask 131_i may be removed, for example, by ashing after a respective anisotropic etch process. Each etched volume of the alternating stack (32, 42) underneath the first openings constitutes a contact via cavity 85. Each etched volume of the alternating stack (32, 42) and the monitor opening fill structures 30 constitutes a monitor via cavity 185. Up to $2^N$ combinations of masking or unmasking can be provided by the N patterned photoresist masks 131_i. Consequently, the contact via cavities 85 and the up to $2^N$ different depths. By selecting the number N such that $2^N$ is greater than the total number of the sacrificial material layers 42 in the alternating stack (32, 42), contact via cavities 85 and monitor via cavities 185 can extend to top surfaces of each of the sacrificial material layers 42.

In one embodiment, the support pillar structures 20 are collaterally recessed during the recessing of the portions of the alternating stack (32, 42) in the contact region 300. In one embodiment, each of the top surfaces of the support pillar structures 20 is adjoined to and is coplanar with a respective one of the first horizontal surfaces of the spacer material layers (such as the sacrificial material layers 42).

Referring to FIGS. 20A and 20B, the second exemplary structure is illustrated after performing the last (e.g., the N-th) patterned anisotropic etch process and after removing the last (e.g., the N-th) patterned photoresist layer (that is employed as the last etch mask). Contact via cavities 85 are present in the contact region 300, and monitor via cavities 185 are present in the monitor region 400. The contact via cavities 85 and monitor via cavities 185 may have the same or different diameters.

According to an aspect of the present disclosure, characteristics of the recessed surfaces of the monitor opening fill structures 30 can be measured employing a scanning electron microscope and/or an optical image measurement tool, such as an optical microscope, camera and/or photodetector. The measured characteristic of the recessed surfaces of the monitor opening fill structures 30 may comprise geometrical characteristics of the recessed top surfaces of the monitor opening fill structures 30 such as shapes, sizes, and various parameters that can be derived therefrom. In one embodiment, the measured characteristic of the recessed surfaces of the monitor opening fill structures 30 may comprise changes in areas of the recessed surfaces of the monitor opening fill structures 30 as a function of a vertical distance between the substrate 9 and the recessed surfaces of the monitor opening fill structures 30. In one embodiment, the characteristics of the recessed surfaces of the monitor opening fill structures 30 comprise changes in an average lateral dimension of the recessed surfaces of the monitor opening fill structures 30 as a function of a vertical distance between the substrate 9 and the recessed surfaces of the monitor opening fill structures 30. In one embodiment, the characteristics of the recessed surfaces of the monitor opening fill structures 30 comprise changes in ellipticity of the recessed surfaces of the monitor opening fill structures 30 as a function of a vertical distance between the substrate and the recessed surfaces of the monitor opening fill structures 30. The ellipticity of a two-dimensional closed shape refers to the ellipticity of an ellipse that provides a least root-mean-square error during fitting the two-dimensional closed shape with ellipses.

Generally, the shapes of the monitor openings 29 as formed at the processing steps of FIGS. 4A-4E are the same as the shapes of the memory openings 49 as formed at the processing steps of FIGS. 4A-4E. Thus, the horizontal cross-sectional profiles of the monitor openings 29 and the monitor opening fill structures 30 can be statistically the same as the horizontal cross-sectional profiles of the memory openings 49 filled with the memory opening fill structures 58. Therefore, by performing an in-line measurement of recessed top surfaces of the monitor opening fill structures generates images that are the same as images of horizontal cross-sectional views of the monitor opening fill structures 30 at different levels as the height of the second stepped surfaces change from one side of the captured image to the other side of the captured image. The image capture may be performed employing the optical measurement tool or the scanning electron microscope. The images of the physically exposed recessed top surfaces of the monitor opening fill structures 30 can be measured underneath the monitor via cavities 185. Multiple images of the monitor opening fill structures 30 as the focus of the image measurement tool changes from the top surface of the substrate (9, 10) toward the top surface of the insulating cap layer 70, or vice versa.

Figure 21A:
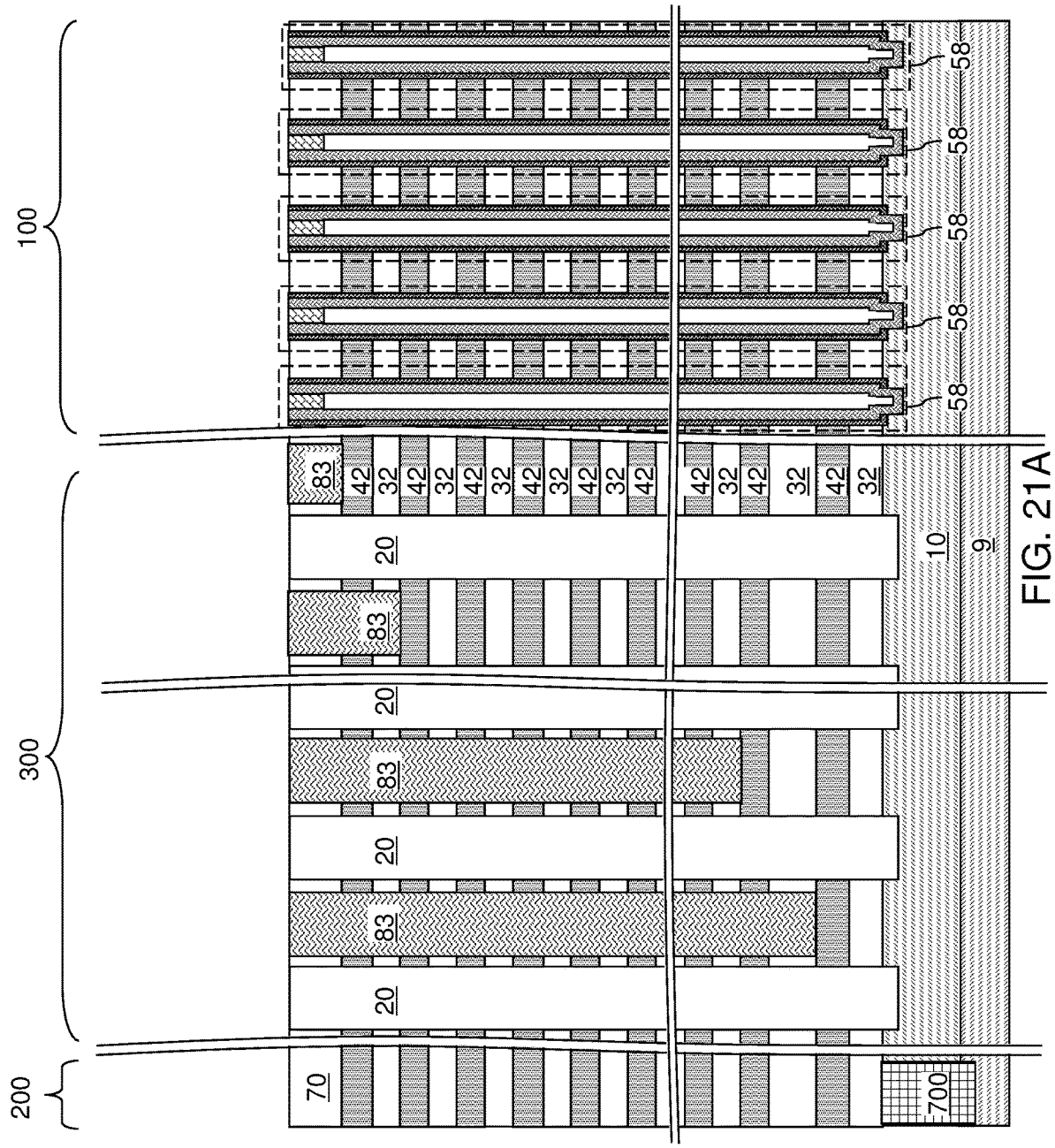
FIG. 21A is a vertical cross-sectional view of the die region of the second exemplary structure after formation of sacrificial contact via fill structures and sacrificial monitor via fill structures according to the second embodiment of the present disclosure.
Figure 21B:
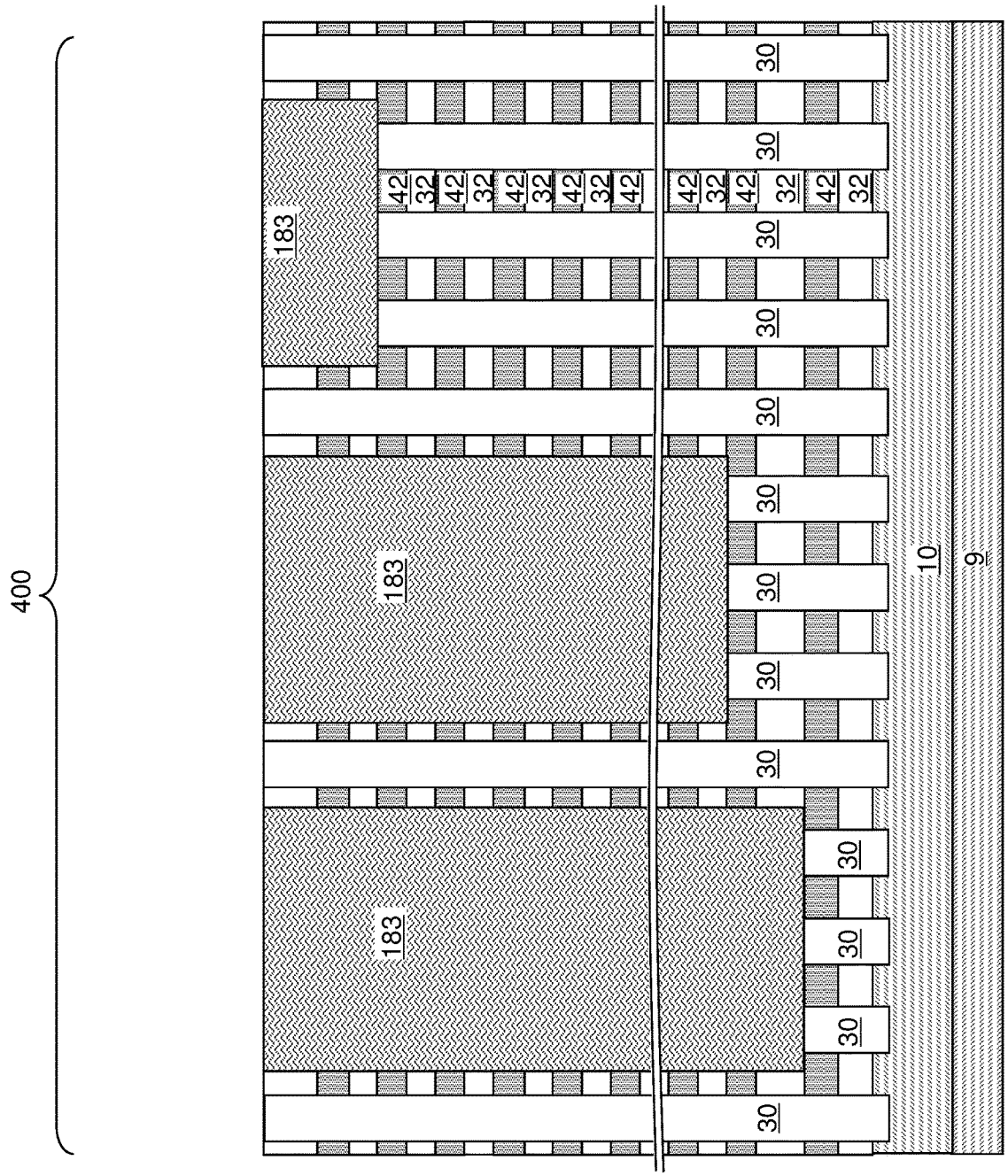
FIG. 21B is a vertical cross-sectional view of the monitor region of the second exemplary structure at the processing steps of FIG. 21A.

Referring to FIGS. 21A and 21B, a sacrificial fill material can be deposited in the contact via cavities 85 and the monitor via cavities 185. The sacrificial fill material may comprise an optional insulating liner, such as a silicon oxide liner, and a fill material, such as a carbon-based fill material (such as amorphous carbon or diamond-like carbon), a semiconductor fill material (such as amorphous silicon or a silicon-germanium alloy), an organosilicate glass fill material, or a polymer fill material. Excess portions of the sacrificial fill material can be removed from above the horizontal plane including the top surface of the insulating cap layer 70. Each remaining portion of the sacrificial fill material that fills a contact via cavity 85 constitutes sacrificial contact via fill structures 83. Each remaining portion of the sacrificial fill material that fills a monitor via cavity 185 constitutes monitor via cavity fill structures 183.

Figure 22A:
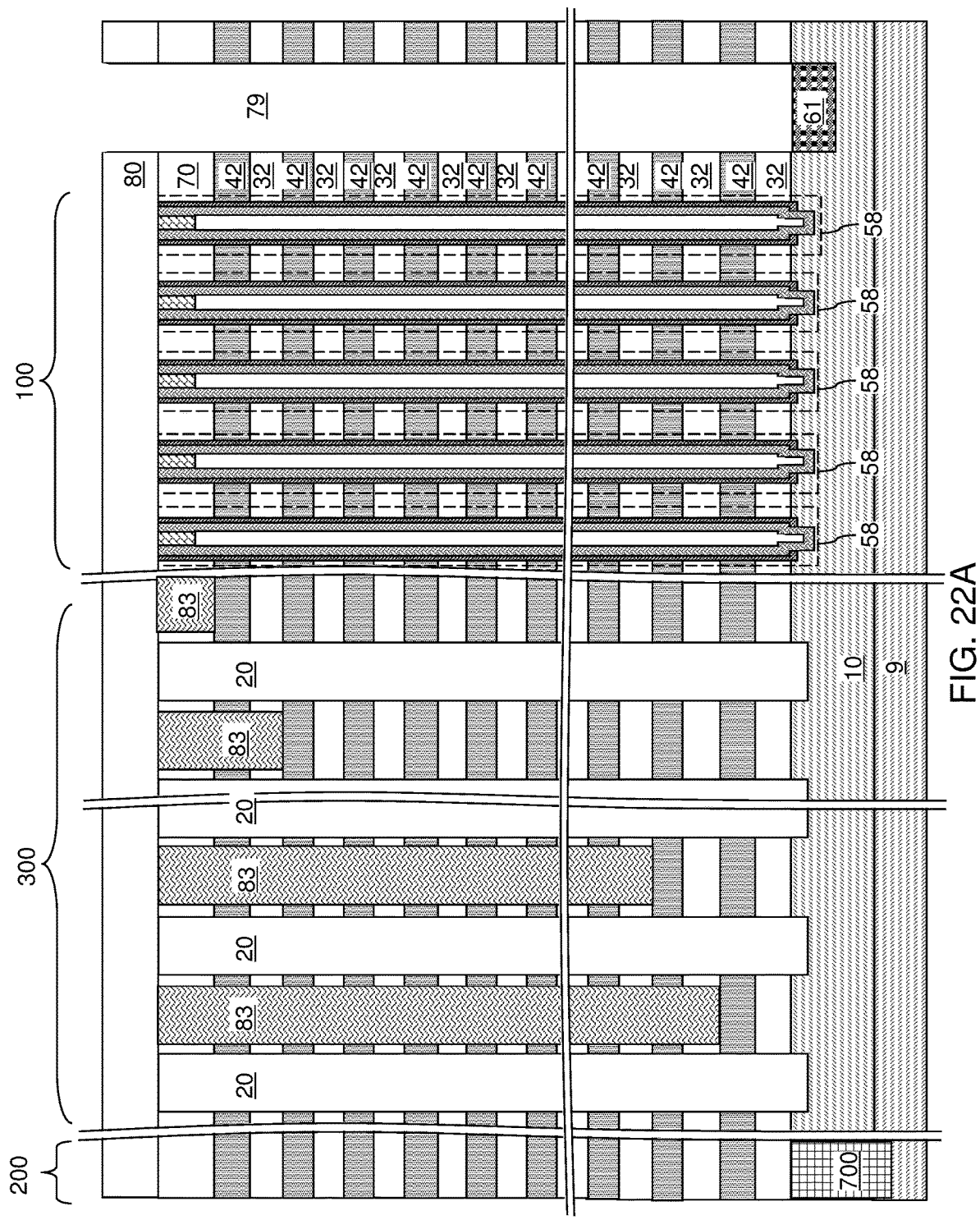
FIG. 22A is a vertical cross-sectional view of the die region of the second exemplary structure during formation of a contact-level dielectric layer and backside trenches according to the second embodiment of the present disclosure.
Figure 22B:
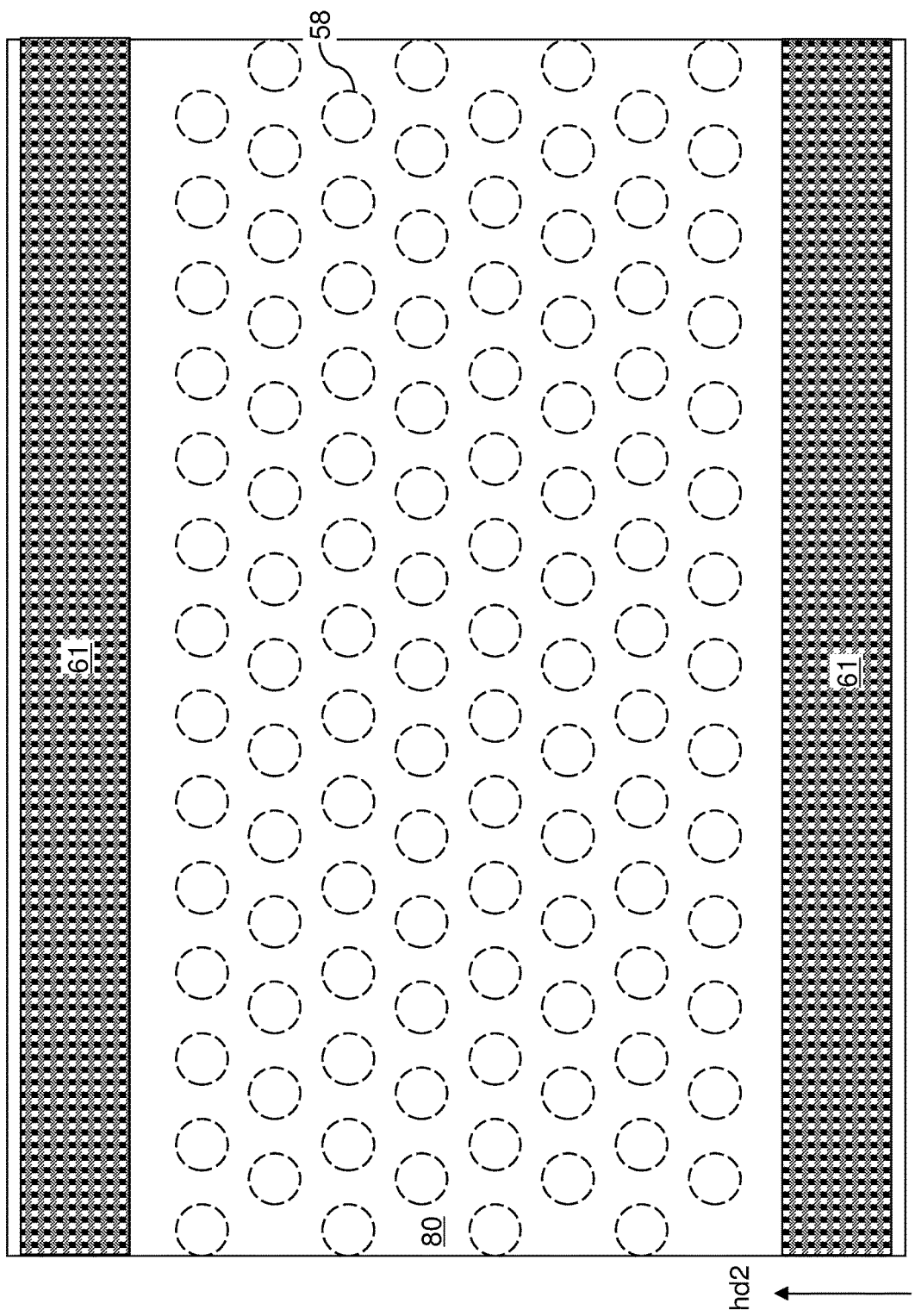
FIG. 22B is a top-down view of the memory array region in the second exemplary structure of FIG. 22A.
Figure 22C:
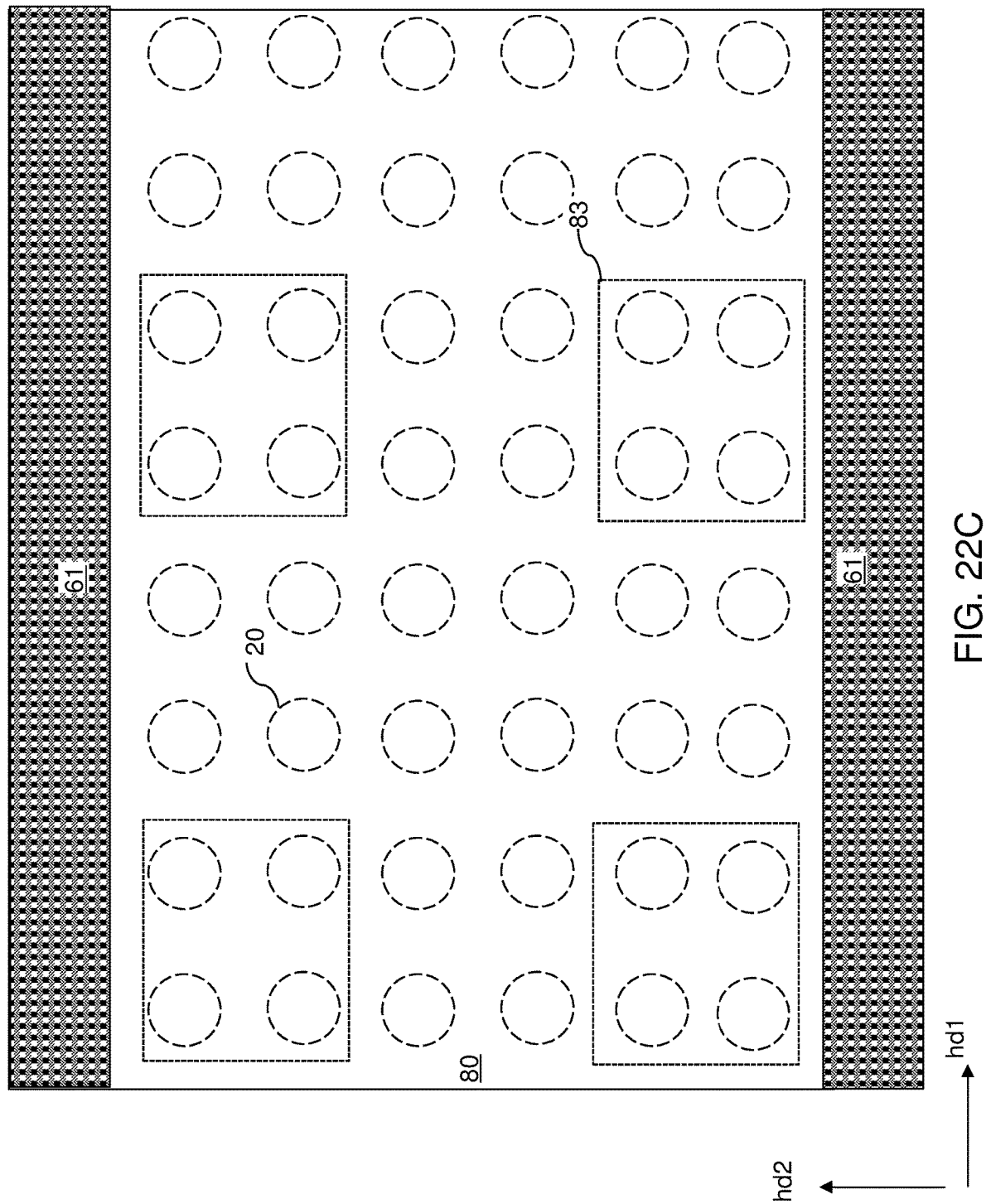
FIG. 22C is a top-down view of the contact region in the second exemplary structure of FIGS. 22A and 22B.

Referring to FIGS. 22A-22C, the processing steps described with reference to FIGS. 13A-13C can be performed to form a contact-level dielectric layer 80 and backside trenches 79.

Figure 23:
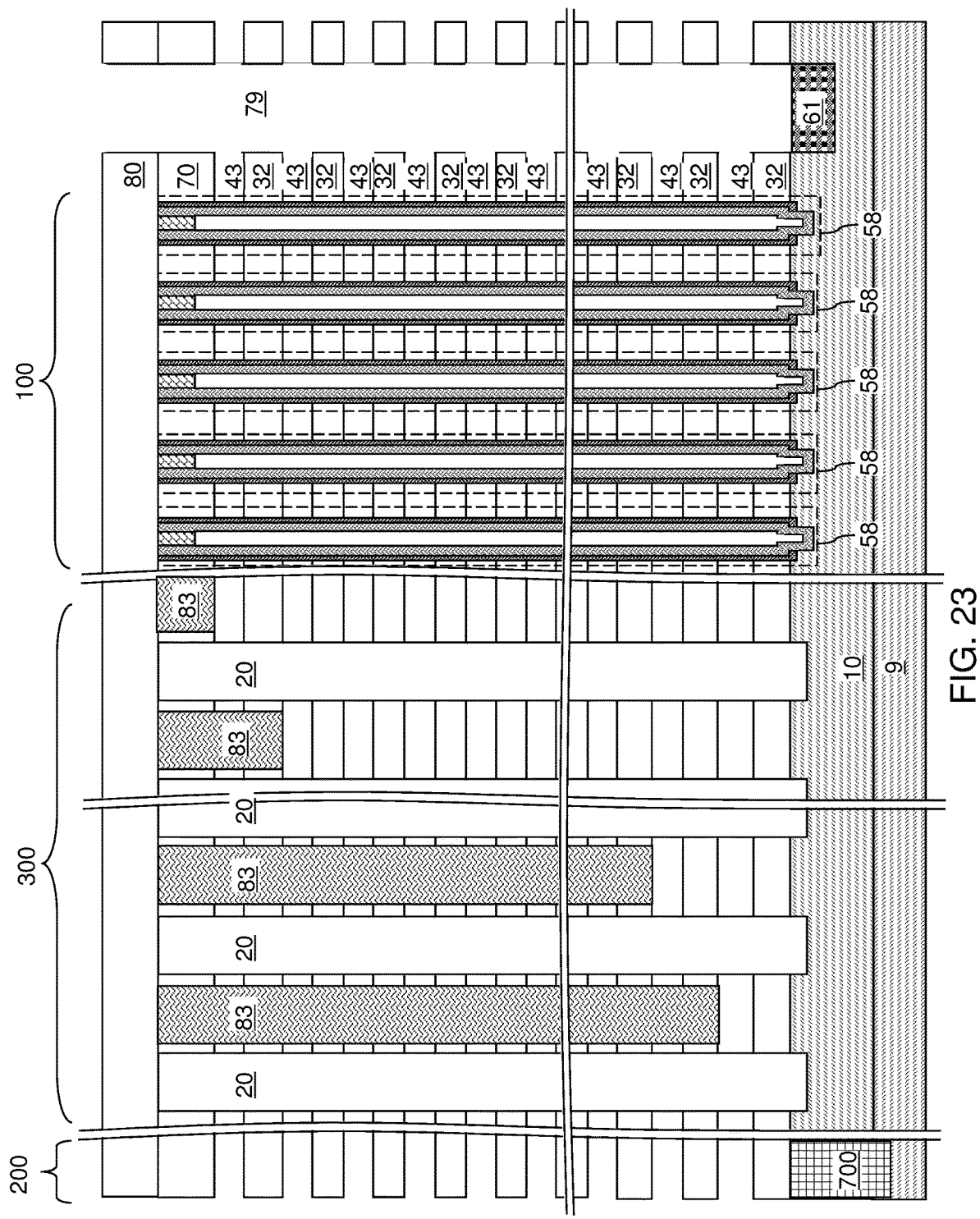
FIG. 23 is a schematic vertical cross-sectional view of the die region of the second exemplary structure after formation of backside recesses according to the second embodiment of the present disclosure.

Referring to FIG. 23, the processing steps described with reference to FIG. 14 can be performed to form backside recesses 43.

Figure 24:
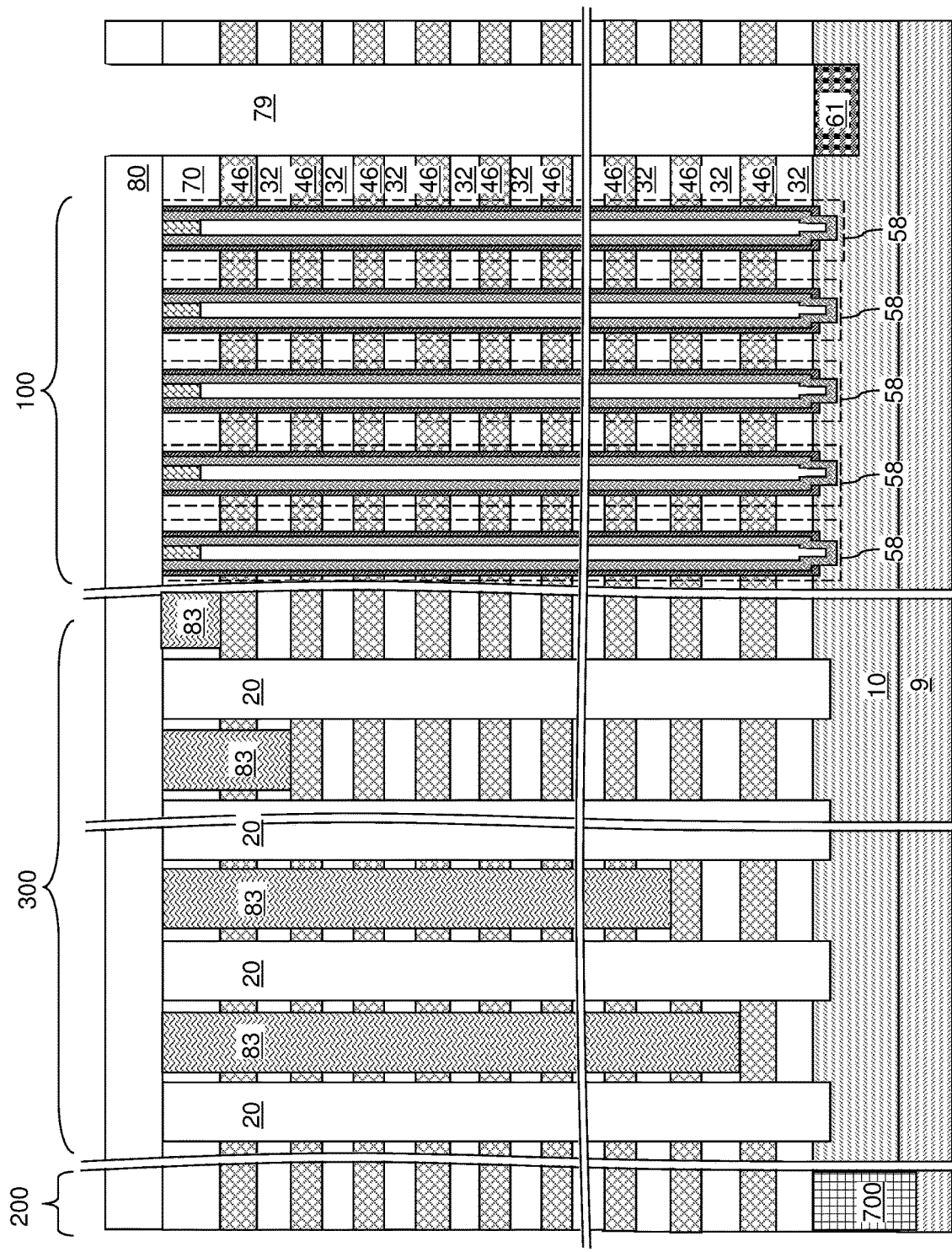
FIG. 24 is a schematic vertical cross-sectional view of the die region of the second exemplary structure after formation of electrically conductive layers according to the second embodiment of the present disclosure.

Referring to FIG. 24, the processing steps described with reference to FIG. 15 can be performed to form electrically conductive layers 46 in the backside recesses 43.

Figure 25:
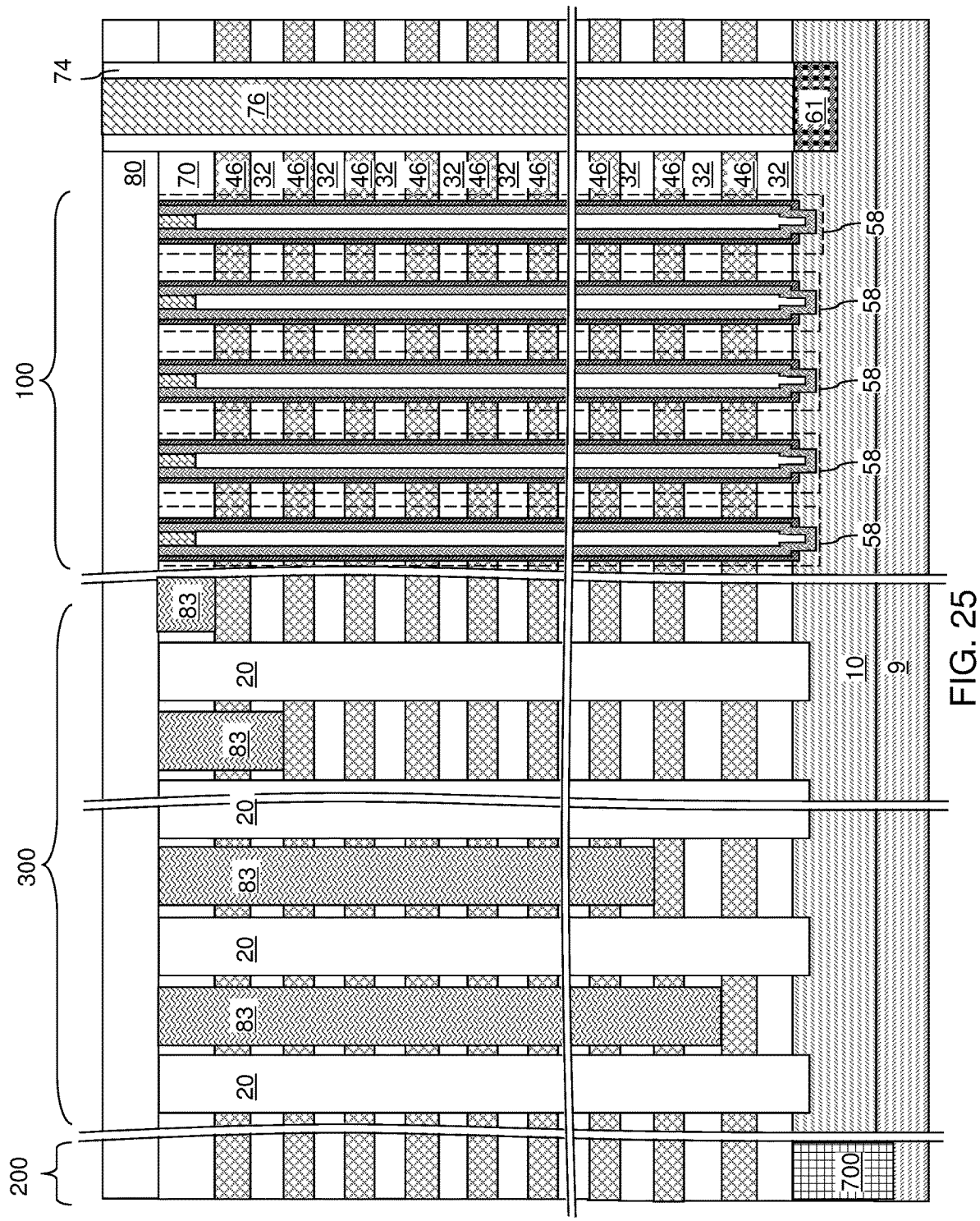
FIG. 25 is a schematic vertical cross-sectional view of the die region of the second exemplary structure after formation of an insulating spacer and a backside contact structure in each backside trench according to the second embodiment of the present disclosure.

Referring to FIG. 25, the processing steps described with reference to FIG. 16 can be performed to form an insulating spacer 74 and a backside contact structure 76 in each backside trench 79.

Figure 26A:
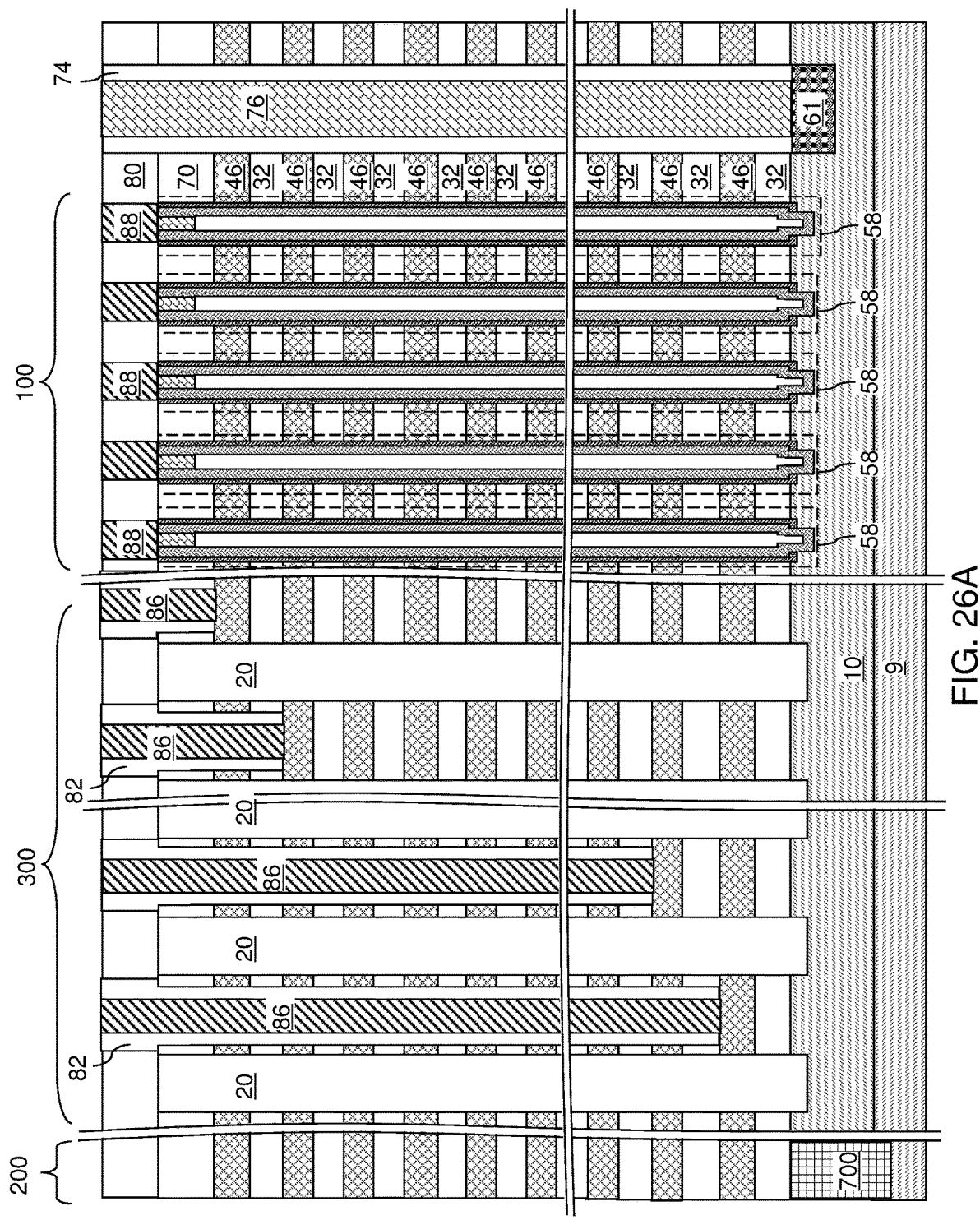
FIG. 26A is a schematic vertical cross-sectional view of the die region of the second exemplary structure after formation of additional contact via structures according to the second embodiment of the present disclosure.
Figure 26B:
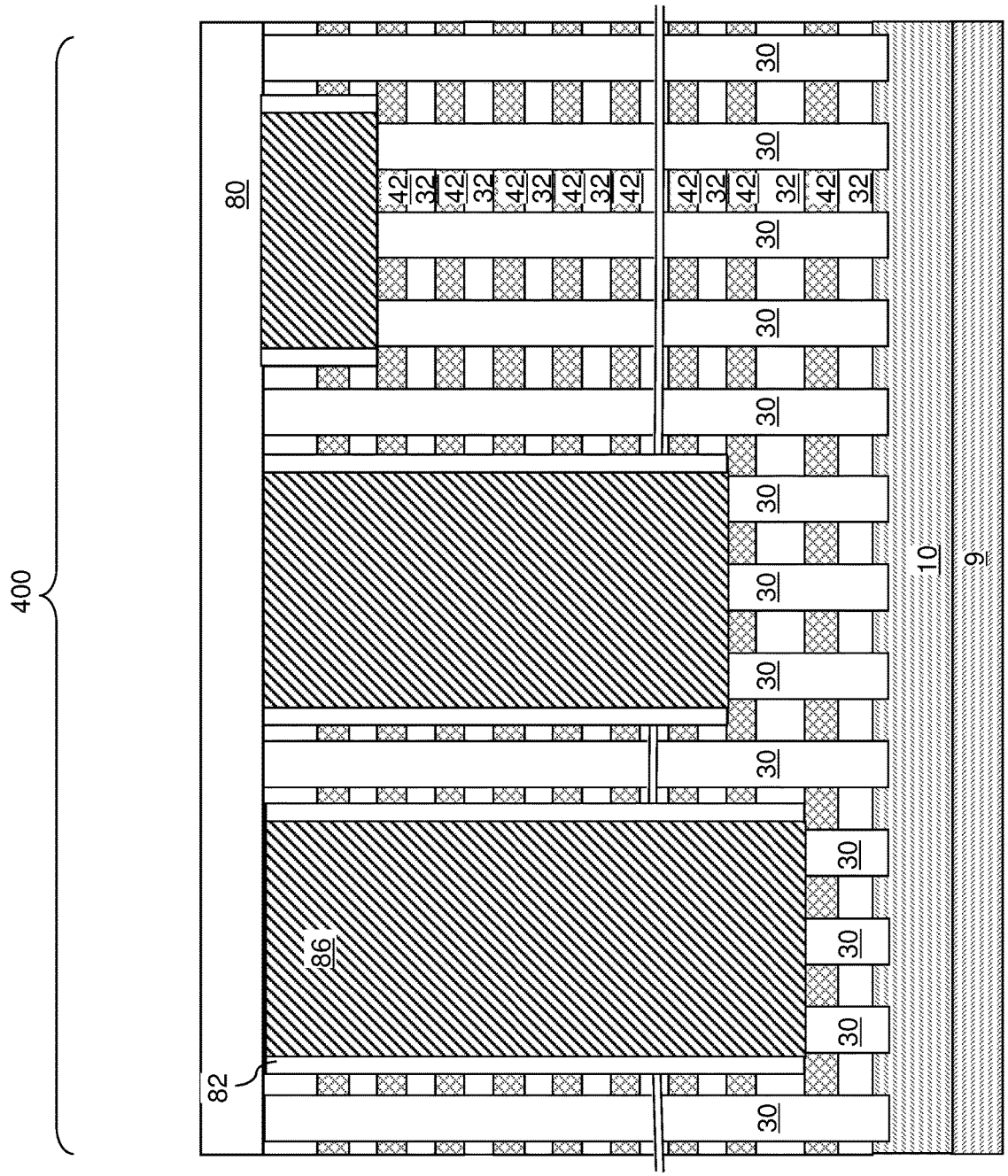
FIG. 26B is a schematic vertical cross-sectional view of the monitor region of the second exemplary structure after formation of additional contact via structures according to the second embodiment of the present disclosure.

Referring to FIGS. 26A and 26B, openings can be formed through the contact-level dielectric layer 80 above each of the sacrificial contact via cavity fill structures 83. Alternatively, the contact-level dielectric layer 80 is removed and a new contact-level dielectric layer 80 is reformed prior to openings being formed. Subsequently, at least portions of the sacrificial contact via cavity fill structures 83 can be removed selective to the alternating stack of insulating layers 32 and electrically conductive layers 46. For example, if the insulating liner is present in the sacrificial contact via cavity fill structures 83, then the fill material (e.g., carbon or amorphous silicon fill material) may be removed selective to the insulating liner. The insulating liner is then anisotropically etched using a sidewall spacer etch process to form insulating via spacers 82 at the periphery of each of the cavities (85, 185). Drain contact via cavities can be formed through the contact-level dielectric layer 80 over the drain regions 63. Additional via cavities may be formed as needed.

At least one conductive material, such as at least one metallic material, can be deposited within volumes of the cavities (85, 185) laterally surrounded by the insulating via spacers 82, in the drain contact via cavities, and any additional via cavities to form various contact via structures. A layer contact via structure 86 can be formed within each volume that is laterally surrounded by an insulating via spacer 82. A drain contact via structure 88 can be formed within each drain contact via cavity. Additional contact via structures (not shown) may be formed as needed.

Figure 26C:
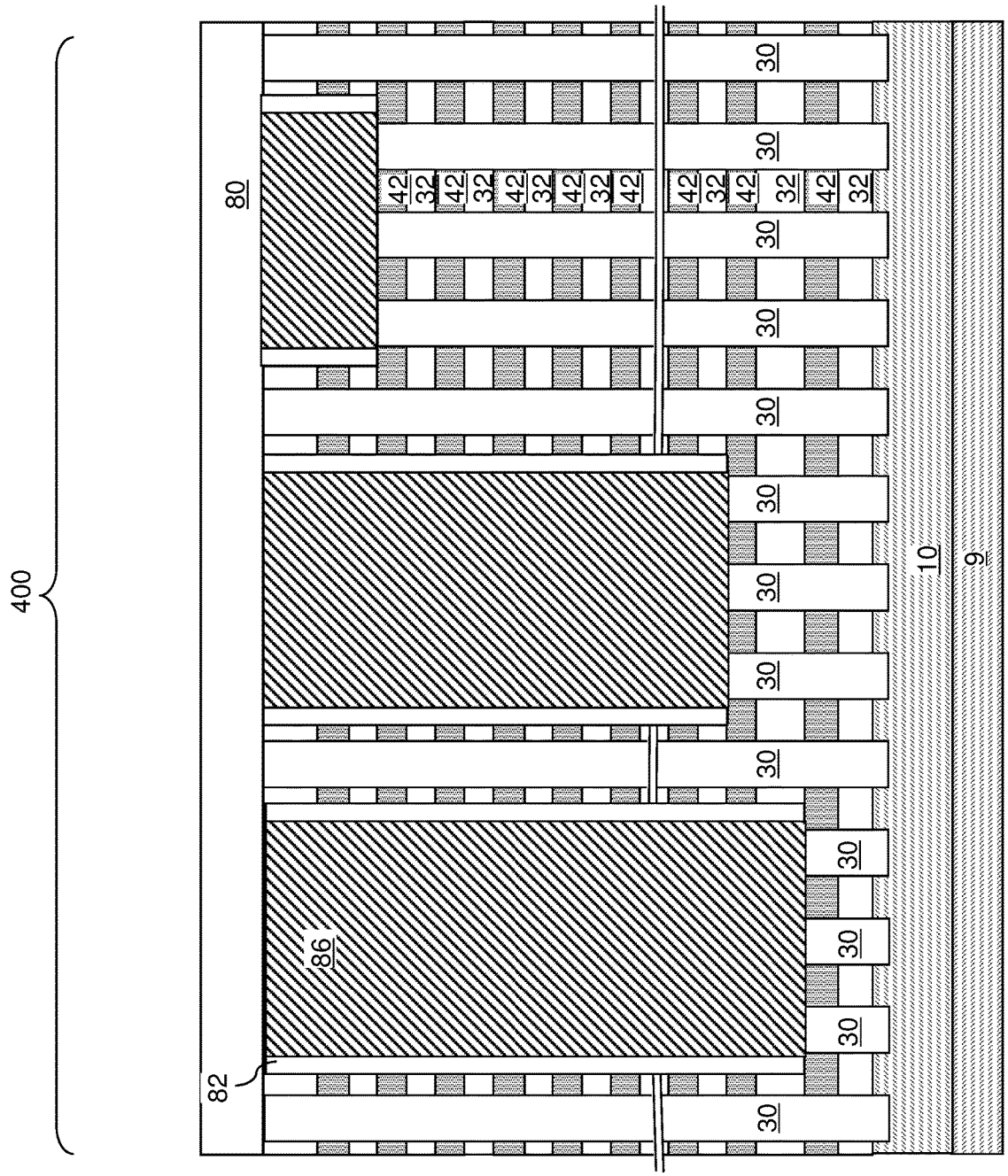
FIG. 26C is a schematic vertical cross-sectional view of the monitor region of an alternative embodiment of the second exemplary structure after formation of additional contact via structures according to the second embodiment of the present disclosure.

Referring to FIG. 26C, a monitor region 400 of an alternative embodiment of the second exemplary structure is illustrated after formation of various contact via structures (88, 86). In the alternative embodiment of the first exemplary structure, the sacrificial material layers 42 are not replaced with electrically conductive layers 46 in the monitor region 400. This modification can be provided, for example, by not forming backside trenches 79 in or around the monitor region 400.

Referring to FIGS. 1-26C, a device structure is provided, which comprises a three-dimensional memory array and a monitor structure that are located on a substrate (9, 10). The three-dimensional memory array comprises: a first alternating stack (32, 46) of insulating layers 32 and electrically conductive layers 46 that comprises a contact region 300; memory openings 49 vertically extending through the first alternating stack (32, 46) and located in a memory array region 100 and arranged as a first two-dimensional array having a two-dimensional periodicity; memory opening fill structures 58 located in the memory openings 49 and comprising a respective vertical semiconductor channel 60 and a respective vertical stack of memory elements (e.g., portions of memory film 50); and contact via structures 86 contacting a top surface of a respective electrically conductive layer of the electrically conductive layers 46. The monitor structure comprises: a second alternating stack (32, 42 or 46) of first material layers and second material layers; monitor openings 29 vertically extending through a respective subset of layers within the second alternating stack (32, 42 or 46) and to at least an upper portion of the substrate, wherein a horizontal cross-sectional profile of the monitory openings 29 at a level of a bottommost layer of the second alternating stack (32, 42 or 46) has a same periodicity as the two-dimensional periodicity of the memory openings 49; and monitor opening fill structures 30 located in the monitor openings 29.

In the first embodiment, the three-dimensional memory array further comprises first stepped surfaces located in the contact region of the first alternating stack; a first retro-stepped dielectric material portion 65 overlying the first stepped surfaces, wherein the contact via structures 86 vertically extend through the first retro-stepped dielectric material portion 65; second stepped surfaces in the second alternating stack; and a second retro-stepped dielectric material portion 165 overlying the second stepped surfaces, wherein the second retro-stepped dielectric material portion 165 does not embed any conductive structure therein, and does not include any opening therethrough.

In the second embodiment, the three-dimensional memory array further comprises insulating via spacers 82 vertically extending through a respective subset of layers within the first alternating stack (32, 46) and contacting a top surface of a respective one of the electrically conductive layers 46 in the contact region 300, wherein the contact via structures laterally 86 are surrounded by a respective one of the insulating via spacers 82. The monitor structure further comprises monitor via cavity fill structures 183 vertically extending from a horizontal plane including a topmost surface of the second alternating stack (32, 42 or 46) to top surfaces of a respective subset of the monitor opening fill structures 30 and comprising a monitor cavity fill material that is different from materials of the second alternating stack (32, 42 or 46) and the monitor opening fill structures 30.

In one embodiment, the device structure further comprises support pillar structures 20 vertically extending through the first alternating stack (32, 46) in the contact region 300 and comprising a dielectric fill material, wherein the monitor opening fill structures 30 consist essentially of the dielectric fill material. In one embodiment, the memory opening fill structures 58 and the monitor opening fill structures 30 have a same diameter, and the support pillar structures 20 have a larger diameter than the memory opening fill structures and the monitor opening fill structures. In one embodiment, the three-dimensional memory array is located in a memory die and the monitor structure is located in a kerf region.

The various embodiments of the present disclosure may provide in-situ monitoring of horizontal cross-sectional shapes of memory openings 49 or memory opening fill structures 58 without destructive analysis of devices. Thus, the embodiments of the present disclosure provides fast and cost-efficient monitoring of the shapes of the memory openings 49 and/or the memory opening fill structures during manufacture of a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional semiconductor device, comprising:
    forming an alternating stack of insulating layers and spacer material layers over a substrate, wherein the spacer material layers are formed as electrically conductive layers, or as sacrificial material layers sacrificial material layers having at least portions located in a memory array region and in a contact region which are subsequently replaced with electrically conductive layers;
    forming openings through the alternating stack, wherein the openings comprise a memory openings formed in the memory array region and monitor openings formed in a monitor region, and wherein the memory openings and the monitor openings are formed as two-dimensional arrays having a same two-dimensional periodicity;
    forming monitor opening fill structures by depositing a monitor opening fill material in the monitor openings;
    recessing first portions of the alternating stack in the contact region and second portions of the alternating stack in the monitor region, such that first horizontal surfaces of the spacer material layers are physically exposed in the contact region and second horizontal surfaces of the spacer material layers and recessed surfaces of the monitor opening fill structures are physically exposed in the monitor region; and
    determining at least one characteristic of the recessed surfaces of the monitor opening fill structures.

2. The method of claim 1, wherein the at least one characteristic of the recessed surfaces of the monitor opening fill structures comprise changes in an average lateral dimension of the recessed surfaces of the monitor opening fill structures as a function of a vertical distance between the substrate and the recessed surfaces of the monitor opening fill structures.

3. The method of claim 1, wherein the at least one characteristic of the recessed surfaces of the monitor opening fill structures comprise changes in ellipticity of the recessed surfaces of the monitor opening fill structures as a function of a vertical distance between the substrate and the recessed surfaces of the monitor opening fill structures.

4. The method of claim 1, further comprising determining at least one characteristic of the memory openings or memory opening fill structures based on the determining at least one characteristic of the recessed surfaces of the monitor opening fill structures.

5. The method of claim 1, wherein the step of determining at least one characteristic of the recessed surfaces of the monitor opening fill structures comprises determining at least one characteristic of the recessed surfaces of the monitor opening fill structures using a scanning electron microscope or an optical image measurement tool.

6. The method of claim 1, wherein:
    the openings through the alternating stack further comprise support openings formed in the contact region;
    the support pillar structures are formed by depositing the monitor opening fill material in the support openings concurrently with formation of the monitor opening fill structures; and
    the support pillar structures are collaterally recessed during the recessing of the portions of the alternating stack in the contact region.

7. The method of claim 6, wherein:
    the monitor opening fill material comprises a dielectric fill material;
    the support pillar structures are collaterally recessed during the recessing of the portions of the alternating stack in the contact region; and
    each of the top surfaces of the support pillar structures is adjoined to and is coplanar with a respective one of the first horizontal surfaces of the spacer material layers.

8. The method of claim 6, further comprising:
    forming first stepped surfaces in the contact region such that first stepped surfaces comprise first horizontal surface segments of the spacer material layers and first vertical surface segments of the insulating layers and the spacer material layers; and
    forming second stepped surfaces in the monitor region such the second stepped surfaces comprise second horizontal surface segments of the spacer material layers and second vertical surface segments of the insulating layers and the spacer material layers.

9. The method of claim 8, further comprising:
    forming a first retro-stepped dielectric material portion over the first stepped surfaces;
    forming a second retro-stepped dielectric material portion over the second stepped surfaces; and forming contact via structures through the first retro-stepped dielectric material portion on a top surface of a respective one of the electrically conductive layers,
wherein the second retro-stepped dielectric material portion does not include any opening therethrough after formation of the contact via structures.

10. The method of claim 6, wherein:
contact via cavities are formed in the contact region by recessing the first portions of the alternating stack, wherein bottom surfaces of the contact via cavities comprise the first horizontal surfaces of the spacer material layers; and
monitor via cavities are formed in the monitor region by recessing the second portions of the alternating stack, wherein bottom surface of the monitor via cavities comprise the recessed surfaces of the monitor opening fill structures.

11. The method of claim 10, further comprising:
forming a patterned hard mask layer over the alternating stack, wherein the patterned hard mask layer comprises first openings in the contact region and second openings in the monitor region;
performing a series of masked anisotropic etch processes, wherein each of the masked anisotropic etch processes employs a different photoresist mask that covers a respective subset of the first openings and the second openings and etches a respective number of pairs of an insulating layer and a sacrificial material layer, the respective number being different among the series of masked anisotropic etch processes.

12. The method of claim 10, wherein:
the spacer material layers are formed as sacrificial material layers; and
the method further comprises:
forming sacrificial contact via cavity fill structures in the contact via cavities and forming monitor via cavity fill structures in the monitor via cavities by depositing a sacrificial fill material in the contact via cavities and in the monitor via cavities;
replacing at least portions of the sacrificial material layers in the memory array region and in the contact region with the electrically conductive layers after formation of the sacrificial contact via cavity fill structures; and
replacing the sacrificial contact via cavity fill structures with contact via structures after replacement of the sacrificial material layers.

13. The method of claim 1, further comprising:
forming a patterned sacrificial cover layer that covers the memory openings without covering the monitor openings, wherein a portion of the monitor opening fill material is deposited over the patterned sacrificial cover layer;
recessing the portion of the monitor opening fill material from above the patterned sacrificial cover layer, wherein remaining portions of the monitor opening fill material constitute the monitor opening fill structures.

14. The method of claim 1, wherein the memory openings and the monitor openings have a same diameter and are formed during a same etching step.

* * * * *